US010691856B1

(12) United States Patent
Lysaght et al.

(10) Patent No.: US 10,691,856 B1
(45) Date of Patent: Jun. 23, 2020

(54) SYSTEM DESIGN FLOW WITH RUNTIME CUSTOMIZABLE CIRCUITS

(71) Applicant: Xilinx, Inc., San Jose, CA (US)

(72) Inventors: Patrick Lysaght, Los Gatos, CA (US); Graham F. Schelle, Longmont, CO (US)

(73) Assignee: Xilinx, Inc., San Jose, CA (US)

(*) Notice: Subject to any disclaimer, the term of this patent is extended or adjusted under 35 U.S.C. 154(b) by 170 days.

(21) Appl. No.: 15/943,519

(22) Filed: Apr. 2, 2018

(51) Int. Cl.
G06F 30/34 (2020.01)
G06F 30/327 (2020.01)
G06F 30/392 (2020.01)
G06F 30/394 (2020.01)
G06F 30/398 (2020.01)

(52) U.S. Cl.
CPC ............ *G06F 30/34* (2020.01); *G06F 30/327* (2020.01); *G06F 30/392* (2020.01); *G06F 30/394* (2020.01); *G06F 30/398* (2020.01)

(58) Field of Classification Search
CPC .. G06F 17/5045; G06F 17/5054; G06F 21/76; G06F 2217/66; G06F 2217/68; G06F 2217/86; G06F 30/34; G06F 30/327; G06F 30/392; G06F 30/394; G06F 30/398
USPC ........................................................ 716/116
See application file for complete search history.

(56) References Cited

U.S. PATENT DOCUMENTS

2006/0190904 A1* 8/2006 Haji-Aghajani .... G06F 17/5054
326/38

OTHER PUBLICATIONS

Eslami, F. et al., "Enabling Effective FPGA Debug using Overlays: Opportunities and Challenges," In 2nd Int'l. Workshop on Overlay Architectures for FPGAs (OLAF2016), Feb. 21, 2016, 6 pg.
Haenel, V., "2.8. Interfacing with C," [online] Scipy Lecture Notes [retrieved Aug. 11, 2017] retrieved from the Internet: <http://www.scipy-lectures.org/advanced/interfacing_with_c/interfacing_with_c.html>, 31 pg.
Catanzaro, B. et al., "SEJITS: Getting Productivity and Performance with Selective Embedded JIT Specialization," Programming Models for Emerging Architectures, vol. 1, No. 1, Oct. 2009, pp. 1-9.
Capalija, D. et al., "Tile-based Bottom-up Compilatoin of Custom Mesh-of-Functional-Units FPGA Overlays," in IEEE 24th Int'l. Conf. on Field Programmable Logic and Applications (FPL), Sep. 2, 2014, pp. 1-8.

(Continued)

*Primary Examiner* — Paul Dinh
(74) *Attorney, Agent, or Firm* — Kevin T. Cuenot

(57) ABSTRACT

A computer-implemented design flow can include, within a circuit design for an integrated circuit, determining a portion of the circuit design that is a candidate for implementation as a runtime customizable circuit and determining implementation options for the runtime customizable circuit. The design flow can also include generating, using computer hardware, a description of the circuit design using the runtime customizable circuit to implement the portion of the circuit design and generating, using the computer hardware, program code for an embedded processor coupled to an implementation of the runtime customizable circuit within the integrated circuit. The program code is usable by the embedded processor to parameterize the runtime customizable circuit to create a specific instance of the runtime customizable circuit.

20 Claims, 20 Drawing Sheets

(56) References Cited

OTHER PUBLICATIONS

"Very high-level programming language," [online] Wikipedia, the free encyclopedia, Jun. 25, 2017, retrieved from the Internet: <https://en.wikipedia.org/w/index.php?title=Very_high-level_programming_language&oldid=787427362>, 2 pg.

"Amazon EC2 F1 Instances," [online] Amazon Web Services, Inc. © 2017 [retrieved Aug. 11, 2017], retrieved from the Internet: <https://aws.amazon.com/ec2/instance-types/f1/>, 14 pg.

Xilinx, Peter Alfke, "Created Uses of Block RAM", WP335 (v1.0), Jun. 4, 2008.

Maxfield, M., "Tutorial: Linear Feedback Shift Registers (LFSRs)—Part 1," [online] EE Times © 2018 UBM Electronics, An AspenCore company, Dec. 20, 2006 [retrieved Mar. 13, 2018], retrieved from the Internet: <https://www.eetimes.com/document.asp?doc_id=1274550>, 5 pg.

Lysaght, P. et al., "Runtime Adaptive Generator Circuit," U.S. Appl. No. 15/850,659, filed Dec. 21, 2017, 69 pg.

"From Regular Expression to NFA to DFA ," [online] SNS Courseware, Compiler design—RE&DFA&NFA, [retrieved Oct. 20, 2017], retrieved from the Internet: <https://tajseer.files.wordpress.com/2014/06/re-nfa-dfa.pdf>, 9 pg.

"Regular Expression to NFA (Non-Deterministic Finite Automata)," [online] HackingOff,com © 2012 [retrieved Mar. 20, 2018], retrieved from the Internet: <http://hackingoff.com/compilers/regular-expression-to-nfa-dfa>, 1 pg.

"Convert simple regular expressions to deterministic finite automaton Regex=> NFA=> DFA," [online] CyberZHG's Toolbox [retreived Mar. 20, 2018], retrieved from the Internet: <https://cyberzhg.github.io/toolbox/nfa2dfa>, 2 pg.

"Deterministic finite automaton," [online] Wikipedia, the free encyclopedia, Nov. 29, 2017, retrieved from the Internet: <https://en.wikipedia.org/wiki/Deterministic_finite_automaton>, 6 pg.

Nakahara, H. et al., "A regular expression matching circuit based on a decomposed automaton," In International Symposium on Applied Reconfigurable Computing, Mar. 23, 2011, pp. 16-28.

"Non-Deterministic finite automaton," [online] Wikipedia, the free encyclopedia, Mar. 3, 2018, retrieved from the Internet: <https://en.wikipedia.org/wiki/Nondeterministic_finite_automaton>, 8 pg.

Yamagaki, N. et al., "High-speed regular expression matching engine using multi-character NFA," In IEEE International Conference on Field Programmable Logic and Applications, FPL 2008, Sep. 8, 2008, pp. 131-136.

Schelle, G.F.. et al., "Hardware Trace ADN Introspection for Productivity Platform Using a System-On-Chip," U.S. Appl. No. 15/676,530, filed Aug. 14, 2017, 91 pg.

Lysaght, P. et al., "Productivity Platform Using System-On-Chip With Programmable Circuitry," U.S. Appl. No. 15/676,437, filed Aug. 14, 2017, 67 pg.

Lysaght, P. et al., "Slave Processor Within a System-On-Chip," U.S. Appl. No. 15/676,453, filed Aug. 14, 2017, 88 pg.

\* cited by examiner

SYSTEM DESIGN FLOW WITH RUNTIME CUSTOMIZABLE CIRCUITS

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to implementing a circuit design within an IC using runtime customizable circuits.

BACKGROUND

Integrated circuits (ICs) can be implemented to perform a variety of functions. Some ICs can be programmed to perform specified functions. An example of an IC that can be programmed is a field programmable gate array (FPGA). An FPGA typically includes an array of programmable tiles. These programmable tiles may include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that may include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA. Changing the functionality of the FPGA thereafter requires loading different configuration data into the configuration memory cells.

SUMMARY

In one or more embodiments, a method can include, within a circuit design for an integrated circuit, determining, using computer hardware, a portion of the circuit design that is a candidate for implementation as a runtime customizable circuit, determining, using the computer hardware, implementation options for the runtime customizable circuit, and generating, using the computer hardware, a description of the circuit design using the runtime customizable circuit to implement the portion of the circuit design. The method can include generating, using the computer hardware, program code for an embedded processor coupled to an implementation of the runtime customizable circuit within the integrated circuit. The program code is usable by the embedded processor to parameterize the runtime customizable circuit to create a specific instance of the runtime customizable circuit.

In one or more embodiments, a system includes a memory configured to store instructions and a first processor coupled to the memory. The first processor, in response to executing the instructions, is configured to initiate operations. The operations can include, within a circuit design for an integrated circuit, determining a portion of the circuit design that is a candidate for implementation as a runtime customizable circuit, determining implementation options for the runtime customizable circuit, and generating a description of the circuit design using the runtime customizable circuit to implement the portion of the circuit design. The operations can also include generating program code for a second processor embedded in the integrated circuit and coupled to an implementation of the runtime customizable circuit within the integrated circuit. The program code is usable by the second processor to parameterize the runtime customizable circuit to create a specific instance of the runtime customizable circuit.

In one or more embodiments, a computer program product includes a computer readable storage medium having program code stored thereon. The program code is executable by a processor to perform the operations described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
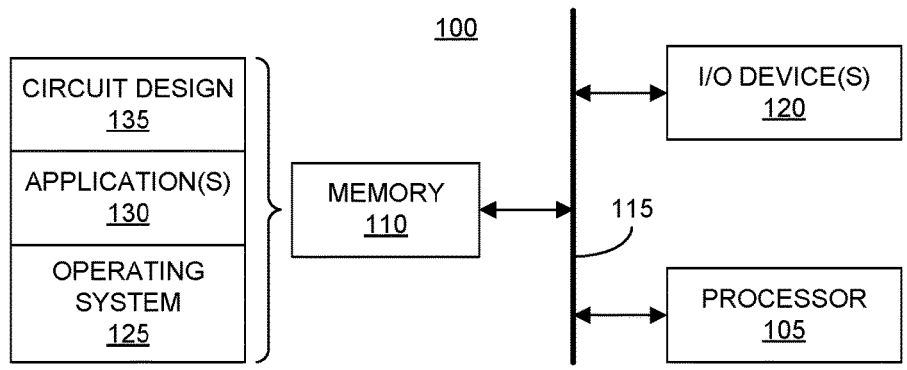
FIG. 1 illustrates an example of a host system for use with one or more embodiments described herein.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to implementing a circuit design within an IC using runtime customizable circuits or "RCCs". In accordance with the inventive arrangements described within this disclosure, a host system is capable of implementing a design flow that is able to include circuit structures within a circuit design that are highly customizable at runtime of the target IC. For example, the host system is capable of identifying particular circuit structures within a circuit design. The host system may identify these circuit structures as candidates for implementation using the customizable circuit structures. The customizable circuit structures may be functionally equivalent to the identified circuit structures. In other examples, the host system is capable of modifying the circuit design to include one or more of the customizable circuit structures.

The customizable circuit structures are referred to herein as "runtime customizable circuits" or "RCCs". An RCC refers to a circuit that can be customized before and during deployment, e.g., at runtime of an IC, to perform different functions. Each RCC may be implemented as a core or "Intellectual Property" block and accompanying software. The software exposes the functionality of the RCC as part of an application programming interface (API) of a library. The library may be associated with a high-level programming language (HLL) and/or a high-productivity language (HPL).

In particular embodiments, the software tools required to customize RCCs may be executed on a processor that may be included within the deployment environment. The processor, for example, may be embedded within the same IC that implements the RCCs. Within this disclosure, the IC may be referred to as an "embedded system" from time-to-time. The embedded processor is capable of accessing the RCCs within the deployment environment to control customization of the RCCs. The embedded processor is capable of generating and/or providing the information used to customize the RCCs, referred to herein as "parameterization data". The embedded processor, via execution of the software, is capable of controlling and interacting with the RCCs.

RCCs may be implemented using programmable circuitry of an IC. As defined within this disclosure, the term "runtime" or "runtime of the IC" refers to a state of operation of a programmable IC where a configuration bitstream has been loaded into the programmable IC causing physical implementation of one or more RCCs therein. An RCC, once implemented using programmable circuitry by way of loading a configuration bitstream into the IC, may be customized at runtime of the IC to dynamically implement different customized instances of the RCC.

The embedded processor is capable of controlling the parameterization process and may parameterize RCCs at runtime in response to any of a variety of detected conditions whether occurring within the IC or external to the IC. The parameterization data specifies the particular customizations and functionality of the RCC that is implemented in the IC. The embedded processor is capable of customizing the RCC using the parameterization data to implement different instances of the RCC over time. Each RCC may be customized for performing a particular function depending upon the type of RCC that is implemented.

In one or more embodiments, a host system is capable of generating a version of the circuit design that utilizes the RCCs and generating the software that is used with the RCCs. For example, the host system may generate software that is executable by the embedded processor coupled to the RCCs to communicate with the RCCs and/or parameterize the RCCs. In another example, the host system may generate the parameterization data used to parameterize the RCCs. In still another example, the host system may generate program code that may be executed by the RCC itself. In one or more other embodiments, the embedded processor coupled to the RCCs may generate parameterization data, software executable by the RCC, and/or other functions otherwise performed by the host system.

The RCCs provide advantages over other circuit structures that are not customizable at runtime. As an example, when implementing a particular circuit structure within a field programmable gate array (FPGA) type of programmable IC, a configuration bitstream is loaded into the programmable IC. If changes to the circuit structure and/or functionality are needed, a designer must make the changes to the circuit design and re-run design implementation tools to generate an updated configuration bitstream. This process may require hours to complete.

When using an RCC within the circuit design in place of a conventional circuit structure that is not customizable, the functionality and/or operations performed by the RCC may be changed through parameterization. This process provides a fast and efficient way of adapting the RCC dynamically to changing needs, to correct errors, and the like. The parameterization of RCCs may be performed without having to implement different physical circuitry within the programmable IC. Parameterization of the RCC may be performed while the programmable circuitry of the IC continues to operate uninterrupted.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example host system 100 for use with one or more embodiments described within this disclosure. Host system 100 is illustrative of computer hardware that may be used for implementing the various operations described herein relating to performing a design flow and/or implementing a circuit design using RCCs. In an aspect, host system 100 is implemented as a computer or other system or device that is suitable for storing and/or executing program code.

Host system 100 includes at least one processor 105. Processor 105 is coupled to memory 110 through interface circuitry 115. Host system 100 stores computer readable instructions (also referred to as "program code") within memory 110. Memory 110 is an example of computer readable storage media. Processor 105 executes the program code accessed from memory 110 via interface circuitry 115.

Memory 110 may include one or more physical memory devices such as, for example, a local memory and a bulk storage device. Local memory refers to non-persistent memory device(s) generally used during actual execution of program code. Examples of local memory include random-access memory (RAM) and/or any of the various types of RAM that are suitable for use by a processor during execution of program code (e.g., dynamic RAM or "DRAM" or static RAM or "SRAM"). A bulk storage device refers to a persistent data storage device. Examples of bulk storage devices include, but are not limited to, a hard disk drive (HDD), a solid-state drive (SSD), flash memory, a read-only memory (ROM), an erasable programmable read-only memory (EPROM), electrically erasable programmable read-only memory (EEPROM), or other suitable memory. Host system 100 may also include one or more cache memories (not shown) that provide temporary storage of at least some program code in order to reduce the number of times program code must be retrieved from a bulk storage device during execution.

Memory 110 is capable of storing program code. The program code may include routines, programs, objects, components, logic, data structures, and so on. For purposes of illustration, memory 110 stores an operating system 125, one or more application(s) 130, and a circuit design 135. In one or more embodiments, application(s) 130 include an EDA application. The EDA application is capable of performing a design flow (e.g., synthesis, placement, routing, and/or bitstream generation) and the other operations described herein on circuit design 135 relating to implementation of RCCs.

In an aspect, operating system 125 and application(s) 130, being implemented in the form of executable program code, are executed by host system 100 and, more particularly, by processor 105, to perform the operations described within this disclosure. As such, operating system 125 and application(s) 130 may be considered an integrated part of host system 100. Further, it should be appreciated that any data used, generated, and/or operated upon by host system 100 (e.g., processor 105) are functional data structures that impart functionality when employed as part of the system.

Examples of interface circuitry 115 include, but are not limited to, a system bus and an input/output (I/O) bus. Interface circuitry 115 may be implemented using any of a variety of bus architectures. Examples of bus architectures may include, but are not limited to, Enhanced Industry Standard Architecture (EISA) bus, Accelerated Graphics Port (AGP), Video Electronics Standards Association (VESA) local bus, Universal Serial Bus (USB), and Peripheral Component Interconnect Express (PCIe) bus.

Host system 100 further may include one or more input/output (I/O) devices 120 coupled to interface circuitry 115. I/O devices 120 may be coupled to host system 100, e.g., interface circuitry 115, either directly or through intervening I/O controllers. Examples of I/O devices 120 include, but are not limited to, a keyboard, a display device, a pointing device, one or more communication ports, a network adapter, etc. A network adapter refers to circuitry that enables host system 100 to become coupled to other systems, computer systems, remote printers, and/or remote storage devices through intervening private or public networks. Modems, cable modems, Ethernet cards, and wireless transceivers are examples of different types of network adapters that may be used with host system 100.

Host system 100 may include fewer components than shown or additional components not illustrated in FIG. 1 depending upon the particular type of device and/or system that is implemented. In addition, the particular operating system and/or application(s) included may vary according to device and/or system type as may the types of I/O devices included. Further, one or more of the illustrative components may be incorporated into, or otherwise form a portion of, another component. For example, a processor may include at least some memory. Host system 100 may be implemented as a single system as shown or as a plurality of networked or interconnected systems each having an architecture the same as, or similar to, that of host system 100.

In one or more embodiments, host system 100 is capable of operating on circuit design 135 to generate a different version of circuit design 135 that utilizes one or more RCCs. Circuit design 135 may be specified using an HLL (e.g., C and/or C++), using a behavioral hardware description language (e.g., VHDL and/or Verilog), or using a graphical representation of the circuitry. In particular embodiments, host system 100 is capable of including one or more RCCs within circuit design 135. In one aspect, including an RCC refers to replacing a circuit structure that exists within circuit design 135 with an RCC. For example, host system 100 is capable of detecting circuit structures within circuit design 135 that are candidates for replacement with an RCC. Host system 100 may identify circuit structures as candidates automatically and/or in response to detecting a user specified directive to implement a particular portion of circuit design 135 using an RCC. Host system 100 is capable of replacing the candidate circuit structure(s) within circuit design 135 with RCCs, e.g., core implementations of the RCCs. In another aspect, including an RCC within circuit design 135 refers to adding or inserting an RCC within circuit design 135 in addition to other circuit structures specified therein.

Whether existing circuit structures of circuit design 135 are replaced by RCCs and/or RCCs are inserted, host system 100 is capable of generating any interface circuitry needed between the RCCs and the embedded processor within the IC and/or other circuit structures within the IC. Host system 100 is further capable of synthesizing, placing and/or routing circuit design 135. In addition, host system 100 is capable of generating the software necessary for the embedded processor in the IC to communicate with the RCC(s). In particular embodiments, host system 100 is capable of generating parameterization data for the RCCs.

Figure 2:
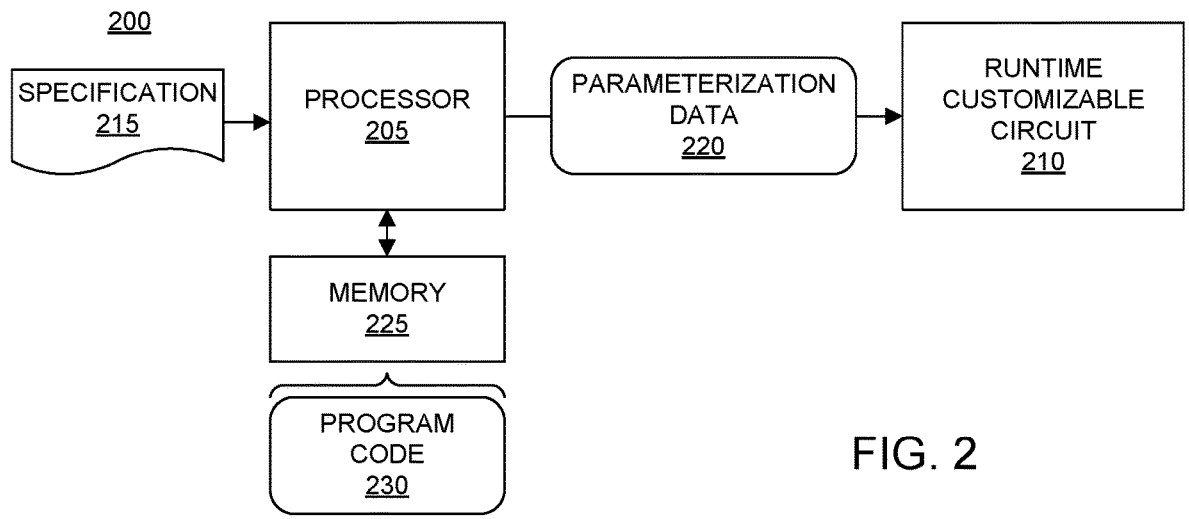
FIG. 2 illustrates an example integrated circuit (IC) including a runtime customizable circuit (RCC).

FIG. 2 illustrates an example IC 200 including an RCC 210. In the example of FIG. 2, IC 200 may be implemented as a system-on-chip type of IC that includes a processor 205 and programmable circuitry. As discussed, IC 200 may be considered an embedded system. RCC 210 is implemented in the programmable circuitry of IC 200. As an example, RCC 210 may be implemented in the programmable circuitry of an FPGA.

As noted, processor 205 is a circuit that is capable of executing program code. In one or more embodiments, processor 205 is an embedded processor implemented within the same IC that includes the programmable circuitry implementing RCC 210. In an example, processor 205 may be implemented as a hardwired processor embedded in the same IC as RCC 210. In another example, processor 205 may be implemented as a soft processor implemented using programmable circuitry like RCC 210. In the soft processor example, processor 205 may also be embedded in the same IC as RCC 210. In the case of a soft processor, processor 205 may be implemented by the same configuration bitstream used to implement RCC 210.

In the example of FIG. 2, a configuration bitstream specifying RCC 210 and/or any interface circuitry that couples RCC 210 to processor 205 and/or other circuitry is loaded into IC 200. Loading the configuration bitstream into IC 200 implements RCC 210 therein using the programmable circuitry. RCC 210 is, in effect, a user programmable circuit block that is parameterizable (e.g., customizable) at runtime of IC 200. Different example implementations of RCC 210 are described in greater detail herein in connection with FIGS. 5, 7-11, and 13-16.

In one or more embodiments, processor 205 is capable of executing program code that causes processor 205 to process a specification 215 and generate parameterization data 220 from specification 215. In one or more embodiments, processor 205 is capable of generating parameterization data 220 at runtime of IC 200 and/or providing parameterization data 220 to RCC 210 at runtime of IC 200. For example, processor 205 is capable of executing an operating system and one or more applications. As an example, processor 205 is capable of executing a modern operating system such as Linux or another suitable operating system. The application(s) executed by processor 205 enable processor 205 to generate parameterization data 220 from specification 215.

Processor 205 is capable of loading RCC 210 with parameterization data 220 at runtime of the IC. While RCC 210 is implemented in IC 200 upon loading a configuration bitstream therein, RCC 210 is generally not operational until processor 205 provides parameterization data 220 to RCC 210, unless initial parameterization data is included in the configuration bitstream used to implement RCC 210. Once processor 205 provides parameterization data 220 to RCC 210, RCC 210 is capable of operating or running independently of other circuit blocks (and/or processor 205) within the IC.

In the example of FIG. 2, specification 215 defines a particular instance of RCC 210. Parameterization data 220 may include, for example, data that is loaded into various types of memories (e.g., block random access memories (BRAMs) and/or lookup tables (LUTs)), data that is loaded into registers used to control multiplexers, data loaded into registers used to control switches, data for parameterizing comparators, executable program code, program data, and/or data for controlling other circuitry. Loading parameterization data 220 into RCC 210 causes RCC 210 to implement the particular instance of RCC 210 defined by specification 215.

Processor 205 is capable of receiving different specifications, each defining a particular and/or different instance of RCC 210, and generating corresponding parameterization data that can be loaded into RCC 210 at runtime of the IC to implement the particular instance of RCC 210 defined by the processed specification. In other embodiments, processor 205 is capable of receiving parameterization data from another source and/or system (e.g., external to the IC) and loading the parameterization data into RCC 210.

In the example of FIG. 2, processor 205 is capable of executing program code 230 from memory 225. In one or more embodiments, program code 230 is generated by host system 100 as described in connection with FIG. 1. Program code 230, when executed by processor 205, allows processor 205 to interact with RCC 210. For example, processor 205, in executing program code 230, is capable of performing the operations described herein relating to controlling operation of RCC 210 and customizing RCC 210 by generating and/or providing parameterization data. Memory 225 may be implemented within IC 200 or external to IC 200.

In one or more embodiments, RCC 210 is implemented with a circuit architecture that is capable of implementing finite state machines (FSMs). RCC 210 further may have a circuit architecture that implements, or includes, a BFNG that is capable of implementing different Boolean function networks.

In one or more other embodiments, RCC 210 is implemented with a circuit architecture that is capable of implementing a particular class of automaton circuit. For example, in implementing one type of automaton circuit, RCC 210 is capable of receiving a data stream and matching symbols within the data stream to one or more predetermined symbol patterns. The predetermined patterns of symbols may be specified using regular expressions.

In one or more embodiments, RCC 210 is implemented with a circuit architecture that is capable of implementing any of a variety of deterministic automaton circuits. A deterministic automaton circuit is capable of performing the pattern matching described. A "deterministic automaton circuit" (also referred to as a deterministic finite automaton) is a type of automaton circuit implemented as a particular case of an FSM that is capable of accepting and rejecting strings of symbols. A deterministic automaton circuit produces a unique computation for each input string. A deterministic automaton circuit is capable of performing operations such as, for example, pattern matching and lexical analysis.

In one or more other embodiments, RCC 210 has a circuit architecture that is capable of implementing nondeterministic automaton circuits. Nondeterministic automaton circuits are also capable of performing the pattern matching described. A "nondeterministic automaton circuit" (also referred to as a nondeterministic finite automaton) is a type of automaton circuit capable of consuming a string of input symbols. For each input symbol, the nondeterministic automaton circuit is capable of transitioning to a new state until all input symbols have been consumed. Unlike a deterministic automaton circuit, a nondeterministic automaton circuit, being nondeterministic, may transition to zero, one, or more than one possible states given a current state and an input symbol. In the case of a nondeterministic automaton circuit, the last input symbol is consumed if and only if there is some set of transitions that will lead to an "accepting state". The nondeterministic automaton circuit rejects if, no matter what transitions are applied, the "accepting state" is not reached.

In one or more embodiments, RCC 210 may have a circuit architecture that is capable of implementing pseudo random number binary sequence generators. In one aspect, RCC 210 is capable of implementing cellular automaton circuits. RCC 210 may implement cellular automaton circuits using a tiled architecture to be described herein in further detail. In another aspect, RCC 210 is capable of implementing linear feedback shift registers (LFSRs).

In one or more embodiments, specification 215 is a high-level software description of functionality to be implemented by RCC 210. For example, specification 215 may be formatted in an HLL, in a markup language such as eXtensible Markup Language (XML), YAML, JSON, or in an HPL such as Python, Scala, and/or R. In one or more other embodiments, specification 215 may be specified as, or include, one or more regular expressions (REGEXs).

RCC 210 may operate in coordination with processor 205. Processor 205 is capable of receiving specification 215 as input and converting specification 215 into parameterization data 220 used to parameterize, or customize, RCC 210. Specification 215 defines a particular instance or type of circuit to be implemented by RCC 210. Parameterization data 220 also specifies the particular instance or type of circuit that is implemented by RCC 210, but is in a format that may be loaded into RCC 210. Upon loading parameterization data 220 into RCC 210, RCC 210 implements the particular instance or type of circuit specified.

In embodiments where RCC 210 is capable of implementing an FSM, specification 215 may define a particular FSM. Accordingly, parameterization data 220 specifies the particular FSM defined by specification 215, but is in a format that may be loaded into and/or usable by RCC 210. Upon loading parameterization data 220 into RCC 210, RCC 210 implements the particular FSM defined by specification 215. Thus, RCC 210 is capable of implementing any of a variety of different FSMs dynamically during operation of the IC without the need to implement new and/or different circuitry in the IC for each different FSM that is implemented. As an example, an FPGA type of programmable IC may be loaded with a configuration bitstream that implements RCC 210 therein using programmable circuitry. Once implemented, RCC 210 is parameterizable to implement different FSMs over time by loading suitable parameterization data.

For example, once a configuration bitstream is loaded into the IC to implement RCC 210, first parameterization data specifying a first FSM may be used to parameterize RCC 210. In response to the parameterization, RCC 210 implements the first FSM. Subsequently, second and different parameterization data specifying a second and different FSM may be loaded into RCC 210, thereby causing RCC 210 to implement the second FSM. This may be performed while the programmable circuitry of the IC continues to operate uninterrupted without implementing different physical circuitry corresponding to the second FSM.

In examples where RCC 210 is capable of implementing FSMs, RCC 210 is parameterizable to implement different FSMs at runtime of the IC as needed and/or desired. RCC 210 may be parameterized to implement different FSMs at runtime of the IC without the need to instantiate any new and/or different circuitry in the programmable circuitry of the IC for each different FSM to be implemented. RCC 210 is capable of implementing any of a variety of different FSMs dynamically within the IC. The parameterization data provided to RCC 210 specifies the particular FSMs to be implemented. As such, RCC 210 is effectively programmed by the parameterization data to implement the different FSMs over time.

Listing 1 is an example specification for an FSM. For purposes of illustration, the specification of Listing 1 is specified using an HPL. The example of Listing 1 is specified in Python and, more particularly, as a Python dictionary.

LISTING 1

```
fsm_spec_a = {'inputs': [('clear', 'D0'), ('direction', 'D1')],
              'outputs': [('alpha', 'D10'), ('beta', ' D11'), ('gamma', 'D12')],
              'states': ['S0', 'S1', 'S2', 'S3', 'S4', 'S5'],
              'reset_state': 'S0',
              'transitions':         [['00', 'S0', 'S1', '000'],
                                      ['01', 'S0', 'S5', '000'],
                                      ['00', 'S1', 'S2', '001'],
                                      ['01', 'S1', 'S0', '001'],
                                      ['00', 'S2', 'S3', '010'],
                                      ['01', 'S2', 'S1', '010'],
                                      ['00', 'S3', 'S4', '011'],
                                      ['01', 'S3', 'S2', '011'],
                                      ['00', 'S4', 'S5', '100'],
                                      ['01', 'S4', 'S3', '100'],
                                      ['00', 'S5', 'S0', '101'],
                                      ['01', 'S5', 'S4', '101'],
                                      ['1-', '*', 'S0', '000']]}
```

The specification shown in Listing 1 defines an FSM called "fsm_spec_a". The specification defines the inputs to "fsm_spec_a" as "clear" and "direction". The specification uses tuples to associate an identifier or label with a particular pin of the IC (whether internal or an I/O pin of the IC). The "clear" input to "fsm_spec_a" is assigned to the pin "D0". The "Direction" input is assigned to the pin "D1". The FSM specification further defines the outputs generated by "fsm_spec_a" as "alpha", "beta", and "gamma". The "alpha" output is assigned to pin "D10". The "beta" output is assigned to pin "D11". The "gamma" output is assigned to pin "D12". The specification further defines the particular states to be included in "fsm_spec_a". The states are "S0", "S1", "S2", "S3", "S4", and "S5". In the example of Listing 1, the reset state is explicitly specified. In other embodiments, the processor generating the parameterization data is capable of interpreting the reset state as the first state listed in the series of states on line 3.

The specification further defines each possible transition that makes up "fsm_spec_a". In the example of Listing 1, there are 13 transitions. Each transition is specified using four values. The first of the four values for a transition indicates the values received for the inputs to the FSM. The second of the four values for a transition indicates the current state of the FSM when the input values are received. The third of the four values for a transition indicates the next state of the FSM. The last of the four values for a transition indicates the output generated by the FSM. Thus, the first transition line having the values "00, S0, S1, 000" indicates that when the "clear" input and the "direction" input each have a value of "0" and the FSM is in state S0, the FSM outputs a value of "000". The first transition line further indicates that the FSM progresses from state S0 to state S1 as the next state.

The example of Listing 1 also illustrates that particular wildcards may be specified in the specification. For example, the last transition with the values "1-", "*", "S0", and "000" indicates that when "clear" has a value of "1", regardless of the value of "direction" or the current state, the FSM progresses to the reset state of "S0" and outputs a value of "000". Thus, wildcards can be defined and used in the specification for particular signals and/or states of the FSM.

Listing 2 is another example of a specification for an FSM. For purposes of illustration, the specification of Listing 2 is specified using an HPL. The example of Listing 2 is specified in Python and, more particularly, as a Python dictionary.

LISTING 2

```
fsm_spec_b=    {'inputs': [('x', 'D0'), ('y', 'D1'), ('z', 'D2')],
                'outputs': [('alpha', 'D5')],
                'states': ['A', 'B', 'C'],
                'reset_state': 'A',
                'transitions':         [['1-- ', 'A', 'A', '0'],
                                        ['-1-', 'B', 'C', '1'],
                                        ['0--', 'A', 'B', '0'],
                                        ['-0-', 'B', 'A', '1'],
                                        ['-11', 'C', 'A', '0'],
                                        ['--0', 'C', 'C', '0']]}
```

Processor 205 is capable of receiving a specification for an FSM at runtime of the IC as illustrated and described herein and generating parameterization data 220 that, when loaded into RCC 210, implements the particular FSM defined by the specification. Parameterization data 220 may include, for example, data that is loaded into various types of memories (e.g., BRAMs and/or LUTs), registers used to control multiplexers, and registers used to control switches and/or other circuitry.

In one or more embodiments, RCC 210 is implemented as or includes a Boolean function network generator (BFNG). As defined herein, a Boolean function network is a circuit that implements two or more Boolean functions. RCC 210 may be parameterized to implement different Boolean function networks at runtime of IC 200 without the need to instantiate any new and/or different circuitry in the programmable circuitry of the IC for each different Boolean function network to be implemented. RCC 210 is capable of implementing any of a variety of different Boolean function networks dynamically within the IC. The parameterization data provided to the runtime generator specifies the particular Boolean function networks to be implemented. As such, RCC 210 is effectively programmed by the parameterization data to implement the particular Boolean function networks over time.

In cases where RCC 210 implements or includes a BFNG, for example, specification 215 defines a particular Boolean function network. Parameterization data 220 specifies the particular Boolean function network defined by specification 215, but is in a format that is loadable into and/or usable by RCC 210. Upon loading parameterization data 220 into RCC 210, RCC 210 is capable of implementing the particular Boolean function network defined by specification 215.

Thus, RCC 210 is capable of implementing any of a variety of different Boolean function networks dynamically during operation of the IC without the need to implement new and/or different circuitry in the IC for each different Boolean function network that is implemented. As an example, an FPGA type of programmable IC may be loaded with a configuration bitstream that implements RCC 210 therein using programmable circuitry. Once implemented, RCC 210 is parameterizable to implement different Boolean function networks over time by loading suitable parameterization data.

For example, once a configuration bitstream is loaded into the IC to implement RCC 210 as, or including, a BFNG, first parameterization data specifying a first Boolean function network may be used to parameterize RCC 210. In response to the parameterization, RCC 210 implements the first Boolean function network. Subsequently, second and different parameterization data specifying a second and different Boolean function network may be loaded into RCC 210, thereby causing the runtime generator to implement the second Boolean function network. This may be performed while the programmable circuitry of the IC continues to operate uninterrupted without implementing different physical circuitry corresponding to the second Boolean function network.

Listing 3 is an example specification for a Boolean function network. For purposes of illustration, the specification of Listing 3 is specified using an HPL. In the example of Listing 3, the specification is specified using Python and, more particularly, as a Python list.

LISTING 3

```
bool_funcs = ['B11 = A3 ^ A5 ^ A7 ^ A11 ^ A13',
              'B17 = A2 & A4 & A8 & A10 & A12']
bool_gen.setup(bool_funcs)
bool_gen.run
```

In the example of Listing 3, the Boolean function network specifies two Boolean functions. The first Boolean function defines an output of "B11" generated from 5 inputs which are "A3", "A5", "A7", "A11", and "A13". The first Boolean function, per the Boolean function network specification of Listing 3, is "A3 XOR A5 XOR A7 XOR A11 XOR A13". The second Boolean function has an output of "B17" generated from 5 inputs which are "A2", "A4", "A8", "A10", and "A12". The second Boolean function, per the Boolean function network specification of Listing 3, is "A2 AND A4 AND A8 AND A10 AND A12".

Processor 205 is capable of receiving a specification for a Boolean function network at runtime of the IC as illustrated and described herein and generating parameterization data 220 that, when loaded into RCC 210 is capable of implementing a BFNG or another circuit that includes a BFNG, where the BFNG implements the particular Boolean function network defined by the specification. Parameterization data 220 may include, for example, data that is loaded into various types of memories (e.g., BRAMs and/or LUTs), registers used to control multiplexers, registers used to control switches and/or other circuitry.

In one or more embodiments, RCC 210 is capable of implementing any of a variety of automaton circuits. In particular embodiments, the automaton circuits are capable of detecting symbol patterns in a received data stream. In other embodiments, the automaton circuits are capable of generating pseudo random number binary sequences.

In the case where RCC 210 is capable of implementing an automaton circuit (e.g., any of the automaton circuits described herein including, but not limited to, LFSR or a cellular automaton circuit), parameterization data 220 specifies the particular instance of automaton circuit defined in specification 215, but is in a format that may be loaded into RCC 210. Upon loading parameterization data 220 into RCC 210, RCC 210 implements the particular automaton circuit defined by specification 215 (and/or parameterization data 220).

Thus, RCC 210 is capable of implementing any of a variety of different automaton circuits dynamically at runtime of the IC without the need to implement new and/or different circuitry in the IC for each different automaton circuit that is implemented. As an example, an FPGA type of programmable IC may be loaded with a configuration bitstream that implements RCC 210 therein using programmable circuitry. Once the configuration bitstream is loaded into the IC to implement RCC 210, first parameterization data specifying a first automaton circuit may be used to parameterize RCC 210. In response to the parameterization, RCC 210 implements the first automaton circuit.

Subsequently, second and different parameterization data specifying a second and different automaton circuit may be loaded into RCC 210, thereby causing RCC 210 to implement the second automaton circuit. This may be performed while the programmable circuitry of the IC continues to operate uninterrupted without implementing different physical circuitry corresponding to the second automaton circuit.

Accordingly, in one or more other embodiments, specification 215 defines a particular automaton circuit that is to be implemented by RCC 210. As discussed, specification 215 may be specified as a high-level software description defining an automaton circuit.

In one or more embodiments, specification 215 specifies or includes one or more regular expressions. In the example of FIG. 2, a regular expression (also referred to as a REGEX) is capable of fully describing an automaton circuit that may be implemented by RCC 210. As an illustrative and nonlimiting example, specification 215 may be specified as the REGEX "A+[AB]{3}D". The example REGEX of "A+[AB]{3}D" means that a sequence of symbol "A" followed by three instances of symbol "A" or symbol "B" followed by symbol "D". Processor 205 generates parameterization data 220 specifying an automaton circuit that is capable of searching for and locating symbol pattern(s) that comply with the REGEX of specification 215.

In particular embodiments, processor 205 is capable of generating parameterization data 220 specifying a nondeterministic automaton circuit from regular expression(s) using a technique such as Thomson's construction. Thomson's construction facilitates the transformation of a regular expression into an equivalent nondeterministic finite automaton. Typically, deterministic finite automatons are considered a special case, but equivalents, of nondeterministic finite automatons. Nondeterministic finite automatons may be converted into deterministic finite automatons. Accordingly, processor 205 is also capable of generating parameterization data 220 specifying a deterministic automaton circuit from regular expression(s).

In one or more embodiments, RCC 210 may include additional circuitry such as a data path circuit and the BFNG to implement a class of nondeterministic FSMs. The data path circuit includes a plurality of stateful circuit elements. The nondeterministic FSMs may be used to perform operations such as regular expression processing. As such, RCC 210 may be programmed by parameterization data to implement any of a variety of the different types and/or classes of nondeterministic FSMs over time without requiring a new configuration bitstream be loaded into the IC.

In one or more embodiments, RCC 210 is capable of utilizing a data path circuit and a BFNG to implement any of a variety of linear, binary sequential circuits (e.g., sometimes referred to herein as "machines"). The data path circuit includes a plurality of stateful circuit elements. Such runtime generators may be parameterized, e.g., changed dynamically at runtime of the IC, without requiring a new configuration bitstream. Examples of the linear, binary sequential circuits that may be implemented by RCC 210 include, but are not limited to, Galois LFSRs, Fibonacci LFSRs, and cellular automaton circuits. An LFSR, whether Galois or Fibonacci, and a cellular automaton circuit, as implemented by the runtime generator, are capable of generating pseudo random number binary sequences.

In one or more other embodiments, the functions performed by the BFNG may be extended to include nonlinear Boolean functions. In such cases, RCC 210 may also implement nonlinear cellular automaton circuits of fixed length. As such, RCC 210 may be programmed by parameterization data to implement any of a variety of the different types and/or classes of Galois LFSRs, Fibonacci LFSRs, linear cellular automaton circuits, and/or nonlinear cellular automaton circuits over time without requiring a new configuration bitstream.

In examples where RCC 210 is capable of implementing an LFSR, specification 215 may specify a polynomial (e.g., specifying a binary polynomial counter). In one or more other embodiments, specification 215 may specify a particular number of bits (e.g., size or length) and/or taps for an LFSR type of automaton circuit. In the case where RCC 210 is capable of generating pseudo random number binary sequences, processor 205 is capable of generating parameterization data 220 based upon the polynomial and/or taps specified by specification 215.

In one or more other embodiments, specification 215 may specify one or more rules for cells of a cellular automaton circuit as implemented by RCC 210. As discussed, both the cellular automaton and LFSR type of automaton circuits are capable of generating random numbers (e.g., pseudo random number binary sequences).

Processor 205 is capable of receiving different specifications, each defining a particular and/or different automaton circuit and generating corresponding parameterization data that can be loaded into RCC 210 at runtime of IC 200 to implement the particular automaton circuit defined by the processed specification. In other embodiments, processor 205 is capable of receiving parameterization data 220 from another source and/or system (e.g., external to IC 200) and loading parameterization data 220 into RCC 210.

Conventional techniques for implementing circuits such as FSMs, Boolean function networks, and/or automaton circuits rely upon creating a different configuration bitstream for each different instance of such circuit to be implemented within the IC. Thus, for the IC to switch from implementing an instance of one of the circuits to a second and different instance of one of the noted circuits, a different configuration bitstream was loaded into the IC to create new circuitry corresponding to the second and different instance of the circuit.

In cases where an instance of an FSM, a Boolean function network, and/or an automaton circuit exists in a larger circuit design under development and is to be modified, conventional techniques require a complete reimplementation of the circuit. The design flow for reimplementing a circuit design, however, may take hours to complete to generate the new configuration bitstream. In accordance with the inventive arrangements described herein, not only may different versions of the circuits be implemented using the same RCC (e.g., same configuration bitstream) thereby avoiding time consuming reimplementation, but aspects of a given instance of a circuit may be changed at runtime of the IC without regenerating the circuit design and/or implementing new and/or different circuitry.

Figure 3:
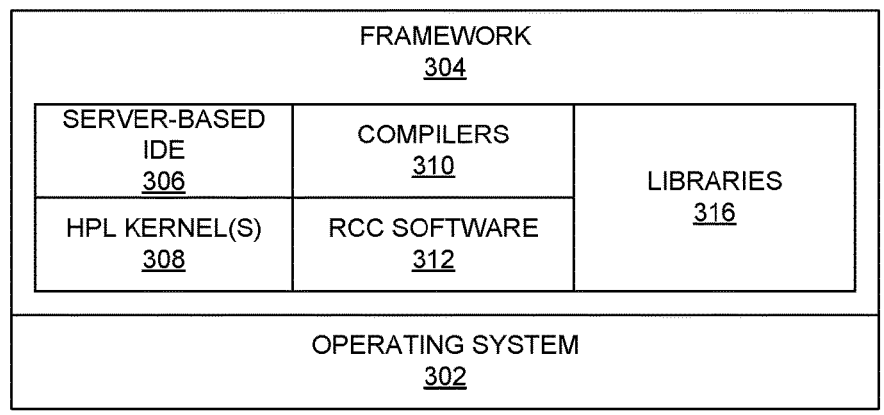
FIG. 3 illustrates an example of data structures usable by a processor within the IC of FIG. 2.

FIG. 3 illustrates an example of data structures stored in memory 225 that are usable by processor 205 of FIG. 2. In one or more embodiments, host system 100 is capable of generating framework 304 and/or individual blocks of framework 304 as part of implementing a circuit design that includes one or more RCCs.

At runtime, memory 225 of IC 200 is capable of storing an operating system 302 and framework 304. Framework 304 can include a server-based integrated development environment (IDE) 306, one or more HPL kernels 308, one or more compilers 310, RCC software(s) 312, and libraries 316. In general, components such as operating system 302 and framework 304 are executable by processor 205.

In one or more embodiments, the software illustrated in FIG. 3 may be generated by host system 100 and delivered as a single image file that may be stored on an SD card or other memory card that may be used to implement memory 225 or that is used to transfer the program code to memory 225. In an aspect, the image file requires no licenses or host-target tool flows (e.g., no installation of software on a computer or system used to access IC 200). The software included on the image file is capable of executing natively on processor 205, for example.

In particular embodiments, operating system 302 is implemented as a full mainline Linux distribution. In one or more other embodiments, a different operating system can be used. In particular embodiments, server-based IDE 306 is implemented as an open source software solution. For example, server-based IDE 306 may be implemented as a Web-based IDE (e.g., hosted by processor 205). Server-based IDE 306 is capable of supporting one or more different programming languages such HLL, HPLs, or the like. In an example, server-based IDE 306 is capable of supporting creation and sharing of documents that contain live program code, equations, visualizations, and explanatory text. As an illustrative and non-limiting example, server-based IDE 306 may be implemented as a Jupyter Notebook.

In one or more embodiments, compilers 310 are executable by processor 205 to compile any of a variety of different program code whether an HLL or an HPL. In particular embodiments, compilers 310 can implement or include one or more cross-compilers for any non-application processor(s) that may exist or be implemented in IC 200. For example, processor 205 is capable of executing a cross-compiler to compile code for one or more RCCs (e.g., slave processors) that may be implemented within the programmable circuitry of IC 200 and/or for other hardwired processors that may be included in IC 200. IC 200 may include one or more hardwired processors in addition to processor 205, for example. Such additional processors may be configured to provide real-time control and/or operation for other systems and/or circuits where such functions are not reliably implemented using processor 205, since processor 205 is tasked with executing operating system 302, HPL kernel(s) 308, and server-based IDE 306. Compilers 310 are capable of compiling program code for execution by such processors. Server-based IDE 306, for example, is capable of invoking one or more of compilers 310.

Framework 304 may also include one or more HPL kernels 308. An HPL kernel is a program that is capable of running and introspecting program code written in an HPL. An HPL, for example, may be a scripted language that requires another software component, e.g., a virtual machine or kernel, to execute the scripts. Framework 304 can include one or more different HPL kernels 308, e.g., to support different HPLs. RCC software 312 may include software executable by an RCC once implemented in IC 200 and/or drivers that are executable by processor 205 to communicate with the implemented RCC.

Framework 304 can include one or more libraries 316. Libraries 316 may include one or more HPL wrappers of programmable circuitry interfaces implemented by RCCs. For example, libraries 316 may be Python wrappers of interfaces for RCCs. The wrappers, for example, are capable of invoking functions coded in C, Fortran, or other optimized HLL type of program code, obtaining results from execution of such functions, and returning the results to the HPL environment. In the case of Python, for example, the wrapper is capable of bypassing the Python kernel (e.g., HPL kernel 308 for Python). In one or more embodiments, wrappers may be implemented using a foreign function interface.

Using the software architecture illustrated in FIG. 3 with IC 200 of FIG. 2 facilitates a boot-n-play out of the box experience for a developer. For example, upon power-up, processor 205 is capable of booting operating system 302 and executing server-based IDE 306. Processor 205 is further capable of executing HPL kernel 308. As such, a developer is immediately able to begin developing for IC 200 using server-based IDE 306 executing on processor 205. Using server-based IDE 306 executing on processor 205, a developer is able to write, execute, and debug application code written in an HPL in IC 200 itself. For example, a user may access server-based IDE 306 via any Web browser of another system communicatively linked to IC 200.

Libraries 316 may also include functions capable of analyzing trace data generated from RCCs, controlling the capture of trace data generated from RCCs, reacting to trace data generated by RCCs, and/or debugging HPL code. Since server-based IDE 306 is implemented as a Web-based IDE, a data processing system interacting with IC 200 need not have any development tools installed thereon. Rather, a user is able to access the functionality of IC 200 using a data processing system executing a browser that is capable of accessing server-based IDE 306 as executed by processor 205.

Accordingly, using framework 304, processor 205 is capable of providing HPL support for programmable circuitry control and communication. Software execution by processor 205 is capable of driving hardware implementation at runtime. Further, IC 200 provides an out-of-the-box development environment that is host-independent as developers can create software and integrated hardware designs (e.g., RCCs) by working completely on the target (i.e., IC 200). In addition, software development relating to developing applications executed by processor 205 can be performed independently of hardware development.

Figure 4:
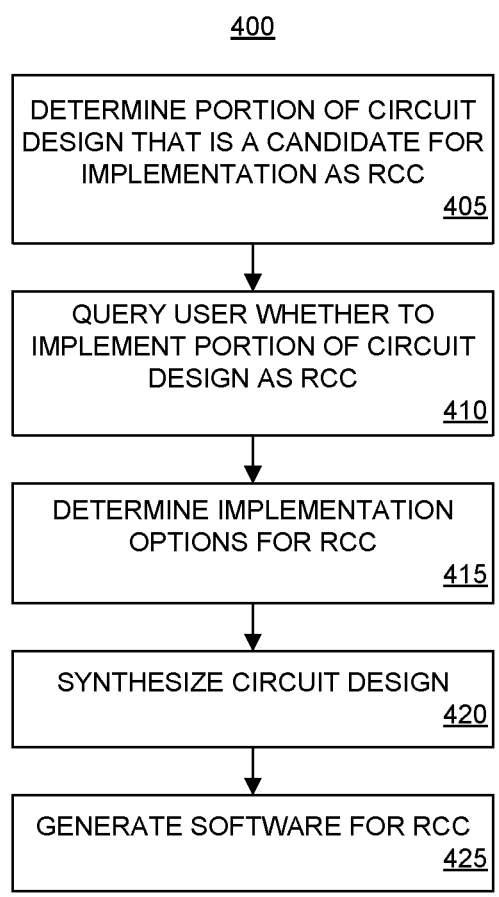
FIG. 4 illustrates an example method of implementing a circuit design using an RCC.

FIG. 4 illustrates an example method 400 of implementing a circuit design using RCCs. Method 400 may be performed by a data processing system such as host system 100 described in connection with FIG. 1. For example, method 400 is an example of the operations performed by the host system to implement a circuit design such as circuit design 135 using one or more RCCs. In the example of FIG. 4, the process describes using one RCC. It should be appreciated that portions of method 400 may be repeated or iterated to replace further circuit structures with RCC equivalents and/or to add RCCs to the circuit design.

In block 405, the system determines a portion of the circuit design that is a candidate for implementation as an RCC. As discussed, the circuit design may be specified in an HLL, using a behavioral HDL, or as a diagram. In one or more embodiments, the system is capable of identifying particular circuit structures within the circuit design as candidates for implementation as an RCC. For example, particular circuit structures for which RCC equivalents exist may be replaced and/or implemented as an RCC. Examples of such circuit structures include, but are not limited to, FSMs, automata circuits, combinatorial logic sections, and/or soft-processors. The circuit structures may be specified within the circuit design using a recognizable notation or syntax that the system is able to detect automatically as being one of the candidate circuit structures. The system, for example, may maintain a list of candidate circuit structures and compare circuit structures of the circuit design with those on the list. In another example, the circuit design may include a directive that identifies a particular circuit structure within the circuit design as a candidate for implementation as an RCC that the system may detect.

In other examples, the circuit design may specify a particular core that the system is able to recognize as being a candidate for replacement with an RCC. For example, the system may maintain a list or hierarchy of different cores that may be replaced with an equivalent RCC and search the circuit design for such replaceable cores. In still another example, the circuit design may include a specific directive to include an RCC core within the circuit design for implementation. In that case, the RCC is added to the circuit design and does not replace another circuit structure. Rather, the RCC is added to the circuit design to provide additional functionality. For example, an RCC may be added to the circuit design to augment an FSM with another FSM, to implement a scheduler, or to add a logic analyzer and/or trace circuitry.

In block 410, the system can optionally query the user whether to implement the portion of the circuit design determined in block 405 as an RCC. For example, in cases where the system is tasked with automatically detecting portions of the circuit design that are candidates for implementation as RCCs, the system may confirm each detected candidate portion of the circuit design with the user prior to implementing the portion of the circuit design with an RCC or RCC equivalent. As discussed, the portion of the circuit design to be implemented using the RCC may be a portion of the circuit design that is to be replaced with an RCC equivalent or a portion of the circuit design that is to be implemented using an RCC by way of a user instruction or a directive (e.g., where the RCC is added to the circuit design and is not used to replace circuit structures already within the circuit design). In response to a user input indicating not to implement the portion of the circuit design as an RCC, for example, method 400 may end.

In block 415, the system is capable of determining implementation options for the RCC. In one or more embodiments, the implementation options for an RCC depend upon the type of RCC that is to be used. For example, the system is capable of determining connectivity for the RCC. The system determines the input signals to be connected to the input ports of the RCC. The system determines the output signals of the RCC to be connected to other circuitry within the IC. Such signals may be the inputs to the circuit that is being replaced, specified by directive, or the like.

In block 415, the system is also capable of determining other implementation options for the RCC. In one or more embodiments, the system is capable of detecting further directives in the circuit design that indicate whether switch circuitry is to be implemented with, or as part of, the RCC. In the case of the switch circuitry, if included, the directives may indicate which ports of the switch are to be configured as inputs, which ports of the switch are to be configured as outputs, connections between signals of the RCC (e.g., input signals and output signals) and ports of the switch, and connections between other signals of the circuit design (e.g., signals not input to or output from the RCC) with ports of the switch.

In one or more other embodiments, the system is capable of detecting further directives in the circuit design that indicate whether trace circuitry is to be implemented with, or as part of, the RCC. In the case of trace circuitry, if included, the directives may indicate which signals of the RCC and/or other signals of the IC not input to or output from the RCC are to be connected to the trace circuitry, trigger conditions for the trace circuitry, and/or particular conditions that may be searched for within the trace data by the processor.

In one or more other embodiments, the system is capable of detecting further directives in the circuit design that indicate whether a clock controller is to be implemented with, or as part of, the RCC. Further examples of implementation options for the RCC are described in connection with the different examples of RCCs described herein in connection with FIGS. 5, 7-11, and 13-16.

In particular embodiments, as part of block 415, the system is capable of determining a first or initial parameterization data for the RCC. In cases where the RCC replaces a circuit structure within the circuit design, the system is capable of determining the first parameterization data for the RCC based upon the portion of the circuit design that is to be replaced by the RCC and/or any circuit description that is to be implemented by the RCC. For example, the circuit design may specify a REGEX, a Boolean function, or an FSM that may be translated by the system into parameterization data used to parameterize the RCC once implemented in the IC.

In one or more embodiments, the implementation options may be determined by querying the user upon processing the circuit design. For example, the implementation options may be determined by asking the user whether to implement the various options described in response to a user confirmation that an RCC is to be included in the circuit design, whether by replacing another circuit structure or by insertion (e.g., addition of the RCC).

In block 420, the system is capable of synthesizing the circuit design using the RCC. In one or more embodiments, the system is capable of replacing the portion of the circuit design identified as a candidate with an RCC core equivalent. As illustrative and non-limiting examples, the system is capable of replacing an FSM circuit structure with an RCC equivalent. The system is capable of replacing an automata circuit with an RCC equivalent. The system is capable of replacing an LFSR or a cellular automaton with an RCC equivalent. The system is capable of replacing a soft-processor with an RCC equivalent (e.g., a slave processor type of RCC). The system is capable of replacing combinatorial logic with an RCC equivalent (e.g., a BFNG).

In other embodiments, the system may include or insert an RCC as specified by a particular directive and/or user instruction to include such circuit structure. The RCC inserted into the circuit design may be any of the various types of RCCs described herein.

In block 420, the system is capable of generating a hardware description of the circuit design including the RCC. In one or more embodiments, the hardware description may be a register transfer level description of the circuit design including the RCC. The system may further generate a gate-level description of the circuit design that specifies, or includes, the RCC. In other embodiments, the system is capable of performing a design flow that may include technology mapping, placement, and/or routing. Further, the system is capable of generating a configuration bitstream from the routed circuit design that specifies or includes the RCC. The hardware description may be any suitable format that may be synthesized, placed, routed, and implemented within an IC.

As part of including the RCC within the circuit design, the system is also capable of including any interface circuitry needed to couple the RCC to the processor (e.g., processor 205) that interacts with the RCC and controls the RCC at runtime. Such interface circuitry may also be synthesized and fully specified within any resulting configuration bitstream that results.

In block 425, the system is capable of generating software for the RCC. For example, the system is capable of generating software (e.g., program code) that is executable by processor 205 for controlling the RCC. The software, when executed by processor 205, is capable of parameterizing the RCC at runtime. As an illustrative and non-limiting example, the software may include a driver that is executable by processor 205 for communicating with the RCC including any of the circuitry also selected as implementation options. As an illustrative and non-limiting example, the software may include trace analysis software that is executable by processor 205 and/or a slave processor type of RCC.

The software may include executable program code that allows processor 205 to generate parameterization data from a specification for the RCC. The software may include executable program code that allows processor 205 to control the RCC and other circuitry selected as implementation options at runtime of the IC, e.g., in real time or in substantially real time. In other embodiments, the software may include the framework or selected components of the framework described in connection with FIG. 3.

In one or more embodiments, method 400 may be included within a larger design flow. For example, prior to performing method 400, the circuit design may be processed by the system to perform operations such as behavioral description analysis, control data flow graph generation, scheduling of hardware operations to timeslots corresponding to clock cycles or time intervals, allocation, data path generation, and controller generation.

In particular embodiments, method 400 may be performed as part of the controller generation process. For example, one or more of the different types of RCCs described herein may be used as controllers. Thus, when implementing portions of the circuit design identified as a controller, such portion of the circuit design may be identified as a candidate for implementation as an RCC. An FSM is an example of such a controller.

FIGS. 5, 7-11, and 13-16 illustrate different types of RCCs that may be implemented within an IC such as IC 200. The different RCCs illustrated in FIGS. 5, 7-11, and 13-16 are implemented using programmable circuitry of an IC. Further, any additional circuitry such as switch circuitry, trace circuitry, and/or the clock controller selected for implementation with the RCC may be implemented using programmable circuitry of the IC unless stated otherwise. The RCCs may operate under control of an embedded processor, e.g., processor 205. The processor may parameterize the RCCs and any other circuitry selected as an implementation option to control operation thereof at runtime of the IC.

Figure 5A:
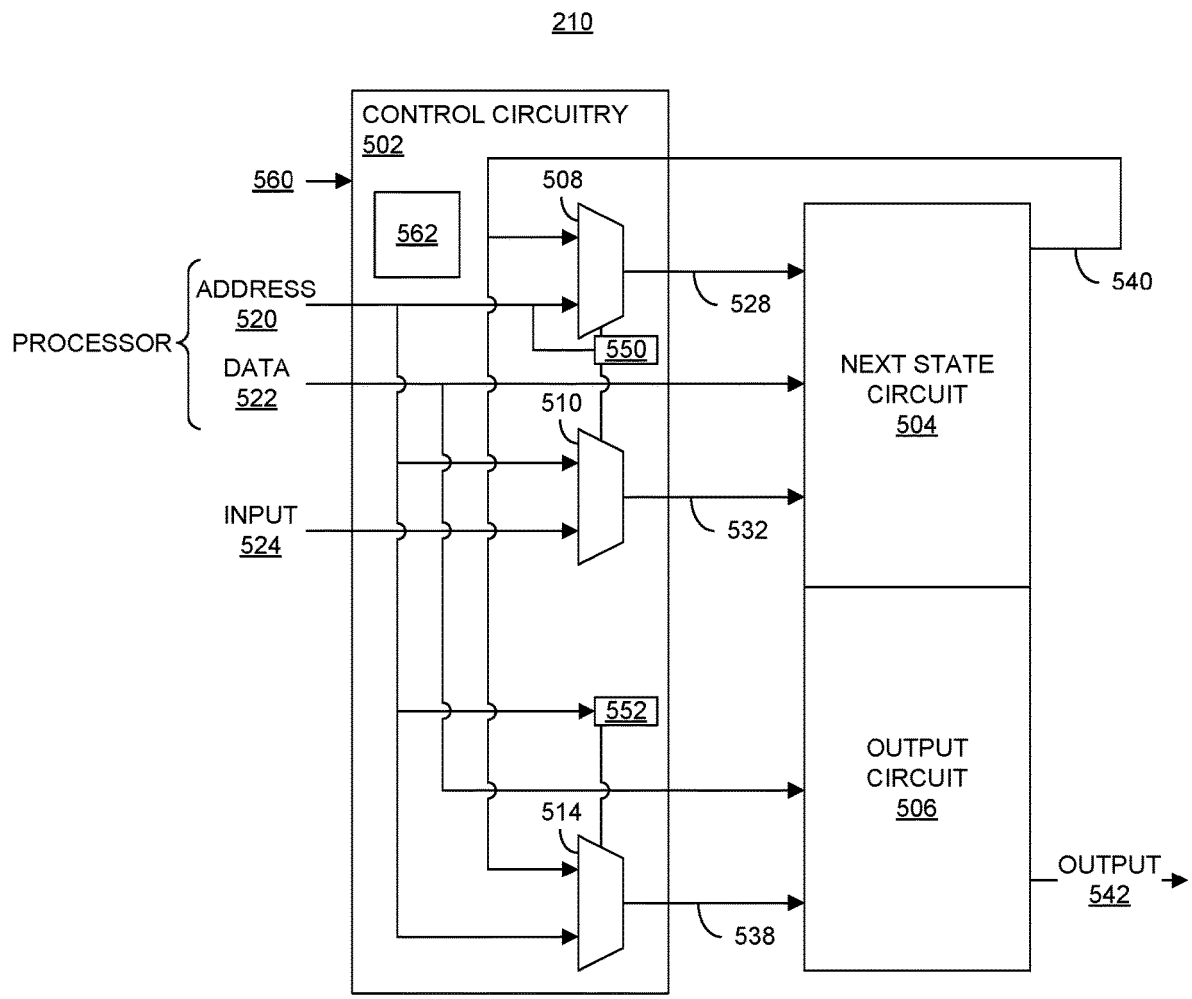
FIG. 5A illustrates an example of an RCC.

FIG. 5A illustrates an example implementation of RCC 210. In the example of FIG. 5A, RCC 210 is capable of implementing a Moore type of FSM based upon the parameterization data that is loaded. As such, RCC 210 is capable of implementing a deterministic automaton circuit. RCC 210 is customizable at runtime of the IC to implement different user specified FSMs and/or automaton circuits. In the example of FIG. 5A, RCC 210 includes control circuitry 502, a next state circuit 504, and an output circuit 506.

In one or more embodiments, each of next state circuit 504 and output circuit 506 is implemented using a memory. Next state circuit 504 may also be referred to as "next state logic". As an illustrative and non-limiting example, next state circuit 504 may be implemented using one or more BRAMs, while output circuit 506 is implemented using one or more BRAMs available on a programmable IC.

Regardless of the number of memories and/or BRAMs used, the contents stored in next state circuit 504 and output circuit 506 may be loaded at runtime of the IC using parameterization data provided to RCC 210 to implement a particular FSM and/or automaton circuit. New and/or different contents may be loaded into next state circuit 504 and/or output circuit 506 as may be desired or in response to particular conditions at any point during runtime. As such, each time RCC 210 receives new and/or different parameterization data, RCC 210 may be parameterized to implement a new and/or different FSM and/or automaton circuit.

In the example of FIG. 5A, next state circuit 504 and output circuit 506 are loaded at runtime with parameterization data by multiplexing access to the address and/or data lines provided to each respective circuit structure. In a first mode of operation used to parameterize RCC 210, the processor is capable of placing RCC 210 in a hold or halted state. For example, the processor may place RCC 210 in a halted state via signal 560. In the example of FIG. 5A, the processor provides address signal 520 and data signal 522 to control circuitry 502. One or more bits of address signal 520 may be used to program registers 550 and 552. Register 550 provides select signals to multiplexers 508 and 510. Register 552 provides select signals to multiplexer 514. The select signals specify the particular signals and/or bits of signals that each respective multiplexer will pass.

In the first mode of operation (e.g., where RCC 210 is parameterized), the processor writes to registers 550 and 552 to cause control circuitry 502 to pass parameterization data such as address signal 520 to next state circuit 504 and/or output circuit 506. Registers 550 and 552 provide select signals that cause multiplexer 508 to pass address signal 520 as signal 528 to next state circuit 504 and cause multiplexer 510 to pass address signal 520 as signal 532 to next state circuit 504. Similarly, in the first mode of operation, the select signals cause multiplexer 514 to pass address signal 520 as signal 538 to output circuit 506.

In the first mode of operation, next state circuit 504 writes data received via data signal 522 from the processor to the addresses specified by address signal 520 (e.g., passed as signals 528 and 532). Similarly, output circuit 506 writes data received via data signal 522 from the processor to the addresses specified by address signal 520 (e.g., passed as signal 538).

In the example of FIG. 5A, it should be appreciated that address signal 520 and data signal 522 are multibit signals. As such, one or more bits of address signal 520 may be provided to multiplexers 508, 510, and/or 514. Such bits may be the same or different. As such, same or different addresses may be provided to next state circuit 504 and output circuit 506. As data signal 522 is also a multibit signal, the bits (data) provided to next state circuit 504 may be different than the bits (data) provided to output circuit 506.

In general, RCC 210 is parameterized by loading the parameterization data into next state circuit 504 and output circuit 506. Once parameterized, RCC 210 implements a particular FSM or automaton circuit. Further, once parameterized, RCC 210 is capable of operating independently of the processor. With the contents of next state circuit 504 and output circuit 506 loaded, the processor is capable of loading registers 550 and 552 with the values necessary (e.g., a last portion of the parameterization data) to provide multiplexers 508, 510, and 514 with appropriate select signals for the proper operation in the second mode of operation (e.g., as an operable FSM or automaton circuit). Accordingly, the processor is capable of releasing RCC 210 from the halted state. The processor may release RCC 210 from the halted state via signal 560.

In the second mode of operation, RCC 210 is capable of operating independently of the processor to implement the particular FSM or automaton circuit specified by the parameterization data. In the second mode of operation, multiplexers 508, 510, and 514 are configured, via the select signals, to pass one or more bits or all of input signal 524 and/or state vector 540. Thus, in the second mode of operation, multiplexer 508 passes one or more bits of state vector 540 as signal 528 to next state circuit 504. Multiplexer 514 passes one or more bits of state vector 540 as signal 538 to output circuit 506. The number of bits of state vector 540 provided by each of multiplexers 508 and 514 is determined by the select signals from registers 550 and 552 (e.g., the parameterization data). In the second mode of operation, multiplexer 510 passes one or more bits of input signal 524 as signal 532 to next state circuit 504. The number of bits of input signal 524 provided by multiplexer 510 is determined by the select signals from register 550 as programmed by the parameterization data.

In the second mode of operation, next state circuit 504 is capable of determining next states of the particular FSM or automaton circuit now implemented by RCC 210. Output circuit 506 is capable of generating output signal 542. As an example, given an initial memory address specified by input signal 524, next state circuit 504 outputs the value stored in next state circuit 504 at the specified memory address. The value read from the memory address specified by input signal 524 is output as state vector 540. State vector 540 specifies, in part, the address corresponding to the next state of the automaton circuit implemented by RCC 210. Concurrently, output circuit 506 outputs the value stored in output circuit 506 at memory address specified by state vector 540. The value read from the memory address specified by state vector 540 is output via output signal 542.

In an example where RCC 210 is parameterized using a specification as illustrated in Listing 1 or in Listing 2, input signal 524 may carry data provided to RCC 210 as input. RCC 210, being parameterized to implement a particular FSM, is capable of transitioning through different states defined by the parameterization data based upon the input signal and/or state vector. RCC 210 outputs data via output 542 per the parameterization data based upon the states.

In an example where RCC 210 is parameterized using a regular expression, input signal 524 may carry a data stream of symbols. RCC 210, being parameterized to detect a particular sequence or pattern of symbols specified by the regular expression, evaluates the symbols of the received data stream to determine whether the symbols in the data stream match, or comply with, the regular expression. Output signal 542, for example, is capable of indicating whether, after processing a received data stream, a particular sequence of symbols satisfying the regular expression is detected therein.

RCC 210 is capable of continued operation as described. The particular number of bits (e.g., width) of state vector 540 and input signal 524 used by RCC 210 depends upon the values written to registers 550 and 552 to provide appropriate select signals to each of multiplexers 508, 510, and 514.

In one or more embodiments, the BRAMs used to implement next state circuit 504 and output circuit 506 are pipelined and require two clock cycles from the start of operation, e.g., first receiving input signal 524, for data to show up at the outputs (output signal 542). To compensate for the pipelining, one or more dummy states may be provided. The dummy state(s) may be used within each implemented FSM or automaton circuit following the reset state to compensate for pipelining in the BRAMs. In particular embodiments, the number of dummy states inserted into or implemented by the FSM or automaton circuit may depend upon the amount of pipelining in the BRAMs. For example, the number of dummy states implemented by each FSM or automaton circuit may be the number of pipeline stages of the BRAM(s) minus 1. As an illustrative and non-limiting example, a 2 clock cycle latency (e.g., 2 pipeline stages) in the BRAMs would utilize one dummy state, while a 3 clock cycle latency (e.g., 3 pipeline stages) in the BRAMs would utilize two dummy states. Once the FSM or automaton circuit begins and passes through the dummy state(s), the dummy state(s) are only utilized if the FSM or automaton circuit is reset and/or restarted from a particular or selected state.

In one or more embodiments, control circuitry 502 includes an additional control register, or registers, 562. Control register 562 may be written with parameterization data specifying the number of dummy states to implement for a given FSM or automaton circuit. Though not shown, control register 562 may be written via signal 560, 520, 522, or another signal not shown that conveys parameterization data. In particular embodiments, control register 562 is capable of controlling operation of the FSM or automaton circuit implemented by RCC 210 to start in a particular or selected state as opposed to the reset state of the FSM or automaton circuit implemented therein. The parameterization data may be written to control register 562 to specify the starting state.

At runtime of the IC, the processor is capable of halting operation of RCC 210 and causing RCC 210 to re-enter the first mode of operation to load second (e.g., new and/or different) parameterization data specifying a second (e.g., a new and/or different) FSM or automaton circuit. The states and transitions (e.g., BRAM contents of next state circuit 504 and/or output circuit 506), width of input signal 524, and the width of state vector 540 used in implementing the second FSM or automaton circuit may differ from the previously implemented FSM or automaton circuit based upon the second parameterization data. As such, the particular FSM implemented or regular expression that RCC 210 is able to match in a received data stream may also differ.

In one or more embodiments, the processor is capable of implementing different FSMs or automaton circuits within RCC 210 in response to different conditions (e.g., signals). These conditions may relate to external (e.g., external to the IC) events detected by the processor, the input(s) and/or output(s) of the particular FSM or automaton circuit implemented by RCC 210, or other conditions detected within the IC itself.

In one or more other embodiments, the processor is capable of providing parameterization data to RCC 210 via another mechanism. In an example, the processor is capable of providing parameterization data to RCC 210 via the Processor Configuration Access Port (PCAP) of the IC. In another example, the processor is capable of providing parameterization data to RCC 210 via the Internal Configuration Access Port (ICAP) of the IC.

In one or more embodiments, RCC 210 may be used as a trigger circuit. For example, RCC 210 may be used to detect a pattern of symbols in a received data stream that matches, or complies with, a regular expression. In response to detecting a symbol pattern that matches the regular expression, RCC 210 is capable of outputting a signal thereby providing a trigger for another circuit and/or system.

In particular embodiments, one or more additional switches may be included within control circuitry 502 and/or within next state circuit 504 and output circuit 506. The switches allow the sharing of bits of signals (e.g., input 524 and/or state vector 540) with the various ports of the BRAMs used to implement next state circuit 504 and/or output circuit 506. For example, a given port may receive one or more bits of input 524 and/or one or more bits of state vector 540, e.g., a mix of such signals.

Figure 5B:
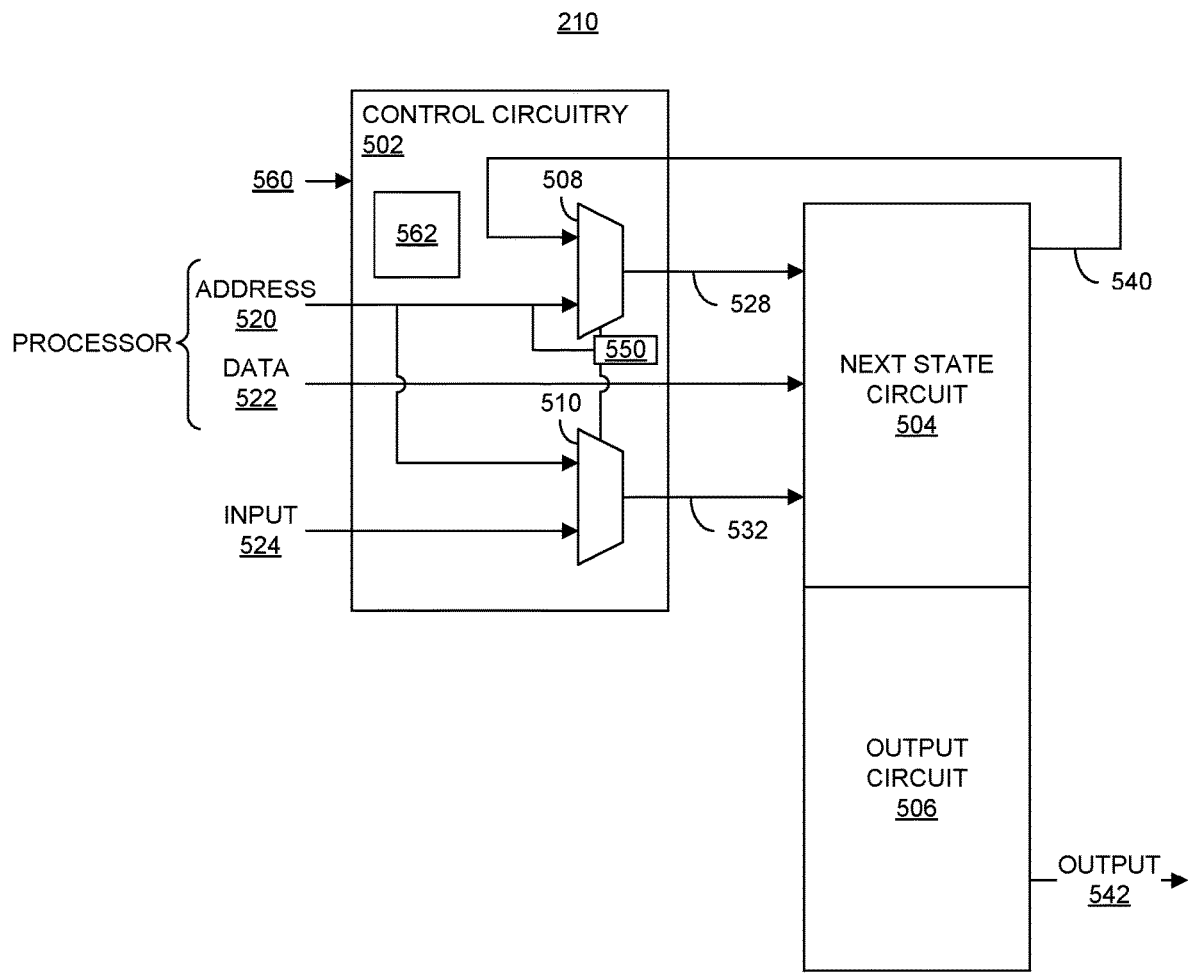
FIG. 5B illustrates another example of an RCC.

FIG. 5B illustrates another example implementation of RCC 210. In the example of FIG. 5B, RCC 210 is capable of implementing a Moore type of FSM based upon the parameterization data that is loaded as described in connection with FIG. 5A. RCC 210 of FIG. 5B may operate substantially similar to the example of FIG. 5A. In example 5B, however, a single, dual ported memory may be used to implement both next state circuit 504 and output circuit 506. Because one dual ported memory is used and is parameterized, the number of elements within control circuitry 502 is reduced. In the example of FIG. 5B, RCC 210 is capable of implementing a deterministic automaton circuit. RCC 210 is customizable at runtime of the IC to implement different user specified automaton circuits. Like the example of FIG. 5A, RCC 210 of FIG. 5B may be parameterized to implement an FSM based upon a specification as illustrated in Listing 1 and/or Listing 2 or perform regular expression matching based upon a specification specifying a REGEX.

Figure 5C:
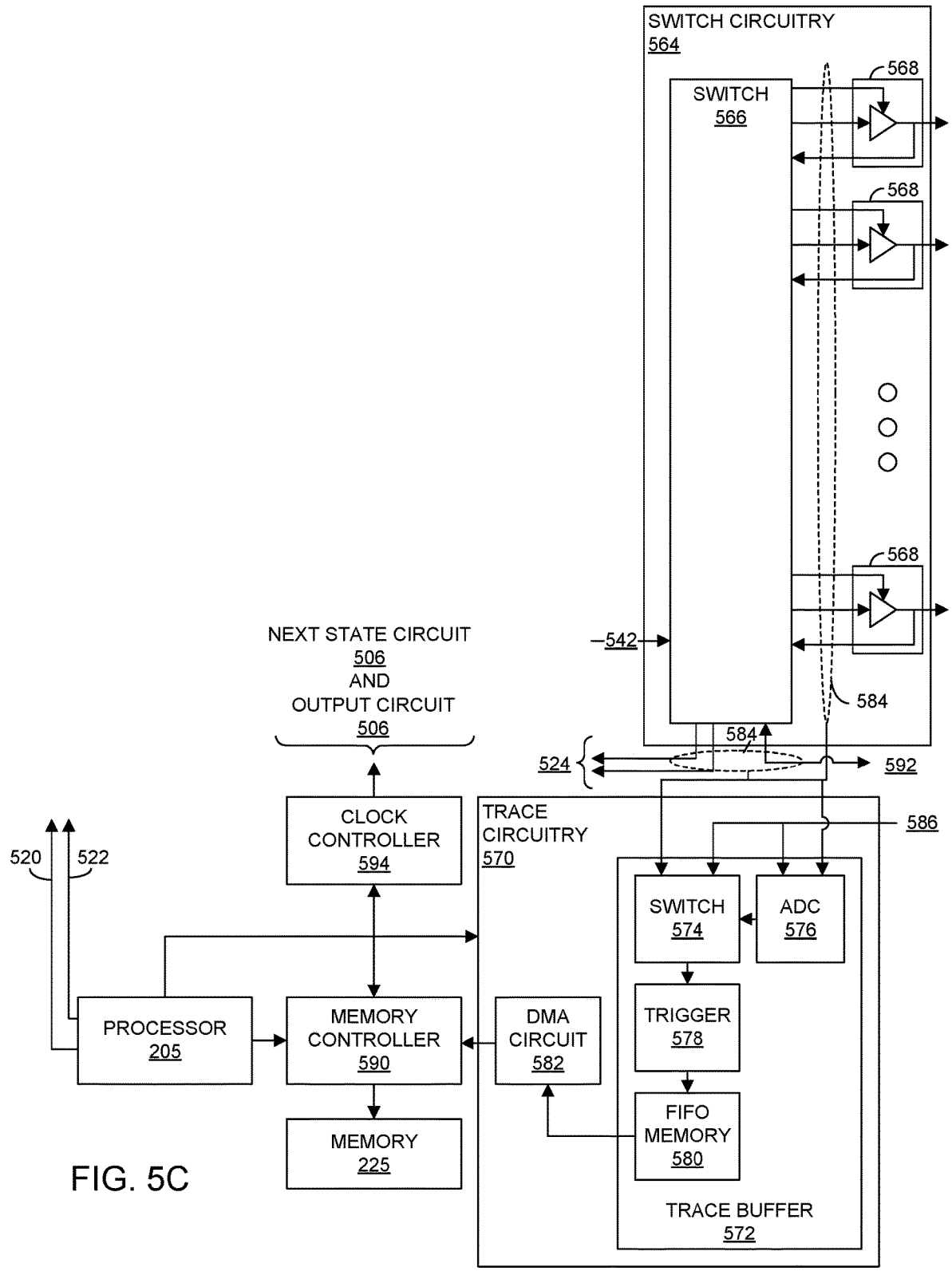
FIG. 5C illustrates an example of switch circuitry and trace circuitry that may be used with an RCC.

FIG. 5C illustrates an example of switch circuitry 564 and trace circuitry 570 that may be used with RCC 210. In one or more embodiments, switch circuitry 564 and/or trace circuitry 570 may be specified as implementation options for RCC 210.

In the example of FIG. 5C, switch circuitry 564 includes a switch 566. Switch circuitry 564, like the other elements of RCC 210, is runtime customizable using parameterization data. When switch circuitry 564 is included, processor 205 is capable of providing parameterization data (not shown) to switch circuitry 564 to control operation thereof. For example, processor 205 is capable of providing parameterization data to switch circuitry 564 during the first mode of operation. The parameterization data for switch circuitry 564 may be specified by, or contained within, the specification for an FSM.

In one or more other embodiments, a different circuit and/or system is capable of providing parameterization data to switch circuitry 564. Such other circuit and/or system may operate in a coordinated manner with processor 205 to parameterize switch circuitry 564 concurrently with parameterizing RCC 210.

Referring to switch 566, the parameterization data may program registers included therein to cause each instance of circuit block 568 to operate as an input or as an output. Each of circuit blocks 568 may be coupled to an I/O pin of IC 200. I/O pins of IC 200 may be connected to an interface for communicating with other systems and/or devices located off-chip. In one or more embodiments, parameterization data may program registers included within switch 566 to cause other ports of the switch to operate as inputs or outputs such as the port connected to signal 592. Signal 592 represents signals that may be received from other nodes within IC 200 and/or signals that may be sent from switch 566 two other nodes within IC 200 based upon parameterization data loaded into switch 566. Switch 566 may also include one or more ports on the left side. For example, switch 566 may include a port connected to output signal 542 of RCC 210 that is configured as an input port. Switch 566 may include one or more ports that are connected to input signals 524 and 526 and that are configured as output ports.

The parameterization data provided to switch 566 specifies whether each port and/or instances of circuit block 568 operates as an input or an output. The parameterization data provided to switch 566 further specifies which ports and/or instances of circuit block 568 are connected to one another for routing signals. In this manner, any instance or instances of circuit block 568 may be configured as an input to receive signals from sources external to IC 200 and route such signals within switch 566 to output ports as signal 524 and/or to other nodes within IC 200 as signal 592. Any instance or instances of circuit block 568 may be configured as an output and provided to destinations external to IC 200. Output signal 542 may be connected to any instance or instances of circuit block 568 that is configured as an output, output via signal 592 to other nodes within IC 200, and/or output as signal 524. Any nodes within IC 200 are able to provide input to switch 566 via signal 592 so that such signals may be routed to any of the ports of switch 566 configured as outputs.

In particular embodiments, switch 566 may include more instances of circuit block 568 and/or other inputs and/or outputs than the sum of the bit width of input signal 524 and output signal 542. By including additional capacity in switch 566, more signals than are needed for any given FSM can be connected to switch 566. Subsequently, at runtime in the IC, different ones of the signals provided to switch 566 may be used for different FSMs implemented by RCC 210 over time based upon the parameterization data that is provided to RCC 210.

As an example, switch 566 may include one instance of circuit block 568 coupled to each of pins D0-D19 (e.g., a 20-pin interface). Each instance of the circuit block 568 remains coupled to the same pin despite implementing different FSMs. For example, when implementing fsm_spec_a of Listing 1, pins D0 and D1 are used as inputs to the FSM. Pins D0 and D1 are coupled to particular instances of circuit block 568 of switch 566. Pins D10, D11, and D12 are used as outputs of the FSM and are coupled to particular instances of circuit block 568 of switch 566. The parameterization data provided to switch 566 configures the instances of circuit block 568 coupled to pins D0 and D1 as inputs and connects the instances of circuit block 568 so pins D0 and D1 are connected to input signal 524. The parameterization data further configures switch 566 so that the instances of circuit block 568 coupled to pins D10, D11, and D12 are configured as outputs and connects the instances of circuit block 568 corresponding to pins D10, D11, and D12 to output signal 542.

RCC 210 is capable of operating as a standalone FSM in the programmable circuitry of the IC once parameterized. Subsequently, in response to a detected condition, the processor is capable of parameterizing RCC 210 to implement fsm_spec_b of Listing 2. When implementing fsm_spec_b of Listing 2, pins D0, D1, and D2 are used as inputs to the FSM. Pins D0, D1, and D2 are coupled to the same instances circuit block 568 of switch 566 as was the case when implementing fsm_spec_a. Pin D5 is used as the output of the FSM and is coupled to the same instance of circuit block 568 of switch 566 as was the case for fsm_spec_a. The parameterization data provided to switch 566 parameterizes the instances of circuit block 568 coupled to pins D0, D1, and D2 as inputs and connects the instances of circuit block 568 so that pins D0, D1, and D2 are connected to input signal 524. The parameterization data provided to switch 566 further configures switch 566 so that the instance of circuit block 568 coupled to pin D5 is configured as an output and connects the instance of circuit block 568 corresponding to pin D5 to output signal 542.

In this example, the various instances of circuit block 568 remain connected to the same pins. Each instance of circuit block 568, however, is individually configurable at runtime to function as an input or an output. Further, each instance of circuit block 568 may be coupled to input signal 524 and/or to output signal 542. These changes may be implemented by processor 205 by providing different parameterization data to RCC 210.

In the examples of FIG. 5, once RCC 210 is instantiated within IC 200, RCC 210 includes a fixed number of available inputs and outputs. Through parameterization of RCC 210 as described, the number of individual (e.g., bit-level) inputs and outputs for a given FSM may be varied but may not exceed the maximum number provided by RCC 210. Similarly, the size of the memory is limited to that initially instantiated for RCC 210.

For purposes of illustration and not limitation, consider an example where RCC 210 includes 13 bits of input and 32 bits of output. If RCC 210 is coupled to a 20-pin interface (e.g., via switch 566), the total number of inputs and outputs for any FSM implemented by RCC 210 must not exceed to 20. Thus, not all of the available inputs and outputs of FSMG may be used.

Table 1 illustrates different example FSMs that may be implemented by RCC 210 by way of parameterization when switch 566 is coupled to a 20-pin interface. As shown, the number of inputs and outputs for FSMs can be varied. The maximum number of states also varies with the input/output architecture. For example, the bottom row specifies an FSM with 32 possible states. The 32 states require 5 address bits. This allows RCC 210 to receive 8 inputs (13–5). In keeping with the total number of 20 I/O pins, 12 of the available 32 outputs may be used. If more than 32 states are needed, an additional address bit is needed to obtain up to 64 states. This reduces the number of inputs to 7 (13–6), but frees up an additional output thereby resulting in 13 outputs. While example of Table 1 is tailored to use RCC 210 as described in connection with FIGS. 5A and 5C or 5B and 5C with a 20-pin interface, it should be appreciated that RCC 210 may be scaled smaller or larger depending upon the number of pins that may be needed.

TABLE 1

| Maximum Inputs | Maximum States | Maximum Outputs |
| --- | --- | --- |
| 4 | 511 (512 − 1) | 16 |
| 5 | 255 (256 − 1) | 15 |
| 6 | 127 (128 − 1) | 14 |
| 7 | 63 (64 − 1) | 13 |
| 8 | 31 (32 − 1) | 12 |

In one or more embodiments where one or more dummy states are used, the maximum number of states may be reduced by the number of dummy states needed. For example, if one dummy state is needed, referring to the bottom row in the example of Table 1, the maximum number of inputs is 8, the maximum number of outputs is 12, but the maximum number of states is 32-1 or 31. In general, the memory may be partitioned so that the needed number of dummy states are available and partitioned off from the portion of the memory made available for implementing user states for the FSM. The number of dummy states partitioned off within next state circuit 504 and output circuit 506 may be specified by control register 562 as described.

In one or more embodiments, another implementation option of RCC 210 is whether to include trace circuitry 570. In the example of FIG. 5C, trace circuitry 570 is included. Trace circuitry 570, like the other elements of RCC 210, is runtime customizable using parameterization data that may be provided from processor 205 to control operation of trace circuitry 570. For example, processor 205 is capable of providing parameterization data to trace circuitry 570 during the first mode of operation. The parameterization data for trace circuitry 570 may be specified by the specification for an FSM.

In the example of FIG. 5C, trace circuitry 570 includes signal capture circuitry 584, trace buffer 572, and direct memory access (DMA) circuit 582. Signal capture circuitry 584 represents signal connections where the input and output signals for each instance of circuit block 568 are routed or coupled to trace buffer 572. Signal capture circuitry 584, for example, illustrates that the inputs and/or outputs of switch 566 may be coupled to trace circuitry for various types of monitoring activities that may be performed during runtime of IC 200.

Trace buffer 572 is capable of implementing probe capability. Trace buffer 572 can include an optional analog-to-digital converter (ADC) 576, an optional switch 574, a trigger circuit 578, and a first-in-first-out (FIFO) memory 580. Any circuit blocks identified as optional may be specified as further implementation options when trace circuitry 570 is selected for implementation. Trace buffer 572 is capable of receiving one or more signals coupled to switch 566, whether analog or digital, and/or other signals from within IC 200 shown as signals 586, whether analog or digital. Analog signals may be digitized using ADC 576. Switch 574 is capable of passing selected signals from ADC 576 and/or from switch 566 on to trigger circuit 578. Trigger circuit 578 is capable of evaluating received signals for particular conditions or trigger events. Selected ones of the signals may be stored in FIFO memory 580, e.g., in response to detecting a particular trigger event.

Trace buffer 572 is coupled to DMA circuit 582. DMA circuit 582 is capable of interacting with a memory controller 590. In one or more embodiments, DMA circuit 582 is implemented using programmable circuitry of IC 200. In one or more other embodiments, DMA circuit 582 is hard-wired in IC 200. DMA circuit 582 is capable of reading data, e.g., trace data, from FIFO memory 580 and writing the trace data to memory 225 via memory controller 590. Memory controller 590 may be located on-chip with RCC 210 or off-chip for reading and/or writing to memory 225.

Memory 225 is implemented as a read-write memory. In one or more embodiments, memory 225 is implemented on-chip. In one or more other embodiments, memory 225 is implemented off-chip. In particular embodiments, memory 225 is implemented as a RAM that is suitable for use by a processor during execution of program code (e.g., dynamic RAM or "DRAM", synchronous DRAM or "SDRAM", and double data rate RAM or "DDR RAM"). In the example of FIG. 5C, processor 205 is capable of configuring RCC 210 as described and is also capable of accessing memory 225 via memory controller 590.

For example, processor 205 is capable of controlling operation of trace buffer 572 via the control signal shown. The signal may carry parameterization data to control operation of the different circuit blocks located within trace buffer 572. For example, if ADC 576 is included in trace buffer 572, processor 205 is capable of controlling operation of ADC 576. Processor 205, for example, is capable of changing the sampling rate of ADC 576 and/or the resolution of samples generated by ADC 576 (e.g., the number of bits of each sample) via the loading of parameterization data.

Processor 205 is capable of controlling operation of switch 574 by providing parameterization data. Switch 574 is capable of receiving a first set of signals from switch 566 or other nodes within IC 200 and any digitized signals passed from ADC 576. Switch 574 is capable of passing a selected subset of signals to trigger circuit 578. The particular subset of signals passed to trigger circuit 578 by switch 574 is determined by processor 205 by way of the parameterization data provided. Inclusion of switch 574 allows a larger number of signals to be coupled to trace buffer 572 that can be probed.

For example, trace buffer 572 may only be able to actively monitor a limited number of signals, e.g., 64 signals. More than 64 signals may be routed from various sources of the IC including switch 566 to switch 574. Switch 574, which may be implemented as one or more multiplexers, can be controlled, during operation from processor 205 to determine or select which of the signals are to be passed to trigger circuit 578. In this manner, an application executed by processor 205 is capable of choosing which of the signals are monitored by trace buffer 572 and under what conditions (e.g., at runtime) such signals are to be monitored by providing new and/or updated parameterization data. In particular embodiments, processor 205 is capable of instructing switch 574 as to which signals to pass at runtime, e.g., in real-time, to dynamically change the particular signals that are probed or evaluated at any given time.

Trigger circuit 578 is capable of monitoring the signals passed by switch 574 to detect particular conditions. In particular embodiments, processor 205 is capable of controlling trigger circuit 578. For example, processor 205 is capable of arming (e.g., starting) and disarming (e.g., stopping) operation of trigger circuit 578. In one or more embodiments, processor 205 is capable of specifying the conditions that trigger circuit 578 monitors for. Processor 205, for example, is capable of providing instructions (e.g., parameterization data) to trigger circuit 578 specifying the conditions to be detected in order to store sampled signals. As such, the conditions used by trigger circuit 578 can be changed and/or updated by processor 205 during runtime by providing new and/or updated parameterization data. In particular embodiments, trigger circuit 578 is capable of continually storing sampled signals in FIFO memory 580 as opposed to storing sampled signals only in response to detecting particular conditions.

DMA circuit 582 reads the sampled signal(s) from FIFO memory 580 and writes the sampled signals to memory 225 as trace data. Once armed and operating, trigger circuit 578 is capable of storing samples of the signal or signals within FIFO memory 580. FIFO memory 580 is capable of performing write mismatch resolution. On the input side of FIFO memory 580 at trigger circuit 578, signals may be sampled at a high rate. For example, signals may be sampled at approximately 100 MHz continuously. At the back end of FIFO memory 580 at DMA circuit 582, DMA circuit 582 reads the trace data from FIFO memory 580 and writes the trace data to memory 225. DMA circuit 582 is capable of accessing a port on memory controller 590. Since other circuits are capable of accessing memory 225 via memory controller 590, there may be contention for writing data to memory 225. FIFO memory 580 alleviates backpressure in the event that sampled signals must be temporarily stored until DMA circuit 582 is able to continue writing data to memory 225.

In one or more embodiments, processor 205 is capable of controlling operation of DMA circuit 582. Processor 205, for example, is capable of instructing DMA circuit 582 to begin writing data to memory 225 and/or stop writing data to memory 225. Further, processor 205 is capable of specifying the particular addresses of memory 225 to which trace data is to be written. In one or more embodiments, processor 205 is capable of dynamically allocating space in memory 225 for storing trace data. Processor 205 is capable of informing or instructing DMA circuit 582 of the allocated address range to be used in memory 225 for storing trace data. Processor 205 is capable of reading and processing trace data from memory 225. Inclusion of FIFO memory 580 facilitates increased throughput to memory 225.

In moving data from FIFO memory 580 (e.g., programmable circuitry) to memory 225, the data moves from a physical memory space (in programmable circuitry) to a memory management unit (MMU) managed virtual memory space. Memory that is addressable by processor 205, for example, is a virtual memory address and an MMU (not shown) handles the virtual page tables. In programmable circuitry, there is no MMU. Memory addresses in programmable circuitry are physical memory addresses. In one or more embodiments, DMA circuit 582 is capable of performing memory domain crossing by translating between virtual memory addressing and physical memory addressing.

In one or more embodiments, when allocating space within memory 225, processor 205 is capable of executing a utility that is capable of reserving a portion of contiguous memory in memory 225. The reserved portion is removed from the virtual memory and is no longer managed by the MMU. Once reserved, the portion of memory becomes addressable physical memory. In particular embodiments, processor 205 receives a pointer to the portion of memory and provides the pointer to DMA circuit 582. DMA circuit 582 accesses memory 225 via the port of memory controller 590 using the memory address received from processor 205. Once finished writing data, DMA circuit 582 is capable of informing processor 205 that data is ready and may be read.

Processor 205 is capable of analyzing trace data stored in memory 225. In one or more embodiments, the trace data is stored in the portion of memory 225 that is allocated for trace buffer 572. The portion of memory may be the reserved portion of memory that is no longer managed by the MMU, at least until the portion of memory is re-allocated or de-allocated by processor 205. Processor 205, for example, is capable of executing a program specified in an HLL. The program may specify the particular analysis of the trace data to be performed by processor 205. Accordingly, processor 205 is capable of performing any of a variety of different actions in response to detecting predetermined conditions within the trace data. Processor 205 is capable of analyzing the trace data from memory 225 in real time.

In one or more embodiments, processor 205 is capable of implementing different FSMs within RCC 210 in response to detecting particular conditions in the trace data. In one or more embodiments, processor 205 is capable of controlling switch 574 to pass different probed signals to trigger circuit 578 in response to detecting particular conditions from the trace data. In one or more embodiments, processor 205 is capable of providing a visualization of the trace data to a data processing system.

In the example illustrated in FIG. 5C, trace circuitry 570 (including signal capture circuitry 584) are implemented as part of RCC 210. As RCC 210 is updated to implement different FSMs, data from the specification such as pin label data may be used and applied to the trace data interpreted or processed by processor 205 from memory 225. This alleviates the need for the user to re-enter data to interpret trace results.

In one or more embodiments, trace circuitry 570 may be used to verify correct operation of the particular instance of RCC 210 (e.g., a parameterized version of RCC 210) implemented in IC 200. For example, processor 205 may generate the parameterization data for an FSM from a specification. Processor 205 may parameterize RCC 210 using the parameterization data. In using the trace circuitry at runtime, the trace data includes the signal values of inputs and/or outputs of the FSM. Processor 205 is capable of analyzing the trace data to verify that the FSM, as implemented by RCC 210, is operating as expected, e.g., correctly, by comparing the expected behavior of the FSM with the actual trace data collected for the FSM implemented by RCC 210. Any anomalies found in the trace data, e.g., mismatches between expected values of trace data and the actual trace data, may be documented by processor 205 by storing a record of the anomaly in memory 225 and/or by generating an exception.

In one or more embodiments, another implementation option of RCC 210 is whether to include clock controller 594. In the example of FIG. 5C, clock controller 594 is included. Clock controller 594 may be controlled by processor 205 during runtime of IC 200. Clock controller 594 is capable of controlling the clock signal provided to RCC 210. In this example, clock controller 594 is capable of controlling the clock signal provided to next state circuit 504 and to output circuit 506. Processor 205, for example, is capable of providing instructions to clock controller 594, which in turn is capable of adjusting the frequency of the clock signal provided to next state circuit 504 and output circuit 506. In this example, clock controller 594 is software controllable by processor 205.

In one or more embodiments, processor 205 is capable of controlling clock controller 594 to single step the clock signal or to multi-step the clock signal. The ability to single step or multi-step the clock signal facilitates increased control when developing a system and/or performing debugging. This ability is further enhanced in that processor 205 may execute suitable development software that allows processor 205 to receive user instructions to initiate single stepping of the clock and/or multi-stepping of the clock in accordance with user preference.

In one or more embodiments, clock controller 594 may be controlled by a circuit and/or system other than processor 205. In particular embodiments, clock controller 594 may receive instructions from another portion of a user circuit design (e.g., internal nodes), an I/O interface (e.g., from an external source), and/or by any combination of the foregoing.

The example illustrated in FIG. 5C is for purposes of illustration only. Within a given circuit design, switch circuitry 564, trace circuitry 570, and clock controller 594 may be implemented independently of one another. For example, if switch circuitry 564 is not selected as an implementation option, trace circuitry 570 may be coupled directly to selected signals of RCC 210.

Figure 6:
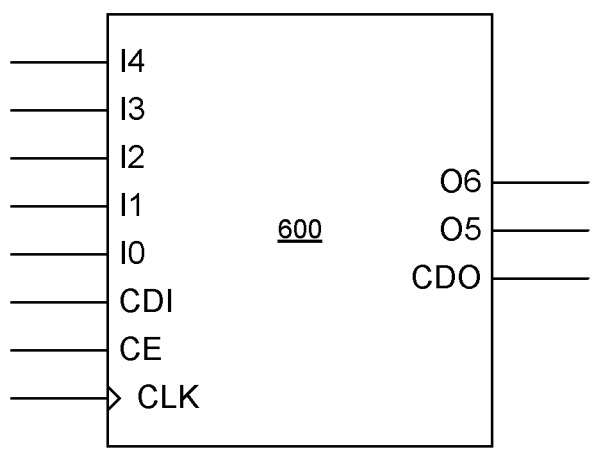
FIG. 6 illustrates an example of a lookup table (LUT) that is configurable at runtime of an IC.

FIG. 6 illustrates an example of a LUT 600 that is configurable at runtime of an IC. LUT 600 is dynamically reconfigurable to change the logic function implemented by LUT 600 during circuit operation (e.g., at runtime of the IC including LUT 600). In the example of FIG. 6, LUT 600 includes 5 inputs labeled 10, 11, 12, 13, and 14. New data can be loaded into LUT 600 during operation through the CDI input without loading a configuration bitstream into the IC. New data can be synchronously shifted into LUT 600 serially to change the logical function implemented by LUT 600.

LUT 600 further includes an output 05 and another output 06. The 06 output produces the logical output function based on the current data loaded within LUT 600 and the currently selected 10-14 inputs. LUT 600 may also be configured to use the 05 output in combination with the 06 output to create two individual 4-input functions sharing the same inputs or a 5-input function and a 4-input function that uses a subset of the 5-input logic.

The CDO pin of LUT 600 allows two or more such LUT structures to be cascaded by connecting the CDO pin from LUT 600 to the CDI input of the next instance of LUT 600, and so forth. Thus, multiple LUT 600 instances can be chained together by coupling the CDO pins to the CDI pins as described to enable the plurality of LUT 600 instances to be loaded with new data to implement new and/or different logic functions by loading a single serial chain of data. For example, 32-bits of data may be used to configure each instance of LUT 600.

Figure 7:
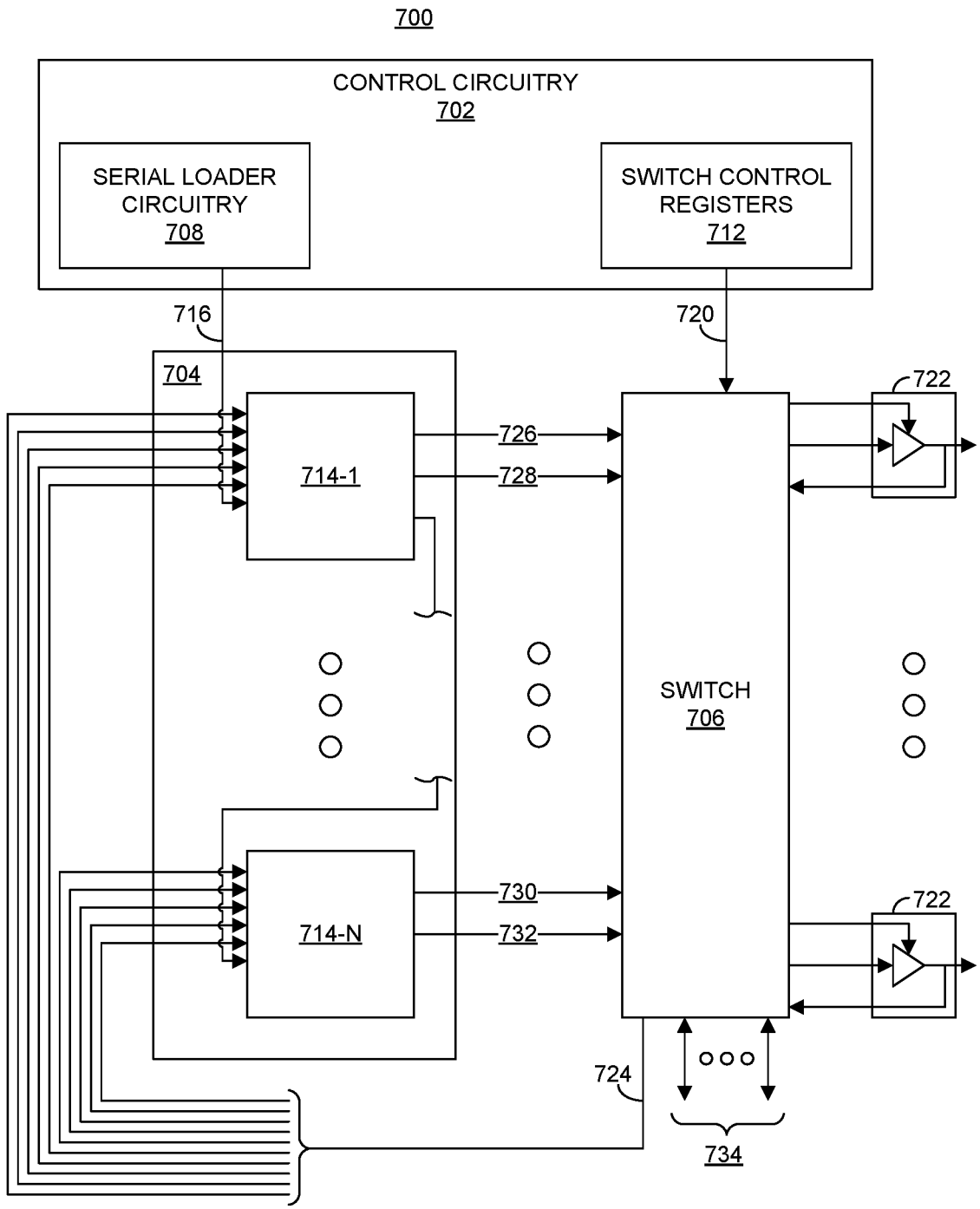
FIG. 7 illustrates an example of a Boolean function network generator (BFNG).

FIG. 7 illustrates an example implementation of a BFNG 700. In one or more embodiments, RCC 210 may be implemented as BFNG 700 and/or implemented to include BFNG 700. For example, a BFNG may be used in implementing another type of deterministic automaton circuit that uses a Mealy type of FSM architecture.

In the example of FIG. 7, BFNG 700 is parameterizable at runtime of the IC to implement different user specified Boolean function networks. BFNG 700 is parameterizable at runtime of the IC through the loading of parameterization data from a processor. For example, a specification as described in Listing 3 may be processed to generate parameterization data that may be loaded into BFNG 700. In the example of FIG. 7, the processor, e.g., processor 205, is capable of providing parameterization data to control circuitry 702.

As an example, the processor is capable of receiving a specification as described in connection with FIG. 2. In this case, the specification defines a Boolean function network that is to be implemented by BFNG 700. The processor generates parameterization data from the specification. The processor is capable of loading the parameterization data into control circuitry 702 to implement the Boolean function network defined by the specification. The parameterization data provided to control circuitry 702 includes the data that is used to control LUT circuit 704, the data that is loaded into the LUTs included within LUT circuit 704, and the data used to control switch 706.

In the example of FIG. 7, control circuitry 702 includes serial loader circuitry 708 and switch control registers 712. LUT circuit 704 includes one or more LUTs 714-1 through 714-N. In an example, LUT circuit 704 (e.g., LUTs 714-1 through 714-N) may be implemented using the LUT described in connection with FIG. 6. Serial loader circuitry 708 is capable of providing the data that is loaded into the individual LUTs 714-1 through 714-N through signal 716. The data loaded into the individual LUTs 714-1 through 714-N defines the particular Boolean function performed by each respective one of LUTs 714. In one or more embodiments, the parameterization data provided to serial loader circuitry 708 and loaded into LUTs 714 via signal 716 specifies the minterms of the Karnaugh map that is loaded into each respective one of LUTs 714.

In one or more embodiments, serial loader circuitry 708 provides the data to the CDI input of LUTs 714 via signal 716. For example, signal 716 can be coupled to the CDI input of LUT 714-1 and output from the CDO output of LUT 714-1 and provided to the CDI input of the next LUT, e.g., LUT 714-N of LUT circuit 704. In such embodiments, serial loader circuitry 708 is capable of loading LUTs 714 serially in a daisy chain manner.

In one or more other embodiments, serial loader circuitry 708 is capable of providing multiple independent signals 716, where each different one of signals 716 is provided to a different group of one or more LUTs 714. In that case, serial loader circuitry 708 is capable of including two or more different serial loader circuits where each different serial loader circuit is capable of providing data to a group of one or more LUTs 714. In such embodiments, the time to load LUTs 714 is reduced by a factor equivalent to the number of different serial loader circuits (or LUT groups) used.

Switch control registers 712 are capable of controlling the configuration of switch 706 via signal 720. The parameterization data provided to switch control registers 712 cause each instance of circuit block 722 to operate as an input or as an output. Each of circuit blocks 722, for example, may be coupled to an input/output (I/O) pin of the IC. The I/O pins of the IC may be connected to an interface for communicating with other systems and/or devices located off-chip.

Switch 706 may also include one or more ports on the left side. For example, switch 706 may include ports coupled to signals 726, 728, 730, and 732. Switch 706 may include one or more output ports that are connected to signal 724 and one or more ports coupled to signals 734. The parameterization data provided to switch control registers 712 further may cause different ones of the ports noted to operate as inputs or as outputs and to establish connections between ports and/or instances of circuit block 722. Signals 734, for example, may be coupled to other circuit nodes within the IC that are not I/O pins. Thus, in particular embodiments, switch 706 may be connected to one or more I/O pins, one or more internal nodes of the IC, or a combination thereof.

The parameterization data provided to switch 706 establishes connections between different instances of circuit block 722, ports on the left side of switch 706, the output ports on the bottom edge of switch 706 coupled to signals 724, and/or the ports coupled to signals 734. In this manner, any signal received via ports of switch 706 and/or circuit blocks 722 may be routed through switch 706 to be output as signal 724, e.g., the input signals to BFNG 700. Similarly, any instance of circuit block 722 may be configured as an output and connected to signals 726, 728, 730, 732, and/or 734 to be provided to I/O pins. Any signals received via switch 706 (e.g., 726, 728, 730, 732, and/or signals received via instances of circuit block 722) may be output as signals 734 to other internal nodes of the IC. Thus, based upon signal 720, connectivity among ports within switch 706 is specified. Further, based upon signal 720, whether ports and/or instances of circuit block 722 operate as inputs or as outputs is specified.

In one or more embodiments, switch 706 is further parameterizable to electrically isolate particular signals received from LUT circuit 704 and/or any of the ports of switch 706. For example, based upon the parameterization data, switch 706 is capable of isolating signal 726, 728, 730, 732, and/or 734. When isolated, switch 706 does not propagate the isolated signal to another port and/or instance of circuit block 722.

LUT circuit 704 includes a plurality of LUTs 714-1 through 714-N, where "N" is an integer value of 1 or more. In the example of FIG. 7, LUTs 714 are arranged in parallel with a single stage. In one or more other embodiments, LUTs 714 may be arranged in multiple stages where a first stage of a plurality of parallel LUTs 714 receives input signals 724 (e.g., from switch 706) and a second stage of LUTs 714 receive input signals from the output signals of the first stage of LUTs 714 (e.g., signals 726, 728, 730, and/or 732).

The inclusion of switch 706 allows the input provided to BFNG 700 (e.g., as signal(s) 724) to be selected at runtime and the output provided from BFNG 700 (e.g., signal(s) 734 and/or signals from instances of circuit blocks 722) to be selected at runtime based upon the parameterization data that is provided to control circuitry 702 and, in particular, to switch 706. Further, the particular Boolean function network implemented by LUT circuit 704 is determined at runtime based upon the parameterization data provided to control circuitry 702.

In the example of FIG. 7, control circuitry 702, LUT circuit 704, and switch 706 may be implemented using programmable circuitry of the IC. As such, BFNG 700 may be created within an IC by loading a configuration bitstream specifying the circuit design therein. Once implemented, BFNG 700 is parameterizable (e.g., customizable) at runtime of the IC to implement different Boolean function networks over time without implementing different circuitry within the IC.

In one or more embodiments, the processor may be coupled to output signals of BFNG 700. As such, the particular configuration of BFNG 700 may be modified to implement one or more different Boolean function networks via the loading of parameterization data in response to results output from the BFNG 700. For example, the processor is capable of monitoring data output from BFNG 700 and, in response to detecting a particular condition in the data, implementing a different Boolean function network within BFNG 700.

Figure 8:
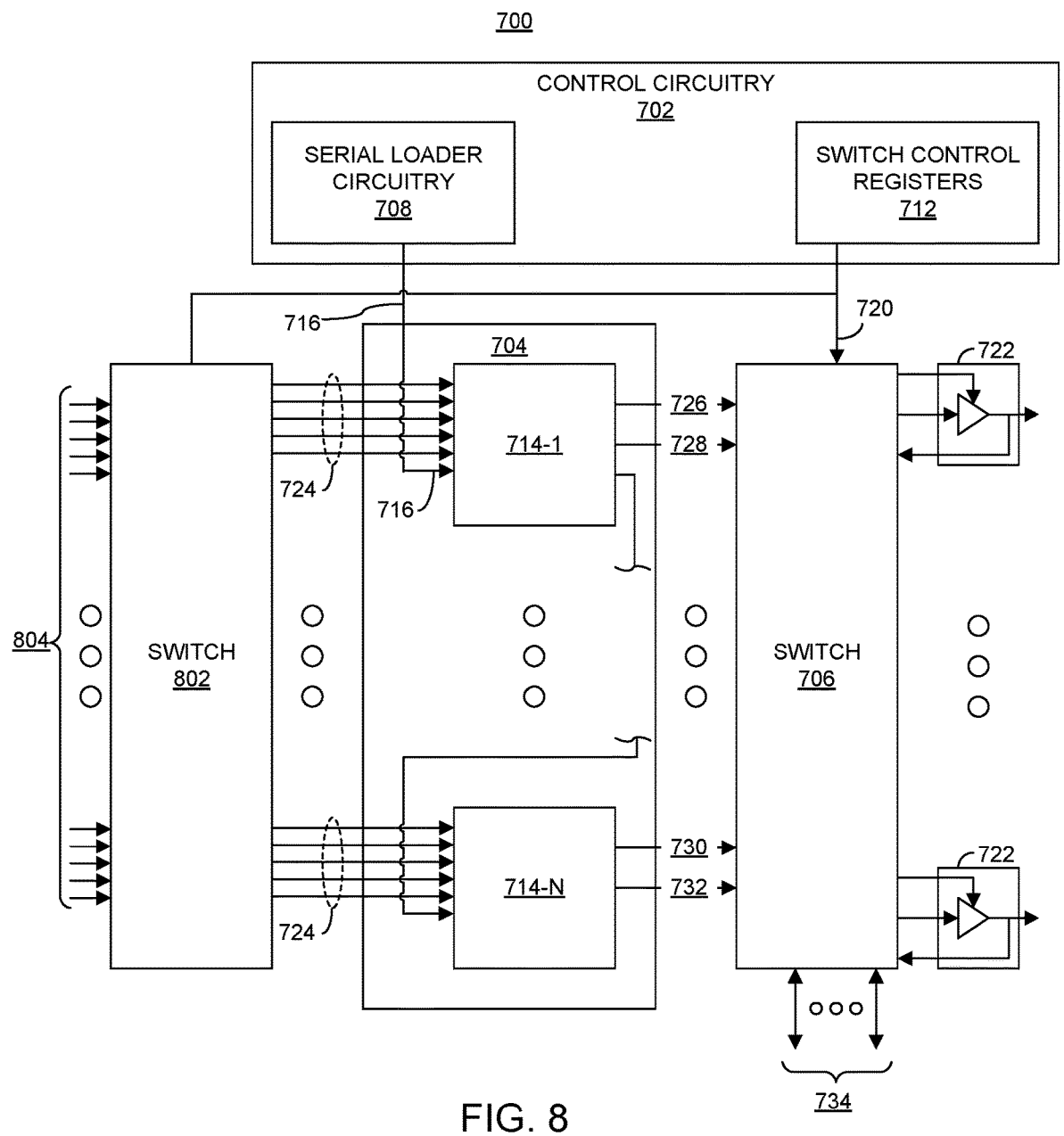
FIG. 8 illustrates another example of a BFNG.

FIG. 8 illustrates another example implementation of BFNG 700. The example shown in FIG. 8 is substantially similar to the example of FIG. 7. In the example of FIG. 8, an additional switch 802 is included. Switch 802 is capable of coupling selected signals 804 to selected signals 724. In the example of FIG. 8, a separate input switch (e.g., switch 802) and a separate output switch (switch 706) are used. Switch 802, like switch 706, may be parameterized via parameterization data. Different nodes may be coupled to signals 804, e.g., internal nodes, I/O pins, or a combination of both, to connect the nodes to signals 724 as inputs to BFNG 700 based upon the parameterization data provided.

In the example of FIG. 8, control circuitry 702, LUT circuit 704, switch 706, and switch 802 may be implemented using programmable circuitry of the IC. As such, BFNG 700 may be created within an IC by loading a configuration bitstream specifying the circuit design therein. Once implemented, BFNG 700 is parameterizable (e.g., customizable) at runtime of the IC to implement different Boolean function networks over time without having to implement different circuitry within the IC.

In one or more embodiments, the processor may be coupled to output signals of BFNG 700. As such, the particular configuration of BFNG 700 may be modified to implement one or more different Boolean function networks via the loading of parameterization data in response to results output from the BFNG 700. For example, the processor is capable of monitoring data output from BFNG 700 and, in response to detecting a particular condition in the data, implementing a different Boolean function network within BFNG 700.

Figure 9:
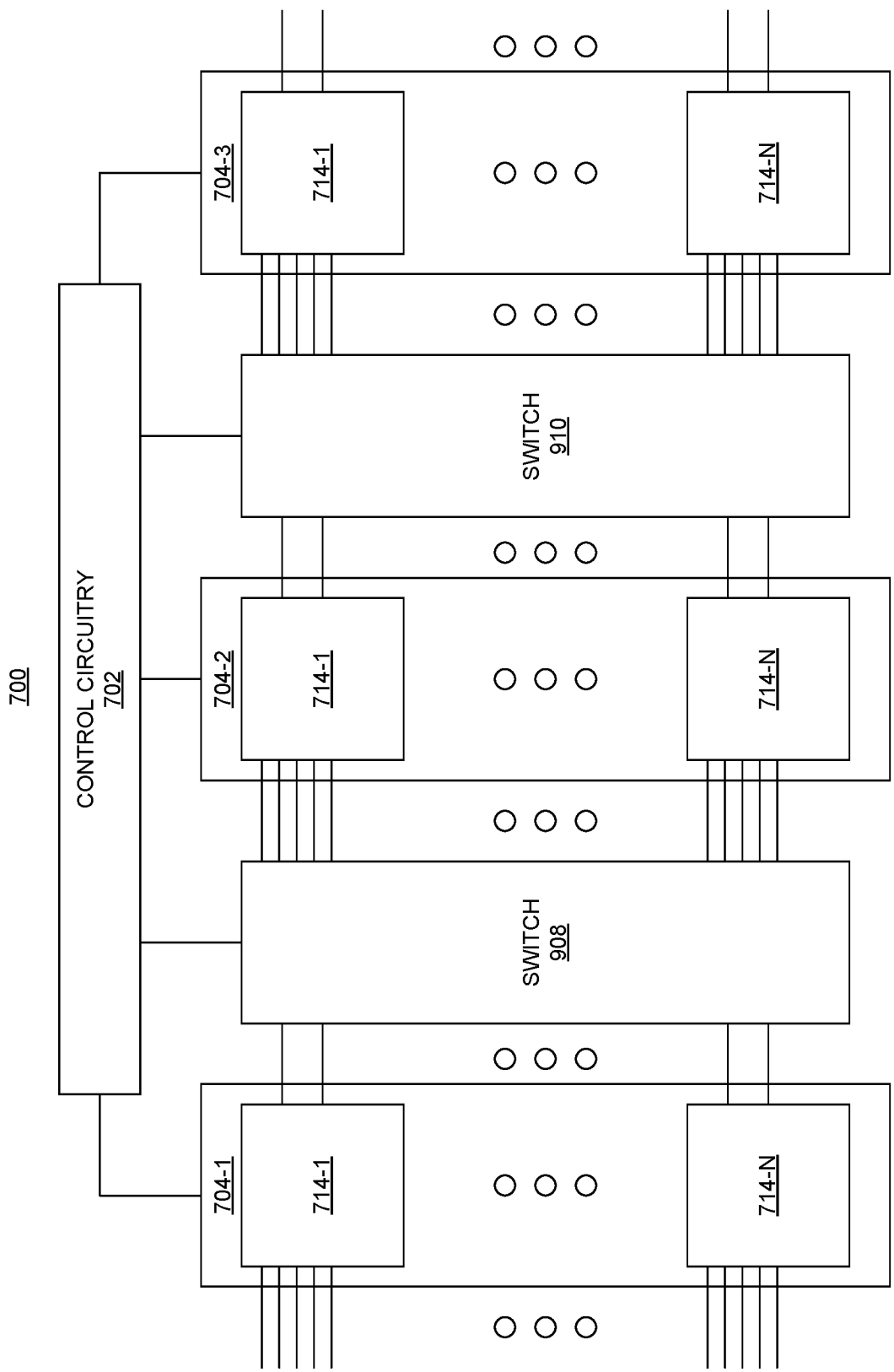
FIG. 9 illustrates another example of a BFNG.

FIG. 9 illustrates another example implementation of a BFNG 700. In the example of FIG. 9, BFNG 700 includes multiple stages of LUT circuits 704. For purposes of illustration, BFNG 700 includes LUT circuits 704-1, 704-2, and 704-3. It should be appreciated that BFNG 700 may include fewer LUT circuits or more LUT circuits than shown. Each of LUT circuits 704 is coupled to the next stage LUT circuit 704 via a switch. LUT circuit 704-1 is coupled to LUT circuit 704-2 via switch 908. LUT circuit 704-2 is coupled to LUT circuit 704-3 via switch 910.

Each of switches 908 and 910 is customizable at runtime of the IC via control circuitry 702. Control circuitry 702 is capable of providing control signals to couple selected inputs of switch 908 to selected outputs of switch 908 and to couple selected inputs of switch 910 to selected outputs of switch 910. Each of LUT circuits 704 is customizable at runtime of the IC via control circuitry 702 to implement different Boolean function networks. For ease of illustration, details of control circuitry 702 are not shown. Control circuitry 702, however, may include control registers for controlling each of LUT circuits 704 and each of switches 908 and 910. A processor is capable of providing the parameterization data to control circuitry 702 during runtime of the IC.

In the example of FIG. 9, the various circuit blocks illustrated for BFNG 700 may be implemented using programmable circuitry of the IC. As such, BFNG 700 of FIG. 9 may be created within an IC by loading a configuration bitstream specifying the circuit design therein. Once implemented, BFNG 700 is parameterizable (e.g., customizable) at runtime of the IC to implement different Boolean function networks over time without having to implement different circuitry within the IC.

In one or more embodiments, the processor may be coupled to output signals of BFNG 700. As such, the particular configuration of BFNG 700 may be modified to implement one or more different Boolean function networks via the loading of parameterization data in response to results output from the BFNG 700. For example, the processor is capable of monitoring data output from BFNG 700 and, in response to detecting a particular condition in the data, implementing a different Boolean function network within BFNG 700.

FIGS. 7-9 are provided for purposes of illustration and not limitation. As described, BFNG 700 may include one or more stages of LUT circuit 704 and one or more stages of switches separating the LUT circuit stages. A BFNG as described herein may have a first stage that is a LUT circuit or a first stage that is a switch. The LUT circuit and switches may be arranged in alternating fashion. The BFNG further may have a last stage that is a LUT circuit or a last stage that is a switch. For example, BFNG 700 of FIG. 9 may include a switch at the input on the left that feeds LUT circuit 704-1 and may include a switch at the output on the right that is fed by LUT circuit 704-3.

Figure 10:
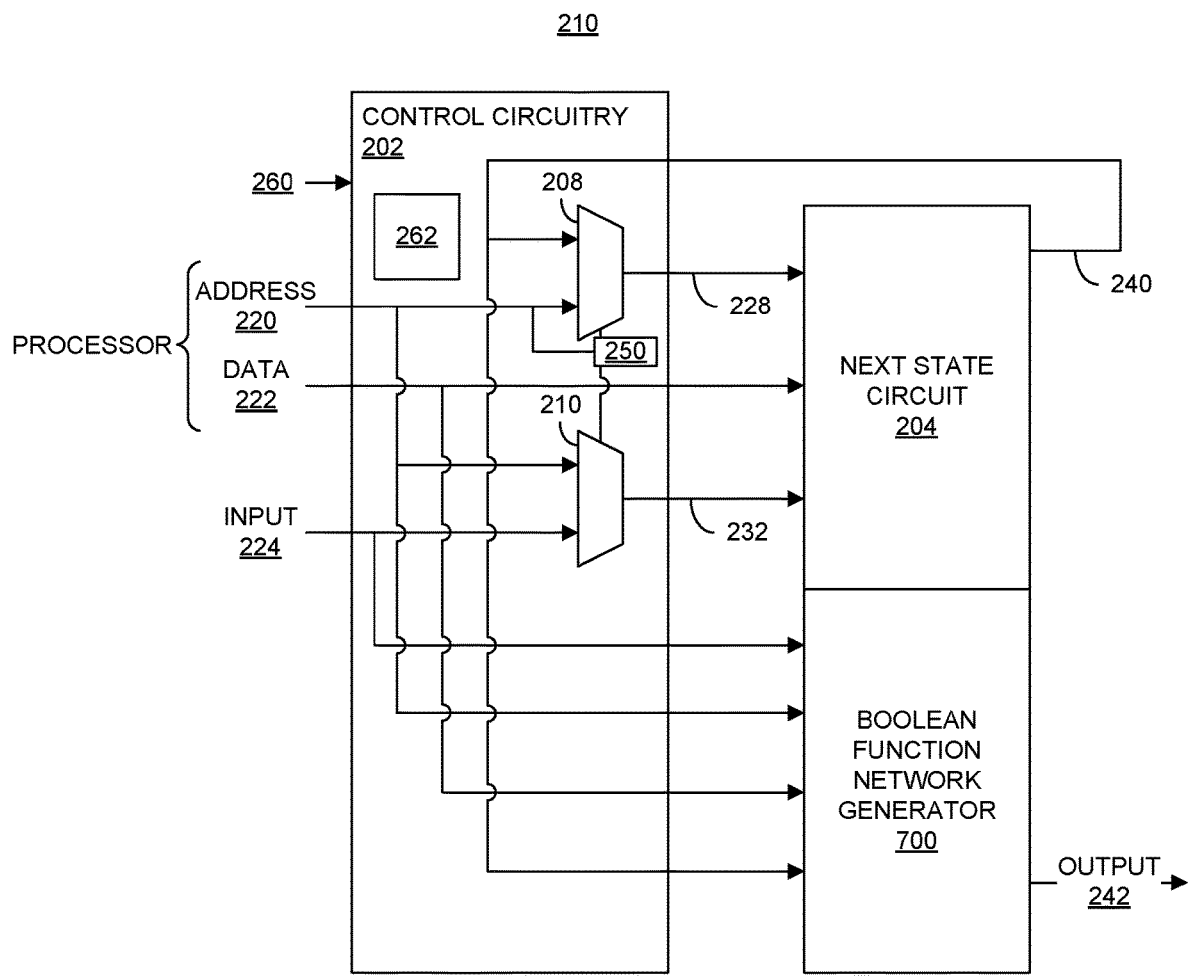
FIG. 10 illustrates an example of an RCC including a BFNG.

FIG. 10 illustrates another example implementation of RCC 210. In the example of FIG. 10, runtime generator RCC 210 is capable of implementing deterministic automaton circuits. RCC 210 of FIG. 10 implements a Mealy type of FSM architecture. RCC 210 is parameterizable at runtime of the IC to implement different user specified deterministic automaton circuits. In the example of FIG. 10, RCC 210 includes control circuitry 202, a next state circuit 204, and BFNG 700. The parameterization data parameterizes control circuitry 202, next state circuit 204, and BFNG 700.

In one or more embodiments, RCC 210 of FIG. 10 may implement an FSM. Accordingly, the specification for RCC 210 of FIG. 10 may be specified as shown in Listing 1 or in Listing 2 (for an FSM). In another aspect, the parameterization data may be specified as an FSM as illustrated in Listing 1 and/or Listing 2 in combination with a Boolean function network.

In one or more other embodiments, RCC 210 of FIG. 10 may be configured to detect symbol patterns in a data stream. Accordingly, the specification for RCC 210 of FIG. 10 may be specified as a regular expression. In another embodiment, the parameterization data may be specified as a regular expression and/or a Boolean function network.

In the example of FIG. 10, RCC 210 operates similar to the example of FIG. 5A. Next state circuit 204 receives signals 222, 228, and 232. Output circuit 206 is implemented as BFNG 700 instead of a memory (e.g., a BRAM) as previously described. BFNG 700 receives signals 220 and 222 for purposes of parameterization. Signals 220 and 222 may be used to load data into next state circuit 204 and may be provided to control circuitry 402 of BFNG 700 in order to load contents of LUT circuit(s) 404 and configure switches included within BFNG 700. State vector 240 and input 224 may also be provided to BFNG 700 as inputs to be processed during operation subsequent to parameterization. For example, state vector 240 and input 224 may be coupled to a switch of BFNG 700 that is configured to treat input 224, state vector 240, or any combination thereof as an input to BFNG 700 (e.g., signals 724).

In one or more embodiments, the processor may be coupled to output signals of BFNG 700. As such, the particular configuration of BFNG 700 may be modified to implement one or more deterministic automaton circuits by loading parameterization data into any combination of control circuitry, BRAMs, and/or BFNG 700 in response to results output from the BFNG 700. For example, the processor is capable of monitoring data output from BFNG 700 and, in response to detecting a particular condition in the data, implementing a different Boolean function network within BFNG 700.

In one or more embodiments, RCC 210 may be used as a trigger circuit. For example, RCC 210 may be used to detect a pattern of symbols in a received data stream that matches, or complies with, a regular expression. In response to detecting a symbol pattern that matches the regular expression, RCC 210 is capable of outputting a signal thereby providing a trigger for another circuit and/or system. In the case of a Mealy machine, RCC 210 is capable of detecting a particular state (e.g., symbol pattern) and refraining from outputting a signal corresponding to the trigger until a particular condition, such as a change, is also detected on input signal 224.

Figure 11A:
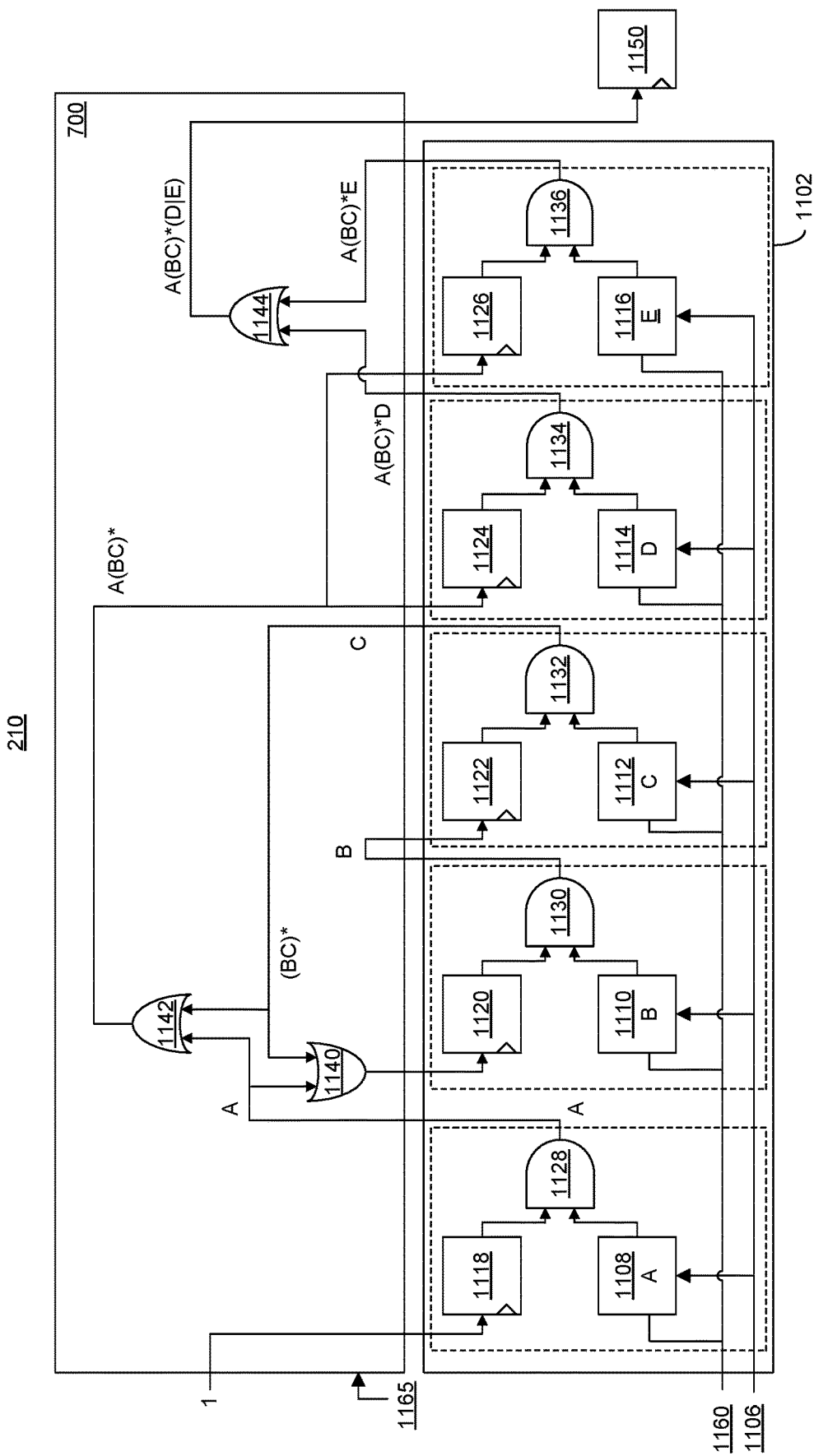
FIG. 11A illustrates an example of an RCC capable of implementing nondeterministic automaton circuits.

FIG. 11A illustrates another example implementation of RCC 210. In the example of FIG. 11A, RCC 210 is capable of implementing different nondeterministic automaton circuits. Unlike a deterministic automaton circuit, a nondeterministic automaton circuit may have zero, one, two, or more possible next states for a given current state and a given input. In the example of FIG. 11A, RCC 210 includes a data path circuit 1102 and BFNG 700. RCC 210 of FIG. 11A is capable of processing regular expressions.

Data path circuit 1102 includes a plurality of stateful circuit elements. Examples of stateful circuit elements include, but are not limited to, registers, shift registers, and/or flip-flops. In the example of FIG. 11A, data path circuit 1102 is capable of receiving a data stream of symbols via signal 1106. The incoming data stream is capable of driving multiple input stages, or tiles, of data path circuit 1102 concurrently. Each input stage, illustrated in dashed lines, may be implemented identically. In the example of FIG. 11A, each input stage includes a comparator, an AND gate, and a register. For example, the first input stage includes comparator 1108, register 1118, and gate 1128. The second stage includes comparator 1110, register 1120, and gate 1130. The third stage includes comparator 1112, register 1122, and gate 1132. The fourth stage includes comparator 1114, register 1124, and gate 1134. The fifth stage includes comparator 1116, register 1126, and gate 1136. Registers 1118, 1120, 1122, 1124, 1126, and 1150 may be implemented as D type registers. For purposes of illustration clock signals into registers 1118, 1120, 1122, 1124, 1126, and 1150 are not shown.

Data path circuit 1102 may include fewer or more input stages. In one or more embodiments, data path 1102 includes a predetermined number of input stages that may be used to detect further values based upon the particular REGEX expression that is provided as part of the specification. Any input stages that are not used may be excluded from the calculation of whether a match is determined based upon the REGEX provided (e.g., treated as "don't cares").

In this example, the parameterization data provided to RCC 210 implements an automaton circuit that is capable of detecting occurrences of a particular symbol pattern within a received data stream. The specification may be the REGEX of A(BC)*(D|E), which specifies the symbol "A" followed by the symbols "BC" zero or more times, followed by the symbol "D" or the symbol "E". Appreciably, the REGEX may specify a different symbol pattern and the symbol pattern used herein is for purposes of illustration only.

Each input stage is parameterized to detect a particular symbol of the REGEX expression. For example, each of comparators 1108, 1110, 1112, 1114, and 1116 is coupled to signal 1106 and receives the incoming data stream concurrently. Comparators 1108, 1110, 1112, 1114, and 1116 are parameterized via signal 1160 to detect the symbols A, B, C, D, and E, respectively. The AND gate of each input stage activates in response to the comparator of the input stage detecting the specified symbol and the register in the input stage also receiving a logic high or "1" signal from BFNG 1104.

As pictured, each input stage of data path circuit 1102 receives input signal 1106. Further, each input stage has an input coupled to BFNG 700 and an output coupled to BFNG 700. Each input stage outputs a signal from the AND gate that enters BFNG 700. BFNG 700 may be parameterized via signal 1165 to implement particular Boolean functions and/or Boolean function networks shown. BFNG 700 is parameterizable via signal 1165 to establish the connections between the various input stages of data path circuit 1102 by implementing particular Boolean functions using outputs from each input stage, and providing signals to drive the clocked register of each input stage thereby enabling the REGEX being implemented by RCC 210. The different signal paths flowing into and out of BFNG 700 are labeled with the portions of the REGEX represented by the respective signals.

In this example, based upon signal 1165, BFNG 700 implements OR gates 1140, 1142, and 1144. BFNG 700 further is capable of providing a constant logic high or "1" signal to register 1118 to enable symbol detection. The inputs of OR gate 1140 and of OR gate 1142 are coupled to the output of AND gate 1128 and the output of AND gate 1132. The output of OR gate 1140 is coupled to the input of register 1120. The output of OR gate 1142 is coupled to the input to register 1124 and the input to register 1126. The inputs of OR gate 1144 are coupled to the output of AND gate 1134 and the output of AND gate 1136. The output of OR gate 1144 is coupled to the input of register 1150. Register 1150 may be the match register. Register 1150 is capable of storing a value of 1 in response to the automaton circuit implemented by RCC 210 detecting an occurrence of the symbol pattern specified by the REGEX. The clock signal to register 1150 is not shown for ease of illustration.

As noted, the portions of the REGEX A(BC)*(D|E) are applied to the different signal paths to illustrate how RCC 210 is parameterized based upon the REGEX. In general, once register 1118 is enabled, AND gate 1128 triggers upon detecting an "A". As such, both OR gate 1140 and OR gate 1142 are enabled in response to detecting an "A". Further, both OR gate 1140 and OR gate 1142 are enabled in response to detecting an "A" followed by zero or more "BC". The path including AND gate 1130 (corresponding to "B") is directly connected to register 1122 (corresponding to "C") via BFNG 700. As shown, OR gate 1142 enables the path corresponding to "D" and the path corresponding to "E" concurrently.

In general, RCC 210 of FIG. 11A may be implemented (e.g., at compile time) so that BFNG 700 is capable of implementing a maximum of "N" combinatorial functions, where "N" is the number of input stages and symbols in the regular expression. Further, each of the N combinatorial functions will have a maximum of "N" inputs and have one output.

Figure 11B:
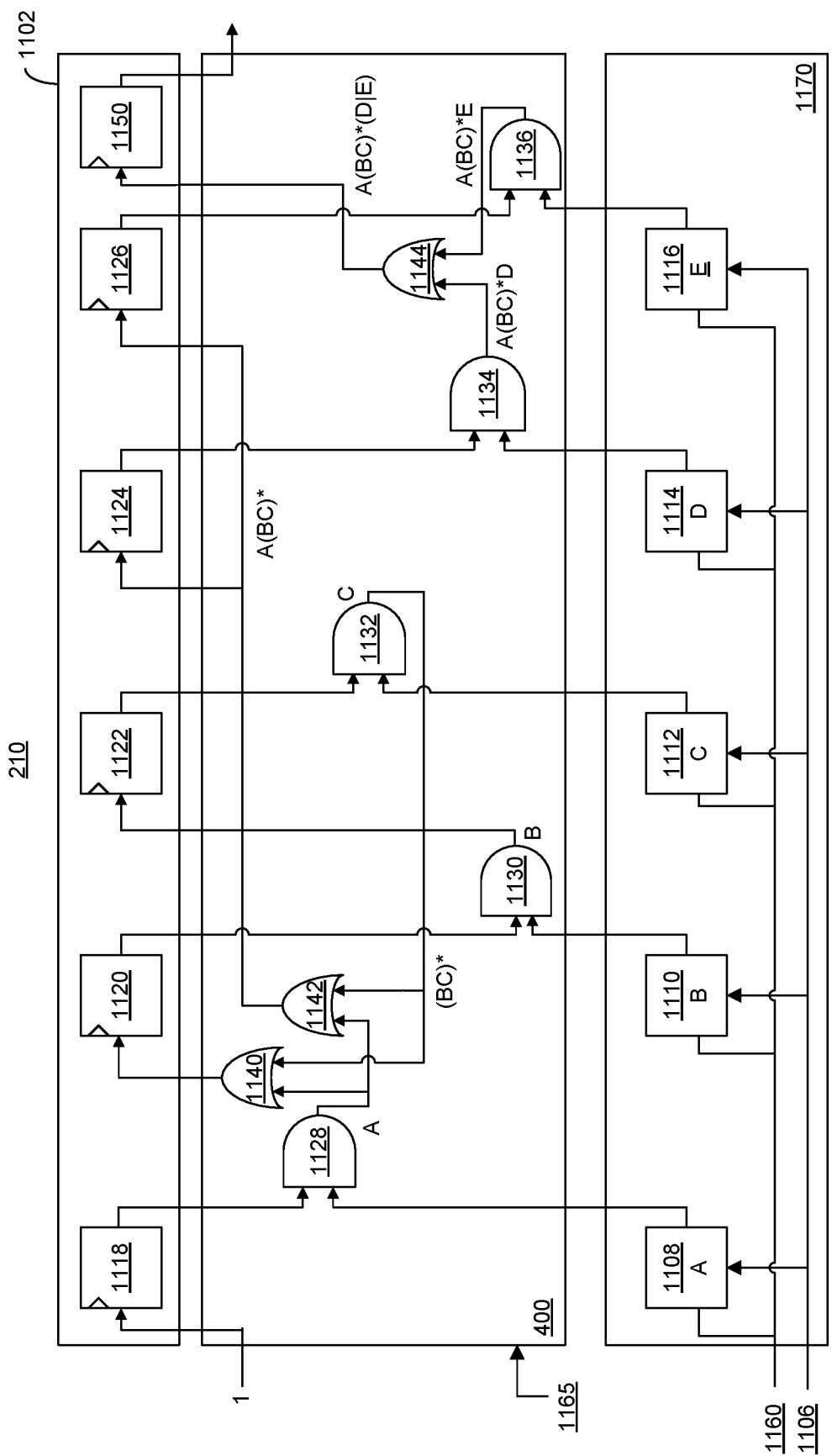
FIG. 11B illustrates another example of an RCC capable of implementing nondeterministic automaton circuits.

FIG. 11B illustrates another example implementation of RCC 210. In the example of FIG. 11B, AND gates 1128, 1130, 1132, 1134, and 1136 are implemented in BFNG 700. For purposes of illustration, comparators 1108, 1110, 1112, 1114, and 1116 are moved out of data path circuit 1102 and are included in comparator circuit 1170. Further, register 1150 is incorporated into data path circuit 1102.

FIG. 11B illustrates an example where data path circuit 1102 is implemented as an array or sequence of stateful circuit elements. The stateful circuit elements may be implemented as D type registers. Further, the input and output of each stateful circuit element is connected to BFNG 700. A runtime generator having an architecture that includes an array of stateful circuit elements coupled to a BFNG is capable of implementing an entire class of linear, binary sequential circuits that may be changed without loading new configuration bitstreams into the IC. The circuits implemented by the runtime generator may be changed at runtime using parameterization data to change the logic and/or routing as provided or implemented by the BFNG.

Figure 12:
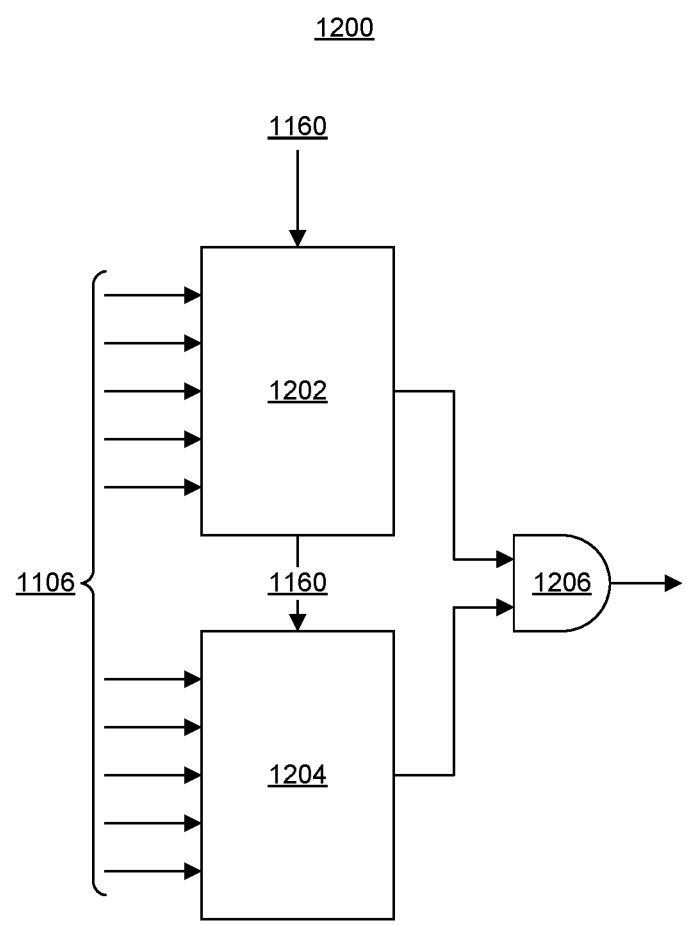
FIG. 12 illustrates an example of a comparator for use with the runtime generator of FIGS. 11A and 11B.

FIG. 12 illustrates an example implementation of a comparator 1200 that may be used in the examples of FIGS. 11A and 11B. For example, comparator 1200 may be used to implement any one of comparators 1108, 1110, 1112, 1114, or 1116. In one or more embodiments, each comparator may be formed using one or more lookup tables as described in connection with FIG. 6. In the example of FIG. 12, a 10-bit comparator is implemented using two such lookup tables 1202 and 1204.

Symbols may be input to comparator 1200 through signal 1106. Comparator 1200 may be parameterized via signal 1160. The output of each of lookup tables 1202 and 1204 is provided to AND gate 1206. The output from AND gate 1206 indicates whether a particular symbol, e.g., "A" in the case of comparator 1108, is detected.

Comparator 1200 is shown for purposes of illustration and not limitation. Comparator 1200 may be implemented using other types of circuitry that may be parameterized, e.g., programmed or customized, at runtime to recognize a particular symbol. In another embodiment, a 5-bit comparator may be implemented using a single lookup table without AND gate 1206. It should be appreciated that a single lookup table as described may be used to implement a comparator of 5 or fewer bits. Similarly, in the case of the circuit structure shown in FIG. 12, such structure may be used to implement a comparator of 10 or fewer bits.

Figure 13:
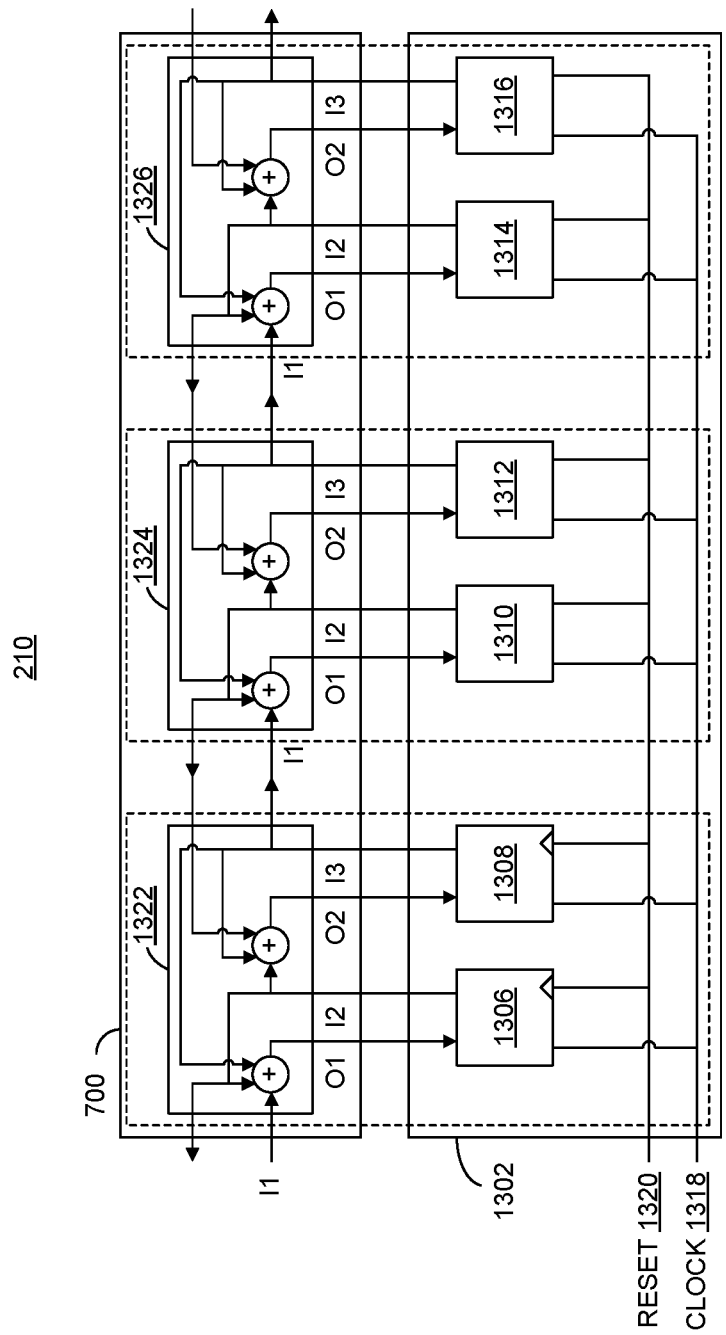
FIG. 13 illustrates an example of an RCC capable of implementing cellular automaton circuits.

FIG. 13 illustrates another example implementation of RCC 210. In the example of FIG. 13, RCC 210 is capable of implementing a cellular type of automaton circuit (e.g., a "cellular automaton"). A cellular automaton is capable of generating pseudo random number binary sequences. For example, RCC 210 of FIG. 13 may be used to implement a pattern generator. The example runtime generator of FIG. 13 is capable of implementing any Galois field 2 linear machine.

In the example of FIG. 13, RCC 210 includes a data path circuit 1302 and a BFNG 700. Data path circuit 1302 may be implemented using a plurality of registers 1306, 1308, 1310, 1312, 1314, and 1316. Registers 1306-1316 may be implemented as D type registers. In the example of FIG. 13, data does not flow through data path circuit 1302. Rather, each of registers 1306-1316 is connected to clock signal 1318 and to reset signal 1320. Further, each of registers 1306-1316 has an input and an output (e.g., data input and data output) coupled to BFNG 700.

In one or more embodiments, BFNG 700 includes a plurality of LUTs 1322, 1324, and 1326. LUTs 1322-1326 may be implemented as described in connection with FIG. 6. In this regard, the particular function implemented by each respective LUT 1322-1326 may be programmed at runtime. The inputs to each respective LUT 1322-1316 are labeled as "I1", "I2", and "I3". The outputs from each respective LUT 1322-1326 are labeled as "O1" and "O2".

In the example of FIG. 13, RCC 210 has a tiled architecture. Each tile is illustrated using a dashed outline. As shown, each tile may be formed of two registers from data path circuit 1302 and a LUT from BFNG 700. In one or more embodiments, each tile is capable of implementing two cells of the cellular automaton. Each cell is associated with a 3-input XOR gate. For example, each of LUTs 1322-1326 is capable of implementing two cells or, in this example, two XOR gates. It should be appreciated that RCC 210 may include fewer or more tiles than shown in FIG. 13.

Within each tile, the first cell generates O1 and the second cell generates O2. In the example of FIG. 13, each cell is capable of generating an output based upon two or three signals. The particular function implemented by each cell may be programmed by way of parameterization data at runtime.

For each cell of a cellular automata, the next state of the selected cell can be completely described based on the value of the cell to the left, the value the cell itself, and the value of the cell to the right. Thus, each cell of RCC 210 may be programmed to implement a next state function that specifies the output of the cell given the current state of the cell, the state of the cell to the left, and/or the state of the cell to the right. As generally known, when the state function of the $i^{th}$ cell is expressed in the form of a truth table, then the decimal equivalent of the output is referred to as the "rule Ri". Table 2 below illustrates an example of rule 90 and rule 150 that may be implemented by cells of RCC 210.

TABLE 2

| | $X_{C-1}(t), X_C, X_{(C+1)}(t)$ | | | | | | | |
|---|---|---|---|---|---|---|---|---|
| | $2^7$ | $2^6$ | $2^5$ | $2^4$ | $2^3$ | $2^2$ | $2^1$ | $2^0$ | Rule # |
| | 111 | 110 | 101 | 100 | 011 | 010 | 001 | 000 | |
| $X_{C-1}(t) \oplus X_{(C+1)}(t)$ | 0 | 1 | 0 | 1 | 1 | 0 | 1 | 0 | 90 |
| $X_{C-1}(t) \oplus X_C \oplus X_{(C+1)}(t)$ | 1 | 0 | 0 | 1 | 0 | 1 | 1 | 0 | 150 |

In general, RCC 210 is capable of implementing linear rules and/or nonlinear rules. A linear rule is one that employs or uses only XOR or XNOR logic. A nonlinear rule is one that employs or uses at least some logic other than XOR or XNOR logic, e.g., Rule 75.

In the example of FIG. 13, data path circuit 1302, BFNG 700, and connections between data path circuit 1302 and BFNG 700 are implemented by way of configuration data. The functions and connectivity of signals within BFNG 700 are established by programming BFNG 700 with parameterization data that may specify the particular rule to be implemented by each cell of BFNG 700.

Figure 14:
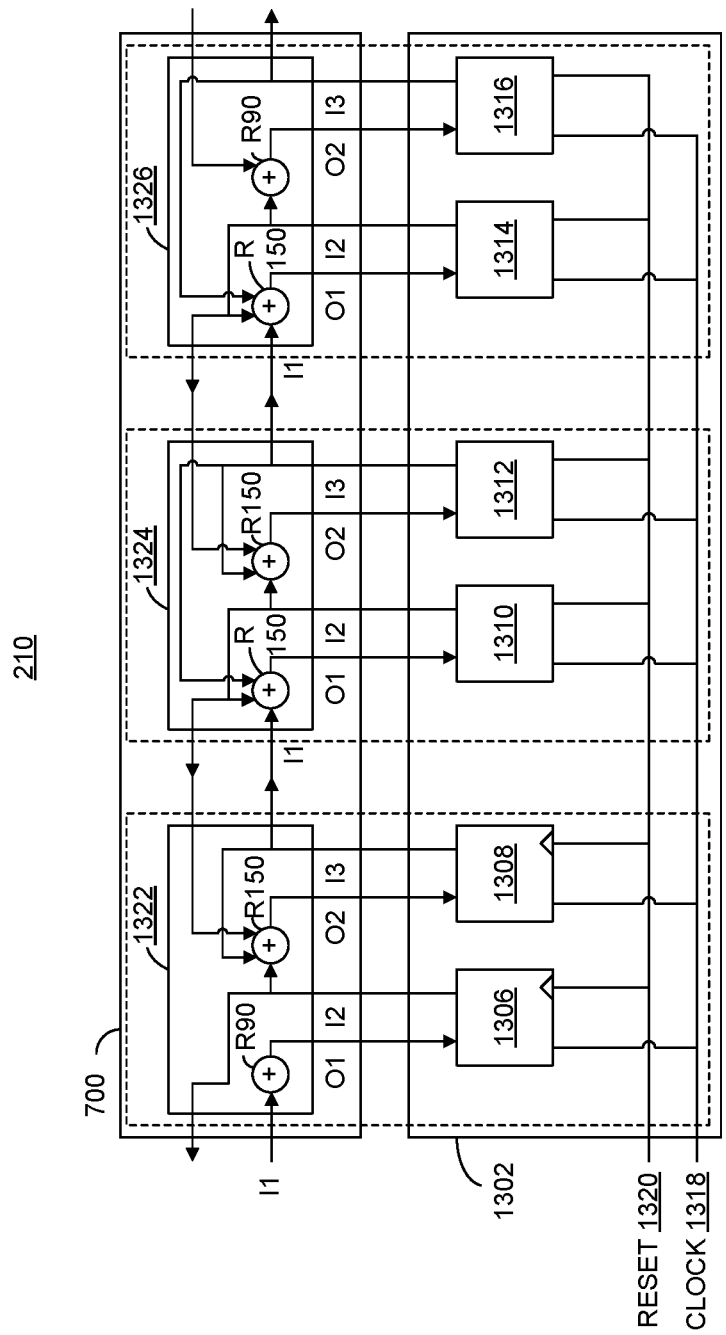
FIG. 14 illustrates the RCC of FIG. 13 with a different parameterization.

FIG. 14 illustrates an example parameterization for RCC 210 of FIG. 13. In the example of FIG. 14, RCC 210 is parameterized so that the connections implemented by BFNG 700 have been changed compared to those illustrated in FIG. 13. Further, in FIG. 14, the particular rule implemented by each XOR gate is shown. In the example of FIG. 14, the particular rule implemented by each respective XOR gate varies based upon the number of inputs provided to that XOR gate per Table 2. It should be appreciated that while certain connections to and/or from certain XOR gates are not shown in FIG. 14, the lack of a connection may be implemented by programming BFNG 700 so that such a signal becomes a "don't care" rather than physically disconnecting the signal.

As discussed, while FIG. 14 illustrates an example where the cellular automaton circuit applies linear rules, the cellular automaton circuit may also implement nonlinear rules or apply any Boolean function to signals that LUTs 1322, 1324, and/or 1326 is capable of performing. For example, utilizing AND and/or OR gates results in nonlinear behavior or rules.

Figure 15A:
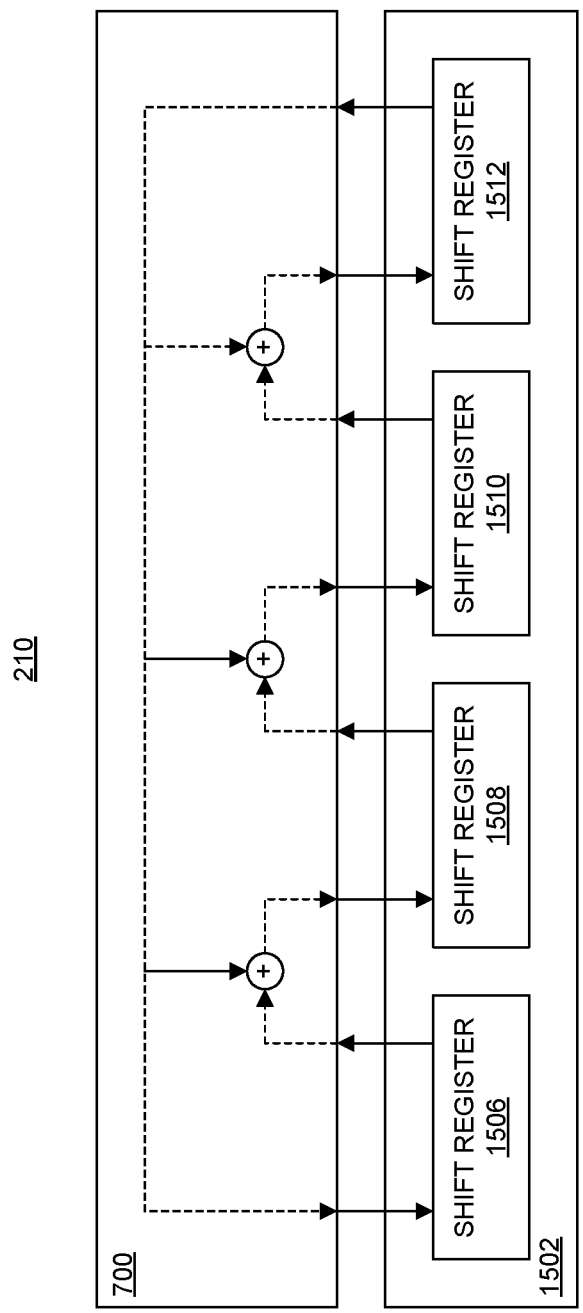
FIG. 15A illustrates an example of an RCC capable of implementing linear feedback shift registers (LFSRs).

FIG. 15A illustrates another example implementation of RCC 210. In the example of FIG. 15A, RCC 210 is capable of implementing an LFSR. The example runtime generator of FIG. 15A is capable of implementing a Galois LFSR or a Fibonacci LFSR. A Galois LFSR typically employs feed-forward and/or feedback signal paths. A Fibonacci LFSR typically employs feedback signal paths. An LFSR includes a shift register that has an input bit (e.g., an input signal) that is a linear function of the prior state. An LFSR is capable of generating pseudo random number binary sequences. For example, RCC 210 of FIG. 15A may be used to implement a pattern generator. In another example, RCC 210 of FIG. 15A may be used to generate pseudo-noise sequences, fast digital counters, and/or whitening sequences.

In the example of FIG. 15A, RCC 210 includes a data path circuit 1502. Data path circuit 1502 includes a plurality of stateful circuit elements such as shift registers 1506, 1508, 1510, and 1512. Data path circuit 1502 may include fewer shift registers or more shift registers depending upon the size of the LFSR to be implemented. Each of shift registers 1506-1512 is programmable. Based upon the parameterization data that is loaded into each of shift registers 1506-1512, each shift register is capable of outputting a signal from a particular location or tap in the signal chain within each respective shift register. Each of shift registers 1506-

1512 may be programmed independently of the others. In one or more embodiments, shift registers 1506-1512 may be multiple bits in length. For example, each of shift registers 1506-1512 may provide a maximum of 16 bits, 32 bits, or another length and be programmed to output a signal from a selected tap to provide one or more bits up to the maximum available. Shift registers 1506-1512 share a common clock signal (not shown). As an illustrative and non-limiting example, each of shift registers 1506-1512 may be implemented as a shift register LUT.

RCC 210 further may include BFNG 700. BFNG 700 is capable of applying particular Boolean functions, e.g., XOR functions and/or XNOR functions, to signals to generate inputs provided to shift registers 1506-1512 and/or to process outputs from shift registers 1506-1512. In the example of FIG. 15A, the input bit is driven by the XOR of some bits of the overall shift register value.

The sequence of values generated by an LFSR is determined by the feedback function (XOR versus XNOR) and the tap selection in reference to the location the signal is extracted from the various shift registers 1506-1512. To achieve a loop of a given length or number of states, the number of bits and the taps (e.g., the number of taps and the location of each tap) may be determined (e.g., are known). The taps for a given LFSR of a defined number of bits are identical for both XOR-based and XNOR-based implementations, although the resulting sequence of values generated will differ.

Table 3 below illustrates example configurations for maximal length LFSRs with 2 to 8 bits that may be implemented by RCC 210 of FIG. 15A. Table 3 is provided for purposes of illustration only and not limitation. It should be appreciated that RCC 210 of FIG. 15A may implement larger LFSRs in the case where each shift register provides a maximum of 16 or 32 bits.

TABLE 3

| Number of Bits | Length of Loop (number of states) | Taps |
|---|---|---|
| 2 | 3 | 0, 1 |
| 3 | 7 | 0, 2 |
| 4 | 15 | 0, 3 |
| 5 | 31 | 1, 4 |
| 6 | 63 | 0, 5 |
| 7 | 127 | 0, 6 |
| 8 | 255 | 1, 2, 3, 7 |

The taps of an LFSR as implemented by RCC 210 of FIG. 15A may be expressed in finite field arithmetic as a polynomial mod 2. The coefficients of the polynomial must be either 1s or 0s. The polynomial may also be referred to as the feedback polynomial or reciprocal characteristic polynomial. For example, if the taps are at the 16th, 14th, 13th and 11th bits, the feedback polynomial is $x^{16}+x^{14}+x^{13}+x^{11}+1$. Thus, the specification for an LFSR implemented by a runtime generator may be specified as a series of taps or as a polynomial mode 2 as described.

As pictured, each of shift registers 1506-1512 receives an input from BFNG 700 and provides an output to BFNG 700. The tap from which each shift register provides the output to BFNG 700, which is programmable by way of parameterization data. BFNG 700 is capable of applying an XOR or an XNOR to a received input and some combination of one or more other signals based upon the parameterization data. For cases where fewer taps are needed, BFNG 700 may simply connect an output of one shift register to the input of a next shift register (e.g., without applying a function to the signal). In other cases, the number of bits (e.g., distance) between adjacent taps may be used to determine the tap settings of shift registers 1506-1512.

The connectivity between shift registers, the particular functions (if any) applied to received input signals from shift registers of data path circuit 1502, and/or which other signals are also processed with the received signals from data path circuit 1502 are specified by parameterization data that may be loaded into BFNG 700 at runtime. As such, by selecting the tap on each of shift registers 1506-1512 and determining which functions are applied at each tap location, RCC 210 of FIG. 15A may be parameterized at runtime to implement any of a variety of different LFSRs, whether Galois or Fibonacci. Further, RCC 210 may be parameterized to generate different LFSRs over time.

In one or more embodiments, two or more runtime generators may be implemented within an IC concurrently. For example, a first runtime generator may be used to implement a cellular automaton, while a second runtime generator may be used to implement an LFSR. The outputs of the two runtime generators may be tied together, e.g., exclusive OR'd to create a random number generator with improved randomness properties. Each of the runtime generators may be parameterized and/or re-parameterized at runtime of the IC to change the random number generator that is implemented.

Figure 15B:
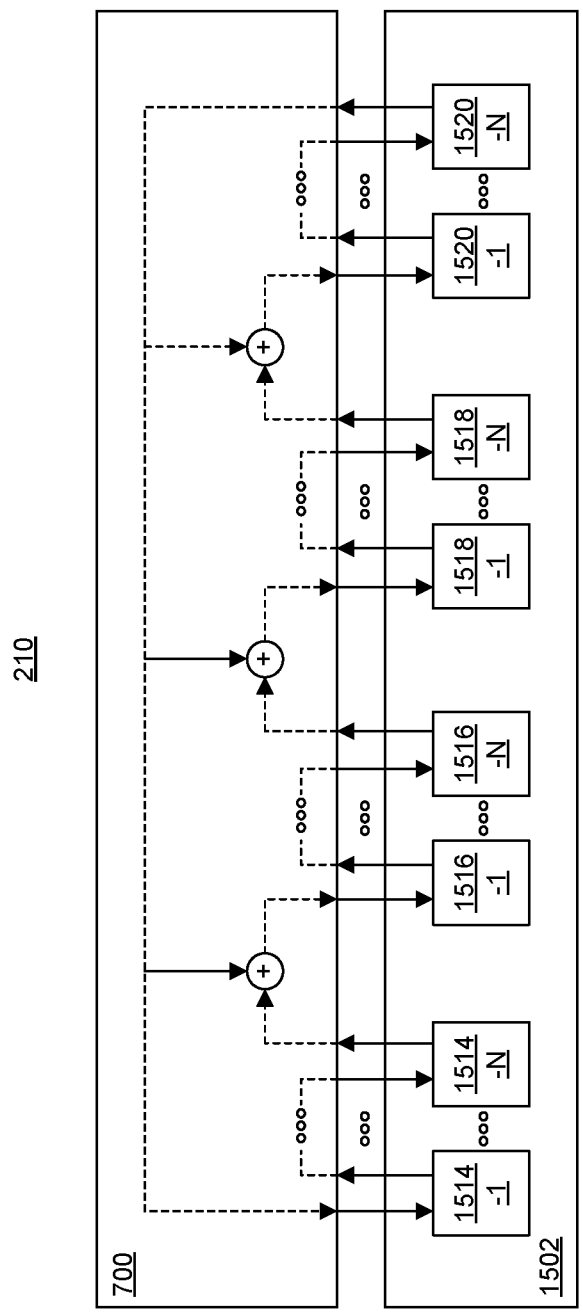
FIG. 15B illustrates another example of an RCC capable of implementing LFSRs.

FIG. 15B illustrates another example implementation of RCC 210. RCC 210 of FIG. 15B is capable of implementing an LFSR. The LFSR may be a Galois LFSR or a Fibonacci LFSR. The runtime generator of FIG. 15B is substantially similar to the runtime generator of FIG. 15A. In the example of FIG. 15B, however, shift registers 1506, 1508, 1510, and 1512 are replaced within data path circuit 1502 by a plurality of registers illustrated as registers 1514-1 through 1514-N, registers 1516-1 through 1516-N, registers 1516-1 through 1518-N, and registers 1520-1 through 1520-N. Registers 1514, 1516, 1518, and 1520 may be D type registers. As discussed, a runtime generator having an architecture that includes an array of stateful circuit elements coupled to a BFNG as illustrated in FIG. 15B is capable of implementing an entire class of linear, binary sequential circuits that may be changed without loading new configuration bitstreams into the IC.

Each of registers 1514, 1516, 1518, and 1520 has an input and an output connected to BFNG 700. BFNG 700 is parameterized to establish connectivity between the registers and/or to apply Boolean functions (e.g., XOR or XNOR) to received inputs (e.g., register outputs and/or other signals). For purposes of illustration, BFNG 700 establishes connectivity between registers 1514-1 and 1514-N, e.g., connects the registers in serial, but does not apply any function between the output of register 1514-1 and the input of register 1514-N. Similarly, BFNG 700 establishes connectivity between registers 1516-1 and 1516-N, e.g., connects the registers in serial, but does not apply any function between the output of register 1516-1 and the input of register 1516-N. BFNG 700 establishes connectivity between registers 1518-1 and 1518-N, e.g., connects the registers in serial, but does not apply any function between the output of register 1518-1 and the input of register 1518-N. Further, BFNG 700 establishes connectivity between registers 1520-1 and 1520-N, e.g., connects the registers in serial, but does not apply any function between the output of register 1520-1 and the input of register 1520-N.

BFNG 700 applies the processing shown between the output of register 1514-N and the input of register 1516-1, between the output of register 1516-N and the input of register 1518-1, between the output of register 1518-N and the input of register 1520-1, and establishes a connection from the output of register 1520-N to the input of register 1514-1. The various connections and functions applied, which include the location at which such functions are applied and the signals provided to the various functions, are defined by the parameterization data as described in connection with FIG. 15A. By including a sufficient number of registers, any of a variety of shift registers architectures as illustrated in FIG. 15A may be realized using registers.

Figure 16:
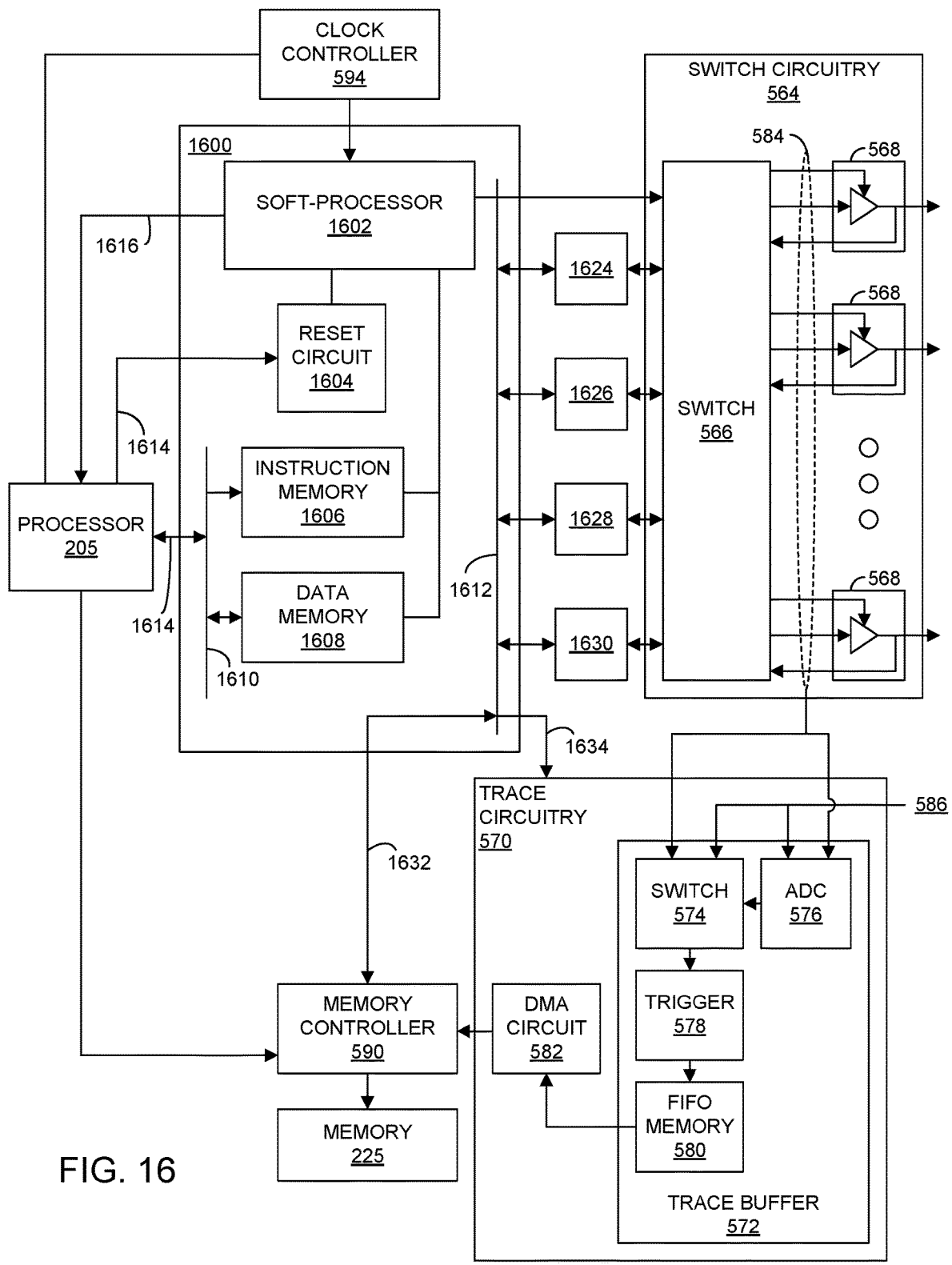
FIG. 16 illustrates an example of a slave processor type of RCC.

FIG. 16 illustrates an example of a slave processor type of RCC. In the example of FIG. 16, slave processor 1600 operates under control of processor 205. In the example of FIG. 16, slave processor 1600 includes a soft-processor 1602. Slave processor 1600 has a dual port design. The dual port design uses separate memories for data and instructions. In support of the dual port design, slave processor 1600 includes an instruction memory 1606 and a data memory 1608. In particular embodiments, instruction memory 1606 and data memory 1608 are implemented using BRAMs of the programmable circuitry of IC 200. Further, slave processor 1600 can include an optional reset circuit 1604.

In one or more embodiments, slave processor 1600 is coupled to processor 205 via one or more control signals 1614 and interface circuitry 1610. In an example, interface circuitry 1610 is implemented as a general purpose I/O (GPIO) interface. In another example, interface circuitry 1610 is implemented in accordance with the Advanced Microcontroller Bus Architecture (AMBA) AXI Protocol Specification (AXI) as published by ARM. In general, AXI is a high performance, high frequency interface that is suitable for submicron interconnect. Slave processor 1600 further can include interface circuitry 1612 that is capable of coupling soft-processor 1602 to other circuitry implemented in the programmable circuitry of IC 200. In particular embodiments, interface circuitry 1612 is implemented as an AXI interface. Through interface circuitry 1612, slave processor 1600 appears as a master to other circuits connected to slave processor 1600.

Processor 205 is capable of parameterizing slave processor 1600 at runtime of IC 200. For example, processor 205 is capable of providing, e.g., writing, instructions to instruction memory 1606 via interface circuitry 1610. In particular embodiments, instructions written to instruction memory 1606 can include read-only data such as tables or other suitable data. Processor 205 is capable of providing, e.g., writing, data to data memory 1608 via interface circuitry 1610. Soft-processor 1602 is capable of accessing or reading instructions from instruction memory 1606 and data from data memory 1608. Soft-processor 1602 is capable of executing the instructions retrieved from instruction memory 1606 and operating on data retrieved from data memory 1608. Soft-processor 1602 is capable of writing results to data memory 1608 from execution. As such, processor 205 is also capable of reading data, e.g., results, from data memory 1608.

In one or more embodiments, soft-processor 1602 includes an interrupt port that can be coupled to circuitry implemented in the programmable circuitry of IC 200. Circuitry implemented in the programmable circuitry is capable of exercising the interrupt port of soft-processor 1602.

In one or more embodiments, an HPL API for slave processor 1600 is available to processor 205 for use and inclusion in an application. Using the HPL API, processor 205 is capable of controlling operation of slave processor 1600. Processor 205, in executing framework 304, for example, or a driver, is capable of controlling slave processor 1600.

As noted, reset circuit 1604 is optionally included in slave processor 1600. Reset circuit 1604 is capable of receiving one or more signals and exercising the reset function of soft-processor 1602 in response to detecting a particular condition or conditions on the signals received. In one or more embodiments, reset circuit 1604 is capable of generating a non-maskable interrupt (NMI). The NMI may be a state control that is handled by soft-processor 1602. For example, reset circuit 1604 is capable of restarting soft-processor 1602 to restart execution of same instructions (e.g., program code) from instruction memory, resetting soft-processor 1602, holding soft-processor 1602 in reset, or providing other interrupts that are handled differently by soft-processor 1602 based upon the type of interrupt received. In one or more embodiments, processor 205 is coupled directly to an interrupt port of soft-processor 1602 (e.g., where reset circuit 1604 is not included in slave processor 1600).

Using control signals 1614 and interface circuitry 1610, processor 205 is capable of controlling operation of slave processor 1600. Processor 205 is capable of behaving as a master to slave processor 1600. As an illustrative and non-limiting example, processor 205 is capable of starting, stopping, and resetting slave processor 1600 at any time. Processor 205 is capable of generating and/or determining the program code to be executed by soft-processor 1602 and loading such program code into instruction memory 1606 during runtime, e.g., in real-time of IC 200. Processor 205 further is capable of providing any data to be operated upon by soft-processor 1602 and loading such data into data memory 1608 during runtime, e.g., in real-time, of IC 200.

As such, processor 205 is capable of performing runtime customization of slave processor 1600. The act of customizing slave processor 1600 using processor 205 may be referred to as parameterizing or parameterization. Any data and/or instructions provided from processor 205 to slave processor 1600 may be referred to herein as "parameterization data".

Once parameterized, processor 205 can allow slave processor 1600 to operate, e.g., execute program code from instruction memory 1606. At some point, processor 205 is capable of halting operation of slave processor 1600, e.g., via reset circuit 1604, loading different parameterization data such as new instructions into instruction memory 1606 and/or different or new data into data memory 1608. Processor 205 is capable of resetting and/or restarting operation of soft-processor 1602 (e.g., releasing soft-processor 1602 from the halt) to begin executing the new instructions and/or to begin processing the new data. In particular embodiments, processor 205 is capable of writing to data memory 1608 without halting operation of soft-processor 1602. Processor 205, in acting as the master, is capable of exchanging instructions and/or data with soft-processor 1602 via instruction memory 1606 and data memory 1608.

In one or more embodiments, data memory 1608 includes a region or portion of memory that is reserved for use by processor 205. The region, e.g., a command mailbox, can be written by processor 205 and is read-only for soft-processor 1602. The region is reserved for receiving command(s) from processor 205. This allows processor 205 to issue commands to soft-processor 1602 without having to halt operation of soft-processor 1602. In general, processor 205 is capable of causing soft-processor 1602 to behave differently by writing one or more commands to the command mailbox within data memory 1608.

As an illustrative and non-limiting example, soft-processor 1602 may be configured to process data such as data obtained from a temperature sensor. In an aspect, a memory address or addresses within the command mailbox of instruction memory 1606 can be reserved for receiving a command from processor 205 that dictates whether soft-processor 1602 returns results formatted in Celsius, in Fahrenheit, or both. Thus, processor 205 is capable of writing a command to the address or addresses within the command mailbox to control operation of soft-processor 1602 during runtime of soft-processor 1602, e.g., without first halting operation of soft-processor 1602. In another example, processor 205 can write data, e.g., a data table, within the command mailbox that is read-only for soft-processor 1602. Soft-processor 1602, for example, can then read and utilize the data written therein.

In one or more embodiments, processor 205 is capable of executing an HPL library (e.g., a library accessed via the HPL API for slave processor 1600). The library provides standardized interfaces to one or more implementations of slave processor 1600 that may be implemented within the programmable circuitry of IC 200.

The instructions provided from processor 205 to instruction memory 1606 can originate from one or more different sources. In particular embodiments, processor 205 is capable of providing precompiled binaries to instruction memory 1606. The precompiled binaries may be provided to processor 205 at boot time (of processor 205). For example, one or more precompiled binaries may be included within framework 304 (e.g., RCC software 312).

In particular embodiments, processor 205 is capable of cross-compiling source code at runtime using one or more of compilers 310 and providing the resulting binary to instruction memory 1606 at runtime of processor 205 and of slave processor 1600. In particular embodiments, processor 205 is capable of linking one or more precompiled modules at runtime of processor 205 and providing the resulting linked modules to instruction memory 1606 at runtime of slave processor 1600. In one or more other embodiments, processor 205 is capable of receiving precompiled binaries, source code, and/or combinations thereof from a remote system, processing the received instructions, and providing the resulting instructions, e.g., as a binary, to instruction memory 1606.

In one or more embodiments, slave processor 1600 is capable of generating or raising an interrupt on processor 205. In particular embodiments, soft-processor 1602 is capable of raising an interrupt on processor 205 via interface circuitry 1610. In particular embodiments, soft-processor 1602 may be implemented with a direct connection to the interrupt port of processor 205 shown as signal 1616 to raise an interrupt on processor 205. In one or more embodiments, the interrupt mechanisms used by slave processor 1600 and processor 205 are integrated within an asynchronous event loop implemented in an HPL executed by processor 205 to support high-level nonblocking I/O.

In particular embodiments, slave processor 1600 is granted read and write access to a reserved area of on-chip memory or an external memory, e.g., in an address map of processor 205. Using such a configuration, processor 205 is capable of exchanging data with one or more different slave processors 1600 without direct involvement of processor 205. For example, processor 205 is able to write data to an area of memory 225 corresponding to a particular slave processor 1600. Responsive to a signal from processor 205 indicating that data and/or instructions are ready, slave processor 1600 is capable of retrieving the instructions and/or data from the reserved area of memory 225 via signal 1632.

As an illustrative and non-limiting example, slave processor 1600 can be configured to take a measurement periodically, e.g., every 10 milliseconds. In response to each measurement, slave processor 1600 is capable of determining whether the measurement is within a predetermined range. Further, slave processor 1600 is capable of logging the last "N" measurements, e.g., in data memory 1608. In this example, "N" is a predetermined integer value.

Slave processor 1600 is capable of evaluating the measurements. In response to determining that one or more measurements are out of range, slave processor 1600 is capable of taking an action. In one example, slave processor 1600 is capable of applying a function to the collected measurements such as taking a derivative of the measurements or the last "M" measurements, e.g., where "M" is an integer value and may be less than "N." If the derivative, or other calculation, is within the predetermined range, slave processor 1600 continues operating. If the value that is calculated is out of the predetermined range, slave processor 1600 is capable of raising an interrupt on processor 205. In this example, slave processor 1600 handles the processing and relieves processor 205 from overseeing the collection and evaluation of measurements until such time that an out of range condition is detected. Moreover, since processor 205 is executing operating system 302, e.g., a Linux operating system or other modern operating system, processor 205 may not be suitable for monitoring a real-time process as is the case with slave processor 1600 and, more particularly, soft-processor 1602.

In one or more embodiments, switch circuitry 564 is optionally included. Switch circuitry 564 may be selected as an implementation option for slave processor 1600. Switch circuitry 564 may be implemented substantially as described in connection with FIG. 5. For example, switch circuitry 564 may receive parameterization data from processor 205. In one or more embodiments, in the case of slave processor 1600, switch circuitry 564 is capable of receiving parameterization data from soft-processor 1602 instead of processor 205.

In one or more embodiments, circuit blocks 1624, 1626, 1628, and 1630 may also be selected as implementation options with switch circuitry 564. Circuit blocks 1624-1630 may be implemented within the programmable circuitry of IC 200. In particular embodiments, each of circuit blocks 1624-1630 is capable of implementing a different operation or performing a different task. One or more of circuit blocks 1624-1630, for example, are capable of communicating using a different communication protocol. For purposes of illustration and not-limitation, circuit block 1624 is capable of implementing a GPIO interface, circuit block 1626 is capable of implementing an Inter-Integrated Circuit (I²C) interface, circuit block 1628 is capable of implementing a serial peripheral interface (SPI), and circuit block 1630 is capable of implementing a timer. The different functions ascribed to circuit blocks 1624-1630 are provided for purposes of illustration and not limitation.

In the example of FIG. 16, switch circuitry 564 is controlled by soft-processor 1602. As discussed, slave processor 1600 is controlled by processor 205. Accordingly, switch 566 is capable of coupling signals received on the right side to one (or more) of circuit blocks 1624, 1626, 1628, and 1630 based upon the parameterization data provided from soft-processor 1602. In this manner, slave processor 1600 is capable of interfacing to any of a variety of peripheral devices using any of a variety of different protocols by coupling a selected circuit block (e.g., one or more of circuit blocks 1624-1630) to different pins of IC 200 using switch circuitry 564.

In one or more embodiments, soft-processor 1602 is capable of changing the particular circuit block 1624-1630 that is coupled to pins of IC 200 via switch 566 during runtime of IC 200. For example, soft-processor 1602 is capable of executing program code and changing the particular circuit block(s) 1624-1630 connected to pins of IC 200 based upon current operating conditions and decisions made in executing program code. As discussed, since processor 205 is capable of controlling operation of soft-processor 1602, processor 205 is capable of controlling, at least indirectly, which of circuit blocks 1624-1630 is/are coupled to pins of IC 200 through switch 566 by virtue of providing different parameterization data (e.g., instructions) to instruction memory 1606 and/or (e.g., different data) to data memory 1608.

In one or more embodiments, trace circuitry 570 is optionally included. Trace circuitry 570 may be an implementation option for slave processor 1600. Trace circuitry 570 can operate substantially as described herein. As discussed, trace circuitry 570 may be parameterized by processor 205. In particular embodiments, in the case of slave processor 1600, trace circuitry 570 may be parameterized and/or controlled by soft-processor 1602. For example, soft-processor 1602 is capable of parameterizing trace circuitry 570 via signal 1634. Similarly, soft-processor 1602 is capable of analyzing trace data stored in memory 225. Soft-processor 1602, for example, is capable of executing instructions dictating the particular analysis of the trace data to be performed.

Figure 17:
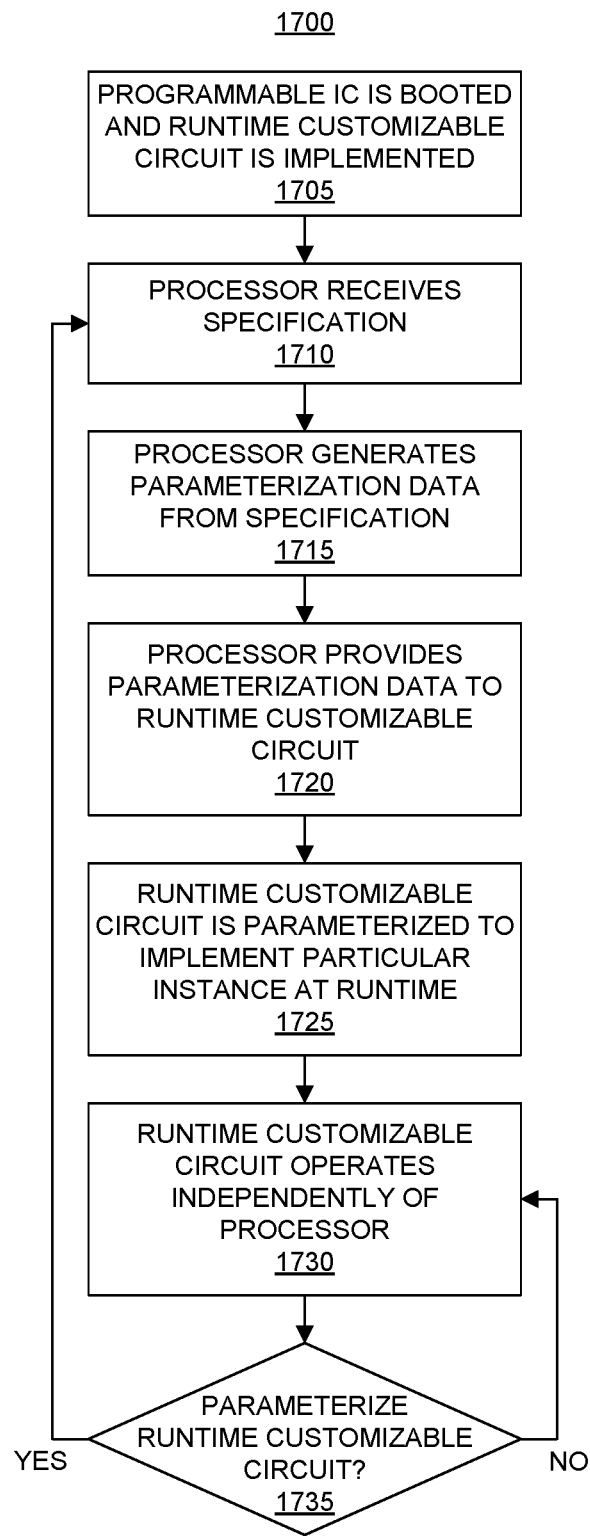
FIG. 17 illustrates an example method of implementing and using an RCC.

FIG. 17 illustrates an example method 1700 of implementing and using an RCC. FIG. 17 may be performed by a processor and a programmable IC as described herein. In one or more embodiments, the processor is embedded within the programmable IC. The processor may be implemented as a hardwired processor or as a soft-processor. In one or more other embodiments, the processor is external to the programmable IC.

In block 1705, the programmable IC is booted and the RCC is implemented. For example, the programmable IC is powered on. Further, a configuration bitstream that specifies the particular RCC or RCCs to be implemented is loaded into the programmable IC. With the configuration bitstream loaded into the programmable IC and the RCC implemented within the programmable circuitry of the programmable IC, the IC is considered to be in a runtime state. It should be appreciated that any interface circuitry that couples the RCC to a processor and/or other circuit nodes within the programmable IC is also implemented by virtue of loading the configuration bitstream. For example, the RCC may be included within a larger circuit design implemented within the programmable IC.

In block 1710, the processor optionally receives a specification. The processor is capable of executing program code such as an operating system and various applications. An application executed by the processor is capable of receiving a specification. The specification may be for the particular type of RCC that is implemented (e.g., an FSGM, a BFNG, a finite automata generator, or a slave processor). The specification may be read from a memory, e.g., a runtime memory, accessible to the processor and/or may be received from another remote system or device.

In one or more embodiments, the processor is capable of performing one or more verification operations on the received specification. As an example, the processor is capable of determining whether the number of inputs and the number of outputs defined by the specification is compatible (e.g., does not exceed) the number of available inputs and outputs of the RCC that is implemented within the programmable circuitry of the IC.

In block 1715, the processor optionally generates parameterization data for the RCC from the specification. For example, the processor is capable of generating the data used to load BRAMs, set registers, control switches, and/or provide the various control signals described herein for the particular type of RCC that is implemented. In another example, in the case of a slave processor, the processor is capable of compiling program code for execution by the slave processor.

In the case where the processor is embedded in the same IC as the RCC, the processor is capable of generating the parameterization data used to parameterize the RCC at runtime of the IC and locally within the IC. Thus, the processor is capable of generating the parameterization data within the programmable IC itself without the need for other design tools and/or compilers.

In one or more embodiments, the processor is capable of receiving parameterization data for parameterizing the RCC from another source rather than generating the parameterization data from a specification. The parameterization data may be retrieved from a memory or may be received from another system or device such as a remote system or server.

In block 1720, the processor provides the parameterization data to the RCC. In block 1725, the RCC is parameterized to implement a particular instance of the RCC at runtime of the IC. For example, the parameterization creates a particular FSM, a particular automata circuit, a particular Boolean function network, or a particular soft-processor using the slave processor.

In block 1730, the RCC operates independently of the processor. The processor, for example, is capable of releasing the RCC from a halt state so that the RCC operates. In block 1735, the processor determines whether the RCC is to be parameterized (e.g., re-parameterized). If so, method 1700 loops back to block 1710 to continue processing. If not, method 1700 loops back to block 1730, where the RCC continues to operate independently of the processor.

In one or more embodiments, in response to determining that the RCC is to be parameterized, the processor may receive parameterization data from another source so that the parameterization data may be loaded into the RCC. In that case, the processor receives parameterization data that may be loaded and need not first generate the parameterization data from a specification. In one or more other embodiments, in response to determining that the RCC is to be re-parameterized, the processor is capable of generating further parameterization data from a different specification.

FIG. 17 illustrates an embodiment where the processor may be used to control a feedback loop that selectively implements different instances of one or more RCCs. The processor may be configured to monitor particular signals and/or data, whether trace data as described, signals from other portions of the IC, signals received from external sources (e.g., off-chip), and/or any combination thereof to detect particular conditions (e.g., signal states). In response to the conditions, the processor initiates the loading of new and/or different parameterization data into one or more RCCs implemented within IC 200. The processor may be used to iterate through different instances of the different RCCs as the case may be.

In another example, the processor may be executing an application that is capable of re-parameterizing the RCC. The application may detect an event that is unrelated to monitoring particular signals of the RCC. For example, the event may be a request for a different instance of the RCC that is received from another system and/or circuit coupled to the processor.

In one or more embodiments, the processor is capable of selecting the particular instance of the RCC to be implemented based upon the particular condition that is detected. For example, the processor is capable of storing a plurality of different specifications for one or more RCCs. The different specifications may be associated with different conditions or events. In response to detecting a particular event, the processor determines the specification associated with the event and generates parameterization data from the specification. The processor then loads the parameterization data into the RCC. Similarly, the processor may retrieve or select different pre-processed or stored parameterization data sets that may be selected to parameterize the RCC based upon the particular event that is detected.

While FIG. 17 describes various scenarios where the parameterization of the RCC is performed automatically, in one or more other embodiments, the parameterization of the RCC may be performed in response to user requests. For example, the processor, whether embedded or not, may execute development tools that a designer may access and interact with to change the particular circuit instance implemented by the RCC at any given time. The user may provide a command to the processor to load a new specification that the processor may process to generate parameterization data that is then provided to the RCC. The user may edit source code using server-based IDE 306 and compile such source code using a compiler 310 to generate executable program code that may be provided to slave processor 1600 as parameterization data. As such, a user is able to design new instances for the various RCCs (or modify existing instances) implemented within the IC using software running on the processor to re-parameterize the RCCs.

Figure 18:
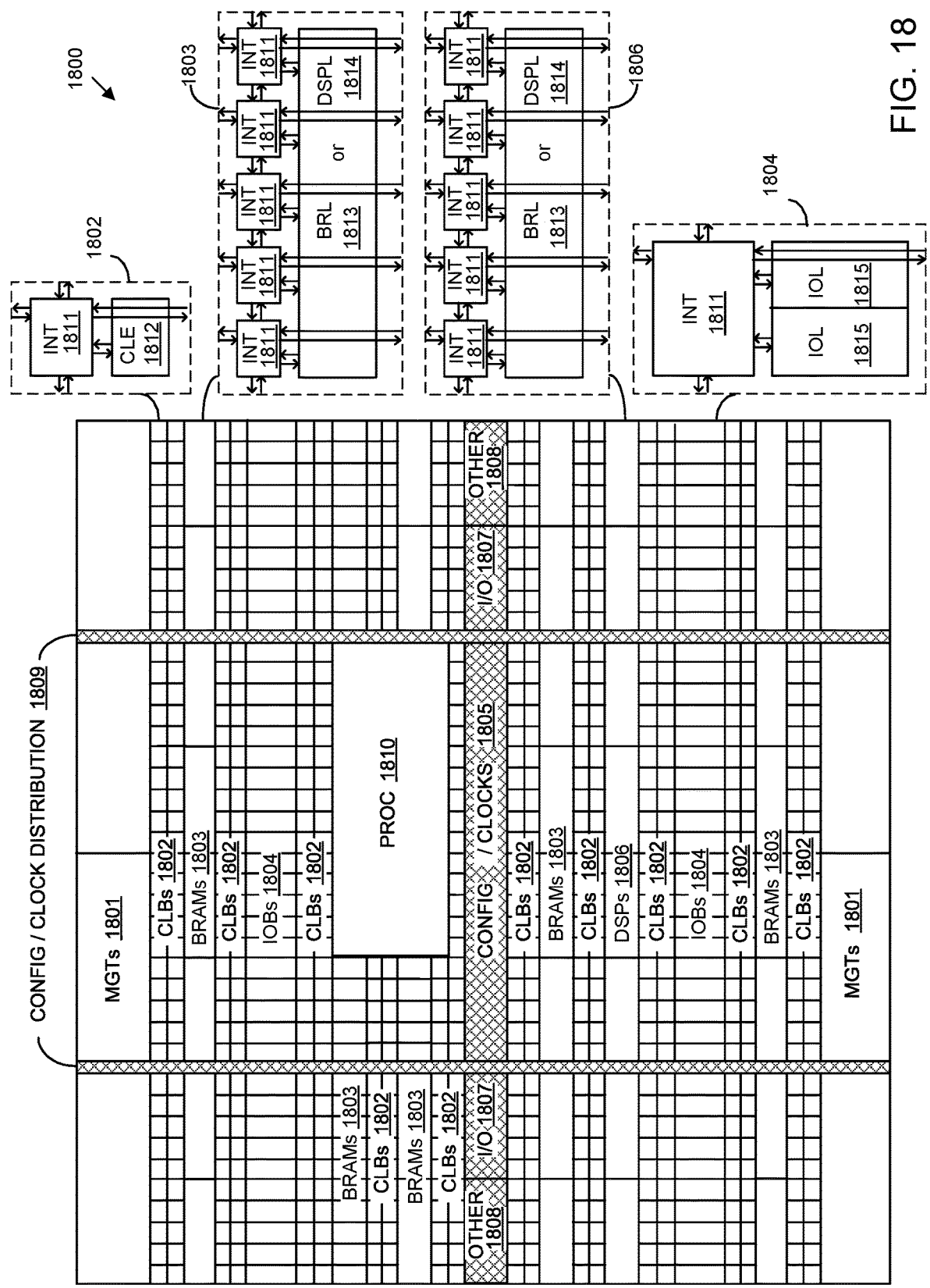
FIG. 18 illustrates an example architecture for an IC.

FIG. 18 illustrates an example architecture 1800 for an IC. In one aspect, architecture 1800 may be implemented within a programmable IC. For example, architecture 1800 may be used to implement IC 200. Architecture 1800 may be used to implement an FPGA. Architecture 1800 may also be representative of a System-on-Chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 1800 includes several different types of programmable circuit, e.g., logic, blocks. For example, architecture 1800 may include a large number of different programmable tiles including multi-gigabit transceivers (MGTs) 1801, configurable logic blocks (CLBs) 1802, random access memory blocks (BRAMs) 1803, input/output blocks (IOBs) 1804, configuration and clocking logic (CONFIG/CLOCKS) 1805, digital signal processing blocks (DSPs) 1806, specialized I/O blocks 1807 (e.g., configuration ports and clock ports), and other programmable logic 1808 such as digital clock managers, ADCs, system monitoring logic, and so forth.

In some ICs, each programmable tile includes a programmable interconnect element (INT) 1811 having standardized connections to and from a corresponding INT 1811 in each adjacent tile. Therefore, INTs 1811, taken together, implement the programmable interconnect structure for the illustrated IC. Each INT 1811 also includes the connections to and from the programmable logic element within the same tile, as shown by the examples included at the top of FIG. 18.

For example, a CLB 1802 may include a configurable logic element (CLE) 1812 that may be programmed to implement user logic plus a single INT 1811. A BRAM 1803 may include a BRAM logic element (BRL) 1813 in addition to one or more INTs 1811. Typically, the number of INTs 1811 included in a tile depends on the height of the tile. As pictured, a BRAM tile has the same height as five CLBs, but other numbers (e.g., four) also may be used. A DSP tile 1806 may include a DSP logic element (DSPL) 1814 in addition to an appropriate number of INTs 1811. An 10B 1804 may include, for example, two instances of an I/O logic element (IOL) 1815 in addition to one instance of an INT 1811. The actual I/O pads connected to IOL 1815 may not be confined to the area of IOL 1815.

In the example pictured in FIG. 18, a columnar area near the center of the die, e.g., formed of regions 1805, 1807, and 1808, may be used for configuration, clock, and other control logic. Horizontal areas 1809 extending from this column may be used to distribute the clocks and configuration signals across the breadth of the programmable IC.

Some ICs utilizing the architecture illustrated in FIG. 18 include additional logic blocks that disrupt the regular columnar structure making up a large part of the IC. The additional logic blocks may be programmable blocks and/or dedicated circuitry. For example, a processor block depicted as PROC 1810 spans several columns of CLBs and BRAMs.

In one aspect, PROC 1810 may be implemented as dedicated circuitry, e.g., as a hardwired processor, that is fabricated as part of the die that implements the programmable circuitry of the IC. PROC 1810 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 1810 may be omitted from architecture 1800 and replaced with one or more of the other varieties of the programmable blocks described. Further, such blocks may be utilized to form a "soft processor" in that the various blocks of programmable circuitry may be used to form a processor that can execute program code as is the case with PROC 1810.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 18 that are external to PROC 1810 such as CLBs 1802 and BRAMs 1803 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream". In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened", i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1810.

In the case of an SOC, the configuration bitstream may specify the circuitry that is to be implemented within the programmable circuitry and the program code that is to be executed by PROC 1810 or a soft processor. In some cases, architecture 1800 includes a dedicated configuration processor that loads the configuration bitstream to the appropriate configuration memory and/or processor memory. The dedicated configuration processor does not execute user-specified program code. In other cases, architecture 1800 may utilize PROC 1810 to receive the configuration bitstream, load the configuration bitstream into appropriate configuration memory, and/or extract program code for execution.

FIG. 18 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 18 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 1810 within the IC are for purposes of illustration only and are not intended as limitations.

In one or more embodiments, an RCC may be implemented in an IC having an architecture as described in connection with FIG. 18. For example, processor 205 may be implemented as PROC 1810. In another example, processor 205 may be implemented as a soft-processor using the programmable circuit blocks described. The RCC may be implemented using the programmable circuit blocks described. BRAMs 1803, for example, may be used to implement the next state circuit and/or the output circuit of an FSMG or a finite automata generator. LUTs that are configurable at runtime may be included in one or more CLBs 1802 and may be used to implement the LUT circuit of a BFNG and/or the combinatorial circuit block of a nondeterministic automata circuit. A soft-processor and the other structures described in connection with the slave processor may be implemented using the circuit blocks described in connection with FIG. 18.

In one or more embodiments, one or more different types of RCCs may be deployed within a same IC concurrently. The RCCs may be interconnected or operate independently of one another. PROC 1810 is capable of parameterizing the different RCCs individually and/or in combination as needed.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" may mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "core" means a pre-designed and reusable unit of logic, cell, or chip layout design in the field of electronic circuit design. A core, sometimes referred to as an "Intellectual Property Core", "IP", or "IP block", is expressed as a data structure specifying a description of hardware that performs a particular function. A core may be expressed using hardware description language file(s), as a netlist, as a bitstream that programs a programmable IC, or the like. A core may be used as a building block within circuit designs adapted for implementation within an application-specific integrated circuit (ASIC), a programmable IC, e.g., an FPGA, SoCs, and/or other types of ICs. In some cases, a core may be specified as or include source code, high-level programming language models, schematics, and/or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "high-level programming language" (HLL) means a programming language, or set of instructions, used to program a data processing system where the instructions have a strong abstraction from the details of the data processing system, e.g., machine language. For example, a high level programming language may automate or hide aspects of operation of the data processing system such as memory management. Though referred to as "high-level programming languages," these languages are typically classified as "efficiency-level languages" or "ELLs." ELLs expose hardware-supported programming models directly. Examples of high-level programming languages include, but are not limited to, C, C++, and other suitable languages. A program written in an ELL is able to achieve multiple orders of magnitude higher performance than a high-productivity language particularly on emerging parallel hardware.

A high-productivity language (HPL) is a higher-level programming language than the aforementioned HLLs of the ELL variety. Characteristics of an HPL include, but are not limited to, being implemented as a scripting language. In another example, an HPL can be implemented as an extension language. Some HPLs are domain-specific, while others are not. HPLs provide abstractions that are suited or well-matched to the particular domain of that HPL. HPLs focus on programmer productivity as opposed to hardware efficiency. HPLs may provide utilities for debugging and visualization that are useful for domain experts, but lack support for taking advantage of lower level hardware functions such as parallel processing in systems. Examples of an HPL include, but are not limited to, Python, Scala, and R.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure may, but do not necessarily, all refer to the same embodiment. The terms "embodiment" and "arrangement" are used interchangeably within this disclosure.

As defined herein, the term "processor" means at least one hardware circuit. The hardware circuit may be configured to carry out instructions contained in program code. The hardware circuit may be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "output" means storing in physical memory elements, e.g., devices, writing to display or other peripheral output device, sending or transmitting to another system, exporting, or the like.

As defined herein, the term "real time" means a level of processing responsiveness that a user or system senses as sufficiently immediate for a particular process or determination to be made, or that enables the processor to keep up with some external process.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a computer, whether a special purpose computer or other programmable data processing apparatus, to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, a method can include, within a circuit design for an IC, determining, using computer hardware, a portion of the circuit design that is a candidate for implementation as a runtime customizable circuit, determining, using the computer hardware, implementation options for the runtime customizable circuit, and generating, using the computer hardware, a description of the circuit design using the runtime customizable circuit to implement the portion of the circuit design. The method can include generating, using the computer hardware, program code for an embedded processor coupled to an implementation of the runtime customizable circuit within the integrated circuit. The program code is usable by the embedded processor to parameterize the runtime customizable circuit to create a specific instance of the runtime customizable circuit.

In an aspect, the program code may include a driver that, when executed by the embedded processor, configures the embedded processor to communicate with the implementation of the runtime customizable circuit.

In another aspect, the program code, when executed by the embedded processor, causes the embedded processor to generate parameterization data from a specification, wherein the parameterization data parameterizes the implementation of the runtime customizable circuit.

In another aspect, the generating the program code may include generating parameterization data for the implementation of the runtime customizable circuit.

In another aspect, the method may include generating a compiled binary that is executable by the implementation of the runtime customizable circuit.

In another aspect, the generating the program code may include generating additional program code executable by the embedded processor to generate further program code executable by the implementation of the runtime customizable circuit.

In another aspect, the determining the implementation options for the runtime customizable circuit may include determining input signals to the runtime customizable circuit and determining output signals from the runtime customizable circuit.

In another aspect, the determining the implementation options for the runtime customizable circuit may include determining whether to include trace circuitry coupled to the implementation of the runtime customizable circuit.

In another aspect, the determining the implementation options for the runtime customizable circuit may include determining whether to include switch circuitry coupled to the implementation of the runtime customizable circuit.

In another aspect, the determining the implementation options for the runtime customizable circuit may include determining whether to include a clock controller coupled to the implementation of the runtime customizable circuit.

In one or more embodiments, a system includes a memory configured to store instructions and a first processor coupled to the memory. The first processor, in response to executing the instructions, is configured to initiate operations. The operations can include, within a circuit design for an integrated circuit, determining a portion of the circuit design that is a candidate for implementation as a runtime customizable circuit, determining implementation options for the runtime customizable circuit, and generating a description of the circuit design using the runtime customizable circuit to implement the portion of the circuit design. The operations can also include generating program code for a second processor embedded in the integrated circuit and coupled to an implementation of the runtime customizable circuit within the integrated circuit. The program code is usable by the second processor to parameterize the runtime customizable circuit to create a specific instance of the runtime customizable circuit.

In an aspect, the program code may include a driver that, when executed by the second processor, configures the second processor to communicate with the implementation of the runtime customizable circuit.

In another aspect, the program code, when executed by the second processor, causes the second processor to generate parameterization data from a specification, wherein the parameterization data parameterizes the implementation of the runtime customizable circuit.

In another aspect, the generating the program code may include generating parameterization data for the implementation of the runtime customizable circuit.

In another aspect, the first processor is configured to initiate operations further including generating a compiled binary that is executable by the implementation of the runtime customizable circuit.

In another aspect, the generating the program code may include generating additional program code executable by the second processor to generate further program code executable by the implementation of the runtime customizable circuit.

In another aspect, the determining the implementation options for the runtime customizable circuit may include determining input signals to the runtime customizable circuit and determining output signals from the runtime customizable circuit.

In another aspect, the determining the implementation options for the runtime customizable circuit may include determining whether to include trace circuitry coupled to the implementation of the runtime customizable circuit.

In another aspect, the determining the implementation options for the runtime customizable circuit may include determining whether to include switch circuitry coupled to the implementation of the runtime customizable circuit.

In another aspect, the determining the implementation options for the runtime customizable circuit may include determining whether to include a clock controller coupled to the implementation of the runtime customizable circuit.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
    within a circuit design for an integrated circuit, detecting, using computer hardware, a circuit structure of the circuit design that is a candidate for implementation as a runtime customizable circuit;
    determining, using the computer hardware, implementation options for the runtime customizable circuit;
    generating, using the computer hardware, a hardware description of the circuit design by replacing the circuit structure within the circuit design with the runtime customizable circuit; and
    generating, using the computer hardware, program code for an embedded processor coupled to an implementation of the runtime customizable circuit within programmable circuitry of the integrated circuit created by loading a configuration bitstream in the integrated circuit, wherein the program code is usable by the embedded processor to parameterize the implementation of the runtime customizable circuit to implement a particular version of the circuit structure; and
    wherein the implementation of the runtime customizable circuit is reprogrammable to implement a different version of the circuit structure by loading different parameterization data from the embedded processor.

2. The method of claim 1, wherein the program code includes a driver that, when executed by the embedded processor, configures the embedded processor to communicate with the implementation of the runtime customizable circuit.

3. The method of claim 1, wherein the program code, when executed by the embedded processor, causes the embedded processor to generate parameterization data from a specification, wherein the parameterization data parameterizes the implementation of the runtime customizable circuit.

4. The method of claim 1, wherein the generating the program code comprises:
    generating parameterization data for the implementation of the runtime customizable circuit.

5. The method of claim 4, further comprising:
    generating a compiled binary that is executable by the implementation of the runtime customizable circuit.

6. The method of claim 1, wherein the generating the program code comprises:
    generating additional program code executable by the embedded processor to generate further program code executable by the implementation of the runtime customizable circuit.

7. The method of claim 1, wherein the determining the implementation options for the runtime customizable circuit comprises:
    determining input signals to the runtime customizable circuit; and
    determining output signals from the runtime customizable circuit.

8. The method of claim 1, wherein the determining the implementation options for the runtime customizable circuit comprises:
    determining whether to include trace circuitry coupled to the implementation of the runtime customizable circuit.

9. The method of claim 1, wherein the determining the implementation options for the runtime customizable circuit comprises:
    determining whether to include switch circuitry coupled to the implementation of the runtime customizable circuit.

10. The method of claim 1, wherein the determining the implementation options for the runtime customizable circuit comprises:
    determining whether to include a clock controller coupled to the implementation of the runtime customizable circuit.

11. A system, comprising:
    a first processor configured to initiate operations including:
        within a circuit design for an integrated circuit, detecting a circuit structure of the circuit design that is a candidate for implementation as a runtime customizable circuit;
        determining implementation options for the runtime customizable circuit;

generating a hardware description of the circuit design by replacing the circuit structure with the circuit design with the runtime customizable circuit; and generating program code for a second processor embedded in the integrated circuit and coupled to an implementation of the runtime customizable circuit within programmable circuitry of the integrated circuit created by loading a configuration bitstream in the integrated circuit, wherein the program code is usable by the second processor to parameterize the implementation of the runtime customizable circuit to implement a particular version of the circuit structure; and wherein the implementation of the runtime customizable circuit is reprogrammable to implement a different version of the circuit structure by loading different parameterization data from the embedded processor.

12. The system of claim 11, wherein the program code includes a driver that, when executed by the second processor, configures the second processor to communicate with the implementation of the runtime customizable circuit.

13. The system of claim 11, wherein the program code, when executed by the second processor, causes the second processor to generate parameterization data from a specification, wherein the parameterization data parameterizes the implementation of the runtime customizable circuit.

14. The system of claim 11, wherein the generating the program code comprises:

generating parameterization data for the implementation of the runtime customizable circuit.

15. The system of claim 14, wherein the first processor is configured to initiate operations further including:

generating a compiled binary that is executable by the implementation of the runtime customizable circuit.

16. The system of claim 11, wherein the generating the program code comprises:

generating additional program code executable by the second processor to generate further program code executable by the implementation of the runtime customizable circuit.

17. The system of claim 11, wherein the determining the implementation options for the runtime customizable circuit comprises:

determining input signals to the runtime customizable circuit; and determining output signals from the runtime customizable circuit.

18. The system of claim 11, wherein the determining the implementation options for the runtime customizable circuit comprises:

determining whether to include trace circuitry coupled to the implementation of the runtime customizable circuit.

19. The system of claim 11, wherein the determining the implementation options for the runtime customizable circuit comprises:

determining whether to include switch circuitry coupled to the implementation of the runtime customizable circuit.

20. The system of claim 11, wherein the determining the implementation options for the runtime customizable circuit comprises:

determining whether to include a clock controller coupled to the implementation of the runtime customizable circuit.

* * * * *